United States Patent
Slepchenkov et al.

(10) Patent No.: US 12,065,058 B2
(45) Date of Patent: Aug. 20, 2024

(54) MODULAR CASCADED ENERGY SYSTEMS WITH A COOLING APPARATUS AND WITH REPLACEABLE ENERGY SOURCE CAPABILITY

(71) Applicant: TAE TECHNOLOGIES, INC., Foothill Ranch, CA (US)

(72) Inventors: Mikhail Slepchenkov, Lake Forest, CA (US); Roozbeh Naderi, Foothill Ranch, CA (US)

(73) Assignee: TAE Technologies, Inc., Foothill Ranch (CA)

( * ) Notice: Subject to any disclaimer, the term of this patent is extended or adjusted under 35 U.S.C. 154(b) by 299 days.

(21) Appl. No.: 17/229,795

(22) Filed: Apr. 13, 2021

(65) Prior Publication Data

US 2021/0316637 A1 Oct. 14, 2021

Related U.S. Application Data

(60) Provisional application No. 63/086,003, filed on Sep. 30, 2020, provisional application No. 63/009,996, filed on Apr. 14, 2020.

(51) Int. Cl.
*B60L 58/26* (2019.01)
*H05K 7/20* (2006.01)
(Continued)

(52) U.S. Cl.
CPC .......... *B60L 58/26* (2019.02); *H05K 7/20327* (2013.01); *B60L 58/12* (2019.02); *B60L 58/16* (2019.02)

(58) Field of Classification Search
CPC . B60L 5/26; B60L 58/12; B60L 58/16; H05K 7/20327
See application file for complete search history.

(56) References Cited

U.S. PATENT DOCUMENTS

| 5,204,548 A | 4/1993 | Daehler et al. |
| 5,428,522 A | 6/1995 | Millner et al. |

(Continued)

FOREIGN PATENT DOCUMENTS

| CA | 2 810 369 A1 | 3/2012 |
| CN | 201789411 U | 4/2011 |

(Continued)

OTHER PUBLICATIONS

Tolbert et al., "Charge Balance Control Schemes for Cascade Multi-level Converter in Hybrid Electric Vehicles," IEEE Trans. Indus. Electronics, Oct. 2002, 49(5):1058-1064.

(Continued)

*Primary Examiner* — Raheena R Malik
(74) *Attorney, Agent, or Firm* — Fish & Richardson P.C.

(57) ABSTRACT

Example embodiments of systems, devices, and methods are provided herein for cooling a modular energy system. The embodiments can utilize an enclosure surrounding the modular energy system to route the coolant in a manner that passes in proximity with components of modules of the modular energy system. The embodiments can provide for a sequence of pumping coolant such that the coolant cools components of the electric vehicle having the lowest desired operating temperature first, followed by the components having relatively higher desired operating temperatures. Example embodiments of systems, devices, and methods are also provided herein for a modular energy system with removable and replaceable energy sources. The system can be positioned within an electric vehicle in a manner that permits rapid removal of energy sources having a relatively low state of charge and replacement of those energy sources with different energy sources having a relatively higher state of charge.

20 Claims, 27 Drawing Sheets

(51) Int. Cl.
  *B60L 58/12* (2019.01)
  *B60L 58/16* (2019.01)

(56) References Cited

U.S. PATENT DOCUMENTS

| | | |
|---|---|---|
| 5,642,275 A | 6/1997 | Peng et al. |
| 5,905,371 A | 5/1999 | Limpaecher |
| 5,933,339 A | 8/1999 | Duba et al. |
| 5,949,664 A | 9/1999 | Bernet et al. |
| 6,051,961 A | 4/2000 | Jang et al. |
| 6,058,032 A | 5/2000 | Yamanaka et al. |
| 6,064,180 A | 5/2000 | Sullivan et al. |
| 6,236,580 B1 | 5/2001 | Aiello et al. |
| 6,373,734 B1 | 4/2002 | Martinelli |
| 7,091,701 B2 | 8/2006 | Turner et al. |
| 7,485,987 B2 | 2/2009 | Mori et al. |
| 8,395,280 B2 | 3/2013 | Graovac et al. |
| 8,476,888 B1 | 7/2013 | Chen et al. |
| 8,503,202 B2 | 8/2013 | Chimento et al. |
| 8,614,525 B2 | 12/2013 | Teichmann et al. |
| 8,829,723 B2 | 9/2014 | Graovac et al. |
| 9,172,254 B2 | 10/2015 | Ganor |
| 9,444,275 B2 | 9/2016 | Huang et al. |
| 9,461,474 B2 | 10/2016 | Deboy et al. |
| 9,538,691 B2* | 1/2017 | Kikuchi ............. H05K 7/20927 |
| 9,673,732 B2 | 6/2017 | Deboy et al. |
| 10,014,611 B2 | 7/2018 | Götz |
| 10,074,995 B2 | 9/2018 | Smedley et al. |
| 10,193,359 B2 | 1/2019 | Ganor |
| 10,218,189 B2 | 2/2019 | Goetz |
| 10,291,037 B2 | 5/2019 | Birkl et al. |
| 10,391,870 B2 | 8/2019 | Götz et al. |
| 10,396,682 B2 | 8/2019 | Götz et al. |
| 10,439,506 B2 | 10/2019 | Götz |
| 10,442,309 B2 | 10/2019 | Götz |
| 10,454,331 B2 | 10/2019 | Götz |
| 10,473,728 B2 | 11/2019 | Goetz |
| 10,630,201 B2 | 4/2020 | Götz et al. |
| 10,700,587 B2 | 6/2020 | Götz |
| 10,759,284 B2 | 9/2020 | Jaensch et al. |
| 10,784,698 B2 | 9/2020 | Jaensch et al. |
| 10,840,714 B2 | 11/2020 | Götz et al. |
| 10,980,103 B2 | 4/2021 | Götz et al. |
| 10,985,551 B2 | 4/2021 | Götz |
| 10,998,739 B2 | 5/2021 | Hinterberger et al. |
| 11,038,435 B2 | 6/2021 | Götz |
| 2003/0102845 A1 | 6/2003 | Aker et al. |
| 2004/0008016 A1 | 1/2004 | Sutardja et al. |
| 2004/0037101 A1 | 2/2004 | Meynard et al. |
| 2005/0065684 A1 | 3/2005 | Larson et al. |
| 2006/0097782 A1 | 5/2006 | Ebner |
| 2006/0202636 A1 | 9/2006 | Schneider |
| 2007/0147098 A1 | 6/2007 | Mori et al. |
| 2007/0194627 A1 | 8/2007 | Mori et al. |
| 2007/0246635 A1 | 10/2007 | Nakajima et al. |
| 2008/0080212 A1 | 4/2008 | Grbovic |
| 2008/0245593 A1 | 10/2008 | Kim |
| 2008/0304296 A1 | 12/2008 | Nadimpalliraju et al. |
| 2009/0251212 A1 | 10/2009 | Pillonnet et al. |
| 2009/0311891 A1 | 12/2009 | Lawrence et al. |
| 2010/0060235 A1 | 3/2010 | Dommaschk et al. |
| 2010/0085789 A1 | 4/2010 | Ulrich et al. |
| 2010/0121511 A1 | 5/2010 | Onnerud et al. |
| 2010/0298957 A1 | 11/2010 | Sanchez Rocha et al. |
| 2010/0301827 A1 | 12/2010 | Chen et al. |
| 2011/0133573 A1 | 6/2011 | Ratnaparkhi et al. |
| 2011/0140533 A1 | 6/2011 | Zeng et al. |
| 2011/0148198 A1 | 6/2011 | Tripathi et al. |
| 2011/0187184 A1 | 8/2011 | Ichikawa |
| 2011/0198936 A1 | 8/2011 | Graovac et al. |
| 2012/0053871 A1 | 3/2012 | Sirard |
| 2012/0074949 A1 | 3/2012 | Kepley et al. |
| 2012/0112693 A1 | 5/2012 | Kusch et al. |
| 2012/0155140 A1 | 6/2012 | Chen et al. |
| 2012/0161858 A1 | 6/2012 | Permuy et al. |
| 2012/0195084 A1 | 8/2012 | Norrga |
| 2012/0262967 A1 | 10/2012 | Cuk |
| 2013/0027126 A1 | 1/2013 | Jayaraman et al. |
| 2013/0083563 A1 | 4/2013 | Wang et al. |
| 2013/0088254 A1 | 4/2013 | Hoang et al. |
| 2013/0088903 A1 | 4/2013 | Sagona et al. |
| 2013/0090872 A1 | 4/2013 | Kurimoto |
| 2013/0154379 A1 | 6/2013 | Tiefenbach |
| 2013/0154521 A1 | 6/2013 | Butzmann et al. |
| 2013/0260188 A1 | 10/2013 | Coates |
| 2013/0285457 A1 | 10/2013 | Kepley |
| 2013/0302652 A1 | 11/2013 | Wolff et al. |
| 2014/0042815 A1 | 2/2014 | Maksimovic et al. |
| 2014/0042827 A1 | 2/2014 | Wolff |
| 2014/0104899 A1 | 4/2014 | Fischer et al. |
| 2014/0152109 A1 | 6/2014 | Kanakasabai et al. |
| 2014/0226379 A1 | 8/2014 | Harrison |
| 2014/0239927 A1 | 8/2014 | Nascimento et al. |
| 2014/0254219 A1 | 9/2014 | Davies |
| 2014/0340052 A1 | 11/2014 | Dwertmann et al. |
| 2014/0354212 A1 | 12/2014 | Sugeno et al. |
| 2015/0009594 A1 | 1/2015 | Okaeme et al. |
| 2015/0049532 A1 | 2/2015 | Bernet et al. |
| 2015/0124506 A1 | 5/2015 | Sahoo et al. |
| 2015/0229227 A1 | 8/2015 | Aeloiza et al. |
| 2015/0249351 A1 | 9/2015 | Wolff et al. |
| 2015/0270801 A1 | 9/2015 | Kessler et al. |
| 2015/0280604 A1 | 10/2015 | Hassanpoor |
| 2015/0288287 A1 | 10/2015 | Madawala et al. |
| 2015/0296292 A1 | 10/2015 | Hogan et al. |
| 2015/0303820 A1 | 10/2015 | Cubaines |
| 2015/0340964 A1 | 11/2015 | Modeer |
| 2015/0364935 A1 | 12/2015 | Fetzer et al. |
| 2016/0072396 A1 | 3/2016 | Deboy et al. |
| 2016/0183451 A1 | 6/2016 | Conrad et al. |
| 2016/0240894 A1 | 8/2016 | Wartenberg et al. |
| 2016/0254682 A1 | 9/2016 | Yip et al. |
| 2016/0308466 A1 | 10/2016 | Oates |
| 2016/0309623 A1* | 10/2016 | Lei .......................... B60L 58/10 |
| 2016/0309624 A1* | 10/2016 | Lei ..................... H05K 7/20927 |
| 2017/0054306 A1 | 2/2017 | Vo et al. |
| 2017/0099007 A1 | 4/2017 | Oates et al. |
| 2017/0141082 A1* | 5/2017 | Hirasawa ................ F28F 9/001 |
| 2017/0163171 A1 | 6/2017 | Park |
| 2017/0179745 A1 | 6/2017 | Tritschler et al. |
| 2017/0338654 A1 | 11/2017 | Subramanian |
| 2017/0366079 A1 | 12/2017 | Bhowmik et al. |
| 2018/0043789 A1 | 2/2018 | Goetz |
| 2018/0175744 A1 | 6/2018 | Jasim et al. |
| 2018/0241239 A1 | 8/2018 | Frost et al. |
| 2019/0031042 A1 | 1/2019 | Müller |
| 2019/0131851 A1 | 5/2019 | Herb |
| 2019/0288522 A1 | 9/2019 | Hinterberger et al. |
| 2019/0288526 A1 | 9/2019 | Jaensch et al. |
| 2019/0288527 A1 | 9/2019 | Jaensch et al. |
| 2019/0288547 A1 | 9/2019 | Jaensch et al. |
| 2019/0288617 A1 | 9/2019 | Jaensch et al. |
| 2019/0312504 A1 | 10/2019 | Kim et al. |
| 2020/0212687 A1 | 7/2020 | Hinterberger et al. |
| 2020/0235439 A1 | 7/2020 | Frost et al. |
| 2020/0244076 A1 | 7/2020 | Wang et al. |
| 2020/0278936 A1 | 9/2020 | Gopalakrishnan et al. |
| 2020/0317086 A1 | 10/2020 | Goetz et al. |
| 2020/0328593 A1 | 10/2020 | Goetz |
| 2020/0338997 A1 | 10/2020 | Goetz et al. |
| 2020/0358370 A1 | 11/2020 | Goetz et al. |
| 2020/0395840 A1 | 12/2020 | Goetz |
| 2021/0005855 A1 | 1/2021 | Götz et al. |
| 2021/0144888 A1* | 5/2021 | Sano ........................ H02P 27/06 |
| 2021/0146791 A1 | 5/2021 | Hinterberger et al. |
| 2021/0151726 A1 | 5/2021 | Hinterberger et al. |
| 2021/0151727 A1 | 5/2021 | Hinterberger et al. |
| 2021/0151728 A1 | 5/2021 | Hinterberger et al. |
| 2021/0197676 A1 | 7/2021 | Goetz et al. |

(56) References Cited

U.S. PATENT DOCUMENTS

| | | | | |
|---|---|---|---|---|
| 2021/0212242 | A1* | 7/2021 | Moreno | F28F 3/12 |
| 2021/0219465 | A1* | 7/2021 | Wang | H05K 7/20863 |

FOREIGN PATENT DOCUMENTS

| | | |
|---|---|---|
| CN | 204156591 U | 2/2015 |
| CN | 103812377 B | 5/2016 |
| DE | 10 2014 008 399 A1 | 12/2015 |
| DE | 10 2016 109 077 A1 | 11/2017 |
| DE | 10 2017 220 175 A1 | 5/2019 |
| DE | 10 2018 109 921 B3 | 8/2019 |
| DE | 10 2018 109 922 A1 | 10/2019 |
| DE | 10 2018 109 925 A1 | 10/2019 |
| DE | 10 2018 109 926 B4 | 12/2019 |
| DE | 10 2018 121 403 A1 | 3/2020 |
| DE | 10 2018 121 490 A1 | 3/2020 |
| DE | 10 2018 121 547 A1 | 3/2020 |
| DE | 10 2018 126 780 A1 | 4/2020 |
| DE | 10 2018 129 111 A1 | 5/2020 |
| DE | 10 2018 126 779 B4 | 6/2020 |
| DE | 10 2019 112 826 B3 | 6/2020 |
| DE | 10 2019 102 306 A1 | 7/2020 |
| DE | 10 2019 102 311 A1 | 7/2020 |
| DE | 10 2019 103 757 B3 | 7/2020 |
| DE | 10 2019 120 615 B3 | 8/2020 |
| DE | 10 2019 112 373 A1 | 11/2020 |
| DE | 10 2019 112 823 A1 | 11/2020 |
| DE | 10 2019 120 616 B3 | 11/2020 |
| DE | 10 2019 120 947 B3 | 11/2020 |
| DE | 10 2019 125 577 B3 | 11/2020 |
| DE | 10 2019 125 578 B3 | 11/2020 |
| DE | 10 2019 120 945 B3 | 2/2021 |
| DE | 10 2019 130 736 A1 | 5/2021 |
| DE | 10 2019 130 737 A1 | 5/2021 |
| DE | 10 2019 132 685 A1 | 6/2021 |
| DE | 10 2020 117 264 B3 | 6/2021 |
| DE | 10 2020 117 435 B3 | 6/2021 |
| DE | 10 2020 118 242 B3 | 7/2021 |
| EP | 0 907 238 A1 | 4/1999 |
| EP | 2 290 799 A1 | 3/2011 |
| EP | 2 658 071 A2 | 10/2013 |
| EP | 2 693 598 A1 | 2/2014 |
| WO | WO 2011/009689 A2 | 1/2011 |
| WO | WO 2011/082855 A2 | 7/2011 |
| WO | WO 2011/082856 A2 | 7/2011 |
| WO | WO 2011/128133 A1 | 10/2011 |
| WO | WO 2012/016735 A1 | 2/2012 |
| WO | WO 2012/038162 A1 | 3/2012 |
| WO | WO 2013/056900 A2 | 4/2013 |
| WO | WO 2014/151178 A2 | 9/2014 |
| WO | WO 2014/193254 A1 | 12/2014 |
| WO | WO 2016/030144 A1 | 3/2016 |
| WO | WO 2018/072837 A1 | 4/2018 |
| WO | WO 2018/095552 A1 | 5/2018 |
| WO | WO 2018/154206 | 8/2018 |
| WO | WO 2018/193173 | 10/2018 |
| WO | WO 2018/210451 A1 | 11/2018 |
| WO | WO 2018/210452 A1 | 11/2018 |
| WO | WO 2018/231810 A1 | 12/2018 |
| WO | WO 2018/232403 A1 | 12/2018 |
| WO | WO 2018/233871 A1 | 12/2018 |
| WO | WO 2019/020215 A1 | 1/2019 |
| WO | WO 2019/161875 A1 | 8/2019 |
| WO | WO 2019/166733 A1 | 9/2019 |
| WO | WO 2019/180699 A1 | 9/2019 |
| WO | WO 2019/183553 A1 | 9/2019 |
| WO | WO 2020/078580 A1 | 4/2020 |
| WO | WO 2020/205511 A1 | 10/2020 |
| WO | WO 2020/205574 A1 | 10/2020 |
| WO | WO 2020/243655 A1 | 12/2020 |

OTHER PUBLICATIONS

WO, PCT/US21/32295 ISR and Written Opinion, Sep. 14, 2021.
WO, PCT/US21/27154 ISR and Written Opinion, Oct. 14, 2021.
EP, 18816636.7 Extended Search Report, Feb. 19, 2021.
EP, 18817541.8 Supplementary Search Report, Jan. 20, 2021.
EP, 18817541.8 Written Opinion, Feb. 2, 2021.
SG, 11201912049P Written Opinion, Mar. 10, 2021.
WO, PCT/US18/37081 ISR and Written Opinion, Oct. 17, 2018.
WO, PCT/US18/38089 ISR and Written Opinion, Oct. 29, 2018.
WO, PCT/US19/23695 ISR and Written Opinion, Aug. 12, 2019.
Bode, G.H., et al., "Hysteresis Current Regulation for Single-Phase Multilevel Inverters Using Asynchronous State Machines", 29$^{th}$ Annual Conference of the IEEE Industrial Electronics Society, Piscataway, NJ, 2003, pp. 1203-4208.
"Capacitor Voltage Control Technique for a Modular Converter", An IP.com Prior Art Database Technical Disclosure, Jun. 10, 2015, pp. 1-7.
Chang, F., et al., "Improving the Overall Efficiency of Automotive Inverters Using a Multilevel Converter Composed of Low Voltage Si MOSFETs", IEEE Transactions on Power Electronics, 2019, vol. 34, No. 4, pp. 3586-3602.
Debnath, S., et al., "Operation, Control, and Applications of the Modular Multilevel Converter: A Review", IEEE Transactions on Power Electronics, 2015, vol. 30, No. 1, pp. 37-53.
Farr, E., et al., "A Sub-module Capacitor Voltage Balancing Scheme for the Alternate Arm Converter (AAC)", 15$^{th}$ European Conference on IEEE Power Electronics and Applications, 2013, pp. 1-10.
Gelman, V., "Energy Storage That May Be too Good to Be True", IEEE Vehicular Technology Magazine, 2031, pp. 70-80.
Gupta, R., et al., "Cascaded Multilevel Control of DSTATCOM Using Multiband Hysteresis Modulation", IEEE Power Engineering Society General Meeting, Piscataway, NJ, 2006, pp. 1-7.
Hassanpoor, A., et al., "Tolerance Band Modulation Methods for Modular Multilevel Converters", IEEE Transactions on Power Electronics, 2015, vol. 30, No. 1, pp. 311-326.
Herrera, V. I., et al., "Optimal Energy Management and Sizing of a Battery—Supercapacitor-Based Light Rail Vehicle With a Multiobjective Approach", IEEE Transactions on Industry Applications, 2016, vol. 52, No. 4, pp. 3367-3377.
Kersten, A., "Battery Loss and Stress Mitigation in a Cascaded H-Bridge Multilevel Inverter for Vehicle Traction Applications by Filter Capacitors", IEEE Transactions on Transportation Electrification, 2019, pp. 1-13.
Khoshkbar-Sadigh, A., et al., "Thermal and Performance Comparison of Active Neutral-Point-Clamped (ANPC) and Dual Flying-Capacitor ANPC (DFC-ANPC) Inverters", IEEE Energy Conversion Congress and Exposition (ECCE), 2019, pp. 5522-5528.
Konstantinou, G., et al., "A Hybrid Modular Multilevel Converter with Partial Embedded Energy Storage", Energies, 2016, vol. 9, No. 12, pp. 1-18.
Li, N., et al., "SOH Balancing Control Method for the MMC Battery Energy Storage System", IEEE Transactions on Industrial Electronics, 2018, vol. 65, No. 8, pp. 6581-6591.
Loh, P. C., et al., "A Reduced Common Mode Hysteresis Current Regulation Strategy for Multilevel Inverters", 18$^{th}$ Annual IEEE Applied Power Electronics Conference and Exposition, Miami Beach, FL, 2003, vol. 1, pp. 576-582.
Loh, P. C., et al., "A Time-Based Double-Band Hysteresis Current Regulation Strategy for Single-Phase Multilevel Inverters", IEEE Transactions on Industry Applications, 2003, vol. 39, No. 3, pp. 883-892.
Maharjan, L., et al., "State-of-Charge (SOC)-Balancing Control of a Battery Energy Storage System Based on a Cascade PWM Converter", IEEE Transactions on Power Electronics, 2009, vol. 24, No. 6, pp. 1628-1636.
Maharjan, L., et al., "Fault-Tolerant Operation of a Battery-Energy-Storage System Based on a Multilevel Cascade PWM Converter

(56) References Cited

OTHER PUBLICATIONS

With Star Configuration", IEEE Transactions on Power Electronics, 2010, vol. 25, No. 9, pp. 2386-2396.

Méllo, J.P.R., et al., "Multilevel Reduced Controlled Switches AC-DC Power Conversion Cells", IEEE Energy Conversion Congress and Exposition (ECCE), 2015, pp. 3815-3822.

Naderi, R., et al., "Phase-Shifted Carrier PWM Technique for General Cascaded Inverters", IEEE Transactions on Power Electronics, 2008, vol. 23, No. 3, pp. 1257-1269.

Naderi, R., et al., "A Correction to the State-Machine-Decoder for Stacked Multicell Converters", IEEE Applied Power Electronics Conference and Exposition (APEC), 2014, pp. 1545-1549.

Naderi, R., et al., "A New Hybrid Active Neutral Point Clamped Flying Capacitor Multilevel Inverter", IEEE Applied Power Electronics Conference and Exposition (APEC), 2015, pp. 794-798.

Naderi, R., et al., "Dual Flying Capacitor Active-Neutral-Point-Clamped Multilevel Converter", IEEE Transactions on Power Electronics, 2016, vol. 31, No. 9, pp. 6476-6484.

Naderi, R., "Battery Management Converter System and Multilevel Converter Topology and Control", 2016, Dissertation at the University of California, Irvine, pp. 1-211.

P., S., et al., "Seven Level Inverter Topologies: A Comparative Study", International Journal of Innovative Research in Electrical, Electronics, Instrumentation and Control Engineering, 2016, vol. 3, No. 1, pp. 148-162.

Sangiri, J. B., et al., "Modular Multilevel Converter for Multifunctional Battery Management System of Electric Vehicle", 44th Annual Conference of the IEEE Industrial Electronics Society, 2018, pp. 1333-1338.

Shimada, M., et al., "Energy-saving Technology for Railway Traction Systems Using Onboard Storage Batteries", Hitachi Review, 2012, vol. 61, No. 7, pp. 312-318.

Tajeddine, K., et al., "A Cascaded H-Bridge Multilevel Inverter with SOC Battery Balancing", International Journal of Advanced Computer Science and Applications, 2017, vol. 8, No. 12, pp. 345-350.

Varghese, K., "Implementation of Single Phase Seven Level Cascaded Multilevel Inverter With Reduced No of Switches", Project Report'15, retrieved from https://www.academia.edu/12826368/single_phase_seven_level_cascaded_multilevel_inverter, pp. 1-45.

Venu, K., et al., "A Seven Level Single-Phase Cascaded Inverter with Improved Efficiency", International Journal & Magazine of Engineering, Technology, Management and Research, 2016, vol. 3, No. 10, pp. 243-249.

Wu, B., et al., "Analysis of a distributed maximum power point tracking tracker with low input voltage ripple and flexible gain range", IET Power Electron., 2016, vol. 9, No. 6, pp. 1220-1227.

Zhang, L., et al., "Design and Performance Evaluation of the Modular Multilevel Converter (MMC)-based Grid-tied PV-Battery Conversion System", IEEE Energy Conversion Congress and Exposition (ECCE), 2018, pp. 2649-2654.

WO, PCT/US21/27159 ISR and Written Opinion, Sep. 1, 2021.

De Simone, "Modular Multilevel Converter with Integrated Storage System for Automotive Applications," Dissertation for the degree of Doctor of Electrical Engineering, Politecnico di Milano, Department of Electronics, Information and Bioengineering, Sep. 21, 2021, 181 pages.

\* cited by examiner

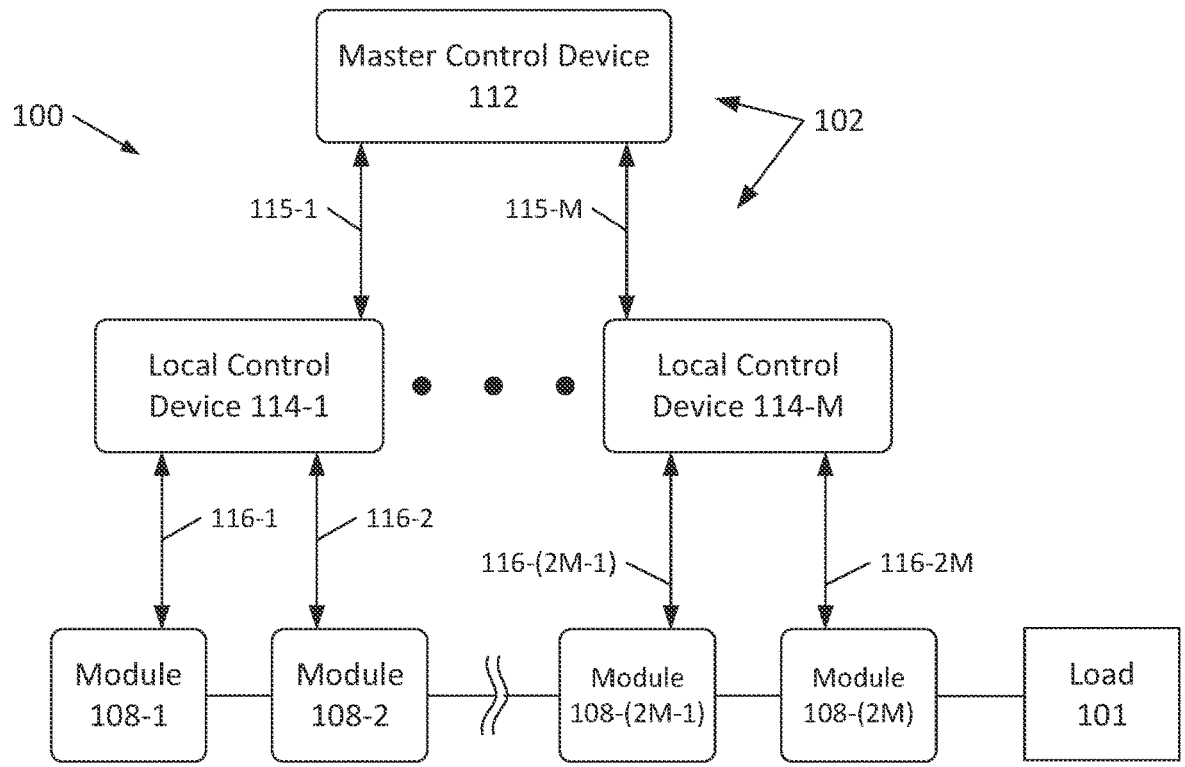
FIG. 1C
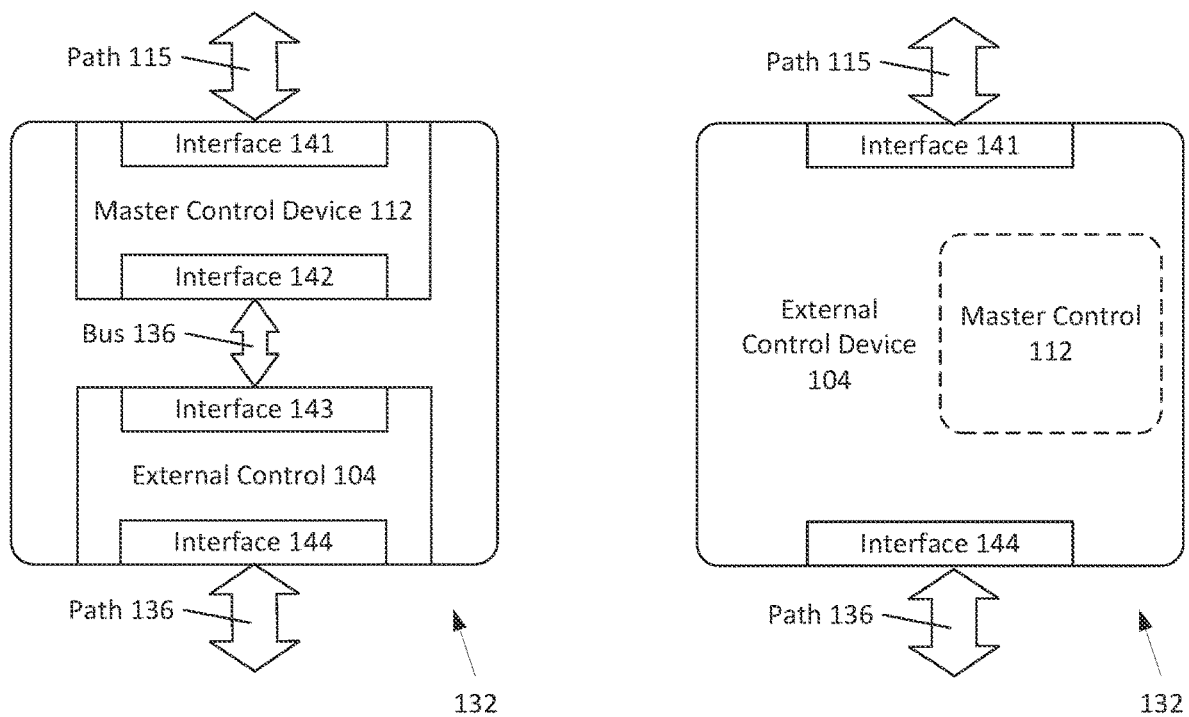
FIG. 1D
FIG. 1E

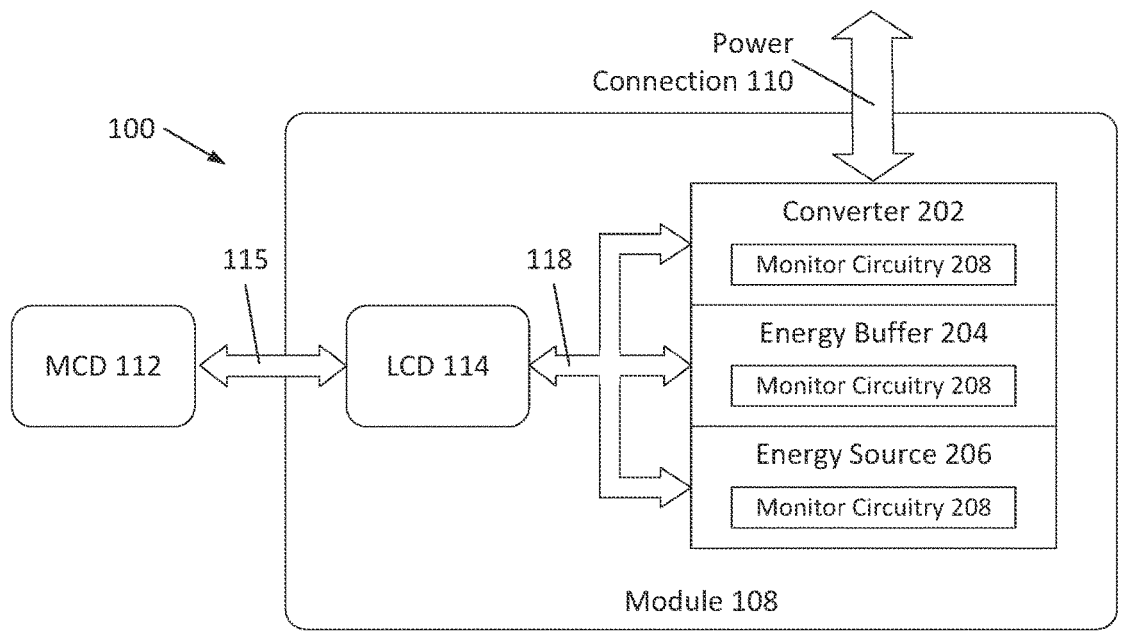
FIG. 2B
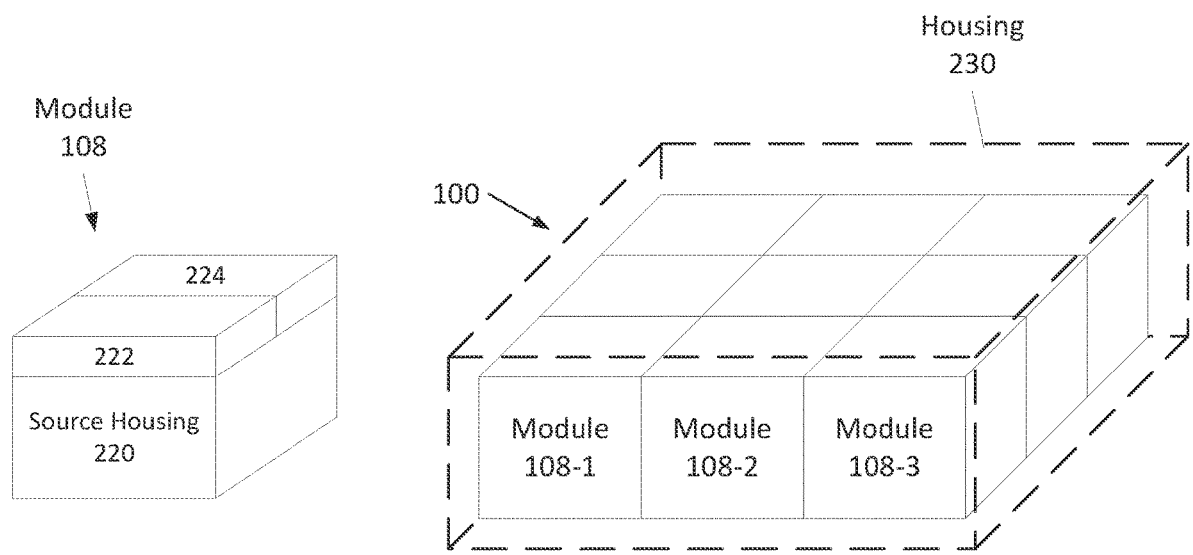
FIG. 2C
FIG. 2D

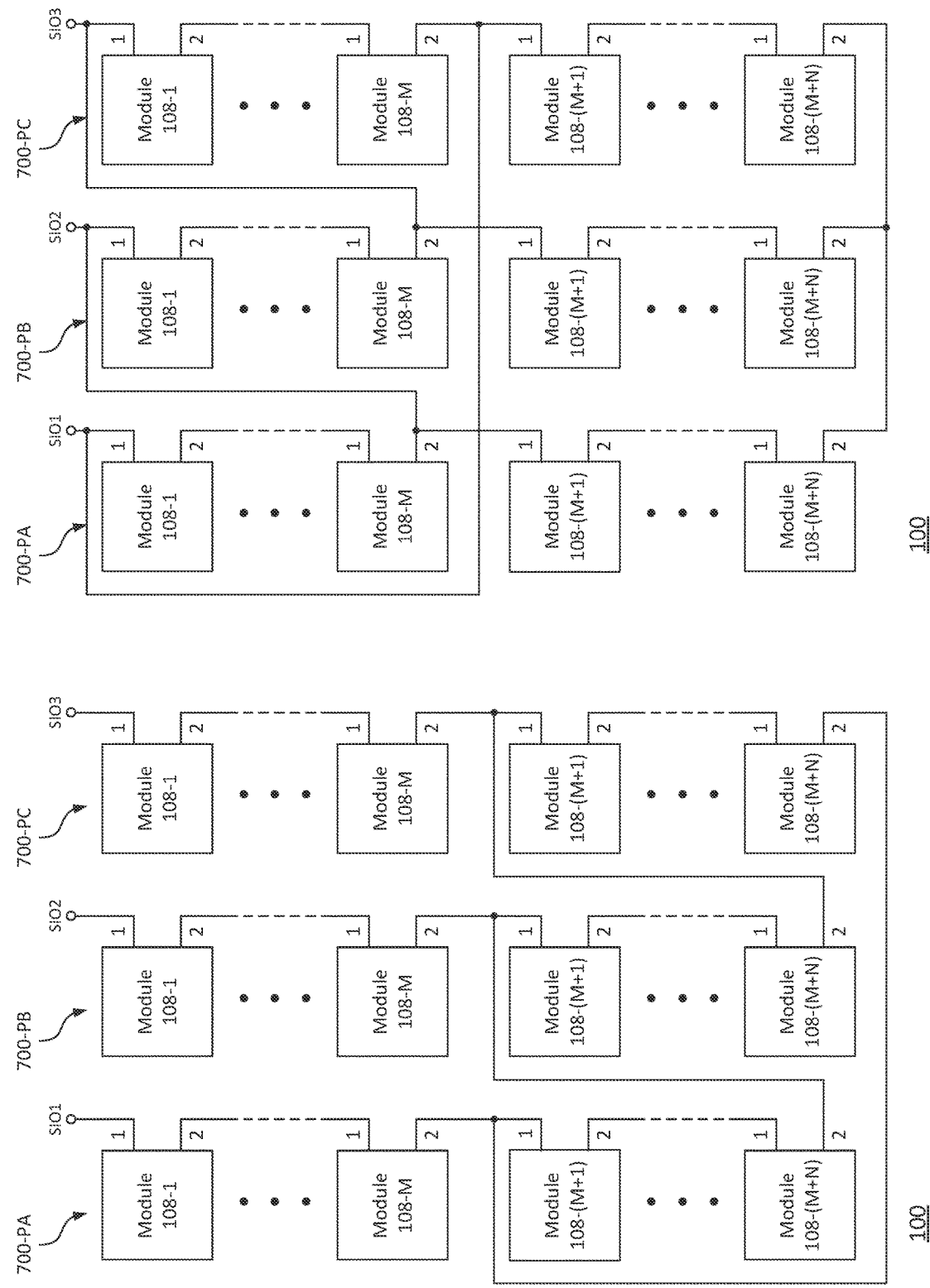

1100

MODULAR CASCADED ENERGY SYSTEMS WITH A COOLING APPARATUS AND WITH REPLACEABLE ENERGY SOURCE CAPABILITY

CROSS-REFERENCE TO RELATED APPLICATIONS

This application claims the benefit of, and priority to, U.S. Provisional Application No. 63/009,996, filed Apr. 14, 2020 and U.S. Provisional Application No. 63/086,003, filed Sep. 28, 2020, both of which are incorporated by reference herein in their entireties and for all purposes.

FIELD

The subject matter described herein relates generally to systems, devices, and methods for providing cooling for modular cascaded energy systems and for providing the capability to remove and replace energy sources.

BACKGROUND

Energy systems having multiple energy sources or sinks are commonplace in many industries. One example is the automobile industry. Today's automotive technology, as evolved over the past century, is characterized, amongst many things, by an interplay of motors, mechanical elements, and electronics. These are the key components that impact vehicle performance and driver experience. Motors are of the combustion or electric type and in almost all cases the rotational energy from the motor is delivered via a set of highly sophisticated mechanical elements, such as clutches, transmissions, differentials, drive shafts, torque tubes, couplers, etc. These parts control to a large degree torque conversion and power distribution to the wheels and are define the performance of the car and road handling.

An electric vehicle (EV) includes various electrical systems that are related to the drivetrain including, among others, the battery pack, the charger and motor control. High voltage battery packs are typically organized in a serial chain of lower voltage battery modules. Each such module further includes a set of serially connected individual cells and a simple embedded battery management system (BMS) to regulate basic cell related characteristics, such as state of charge and voltage. Electronics with more sophisticated capabilities or some form of smart interconnectedness are absent. As a consequence, any monitoring or control function is handled by a separate system, which, if at all present elsewhere in the car, lacks the ability to monitor individual cell health, state of charge, temperature and other performance impacting metrics. There is also no ability to meaningfully adjust power draw per individual cell in any form. Some of the major consequences are: (1) the weakest cell constrains the overall performance of the entire battery pack, (2) failure of any cell or module leads to a need for replacement of the entire pack, (3) battery reliability and safety are considerably reduced, (4) battery life is limited, (5) thermal management is difficult, (6) battery packs always operate below maximum capabilities, (7) sudden inrush of regenerative braking derived electric power cannot be readily stored in the batteries and requires dissipation via a dump resistor.

Charging circuits for EVs are typically realized in separate on-board systems. They stage power coming from outside the EV in the form of an AC signal or a DC signal, convert it to DC and feed it to the battery pack. Charging systems monitor voltage and current and typically supply a steady constant feed. Given the design of the battery packs and typical charging circuits, there is little ability to tailor charging flows to individual battery modules based on cell health, performance characteristics, temperature, etc. Charging cycles are also typically long as the charging systems and battery packs lack the circuitry to allow for pulsed charging or other techniques that would optimize the charge transfer or total charge achievable.

Conventional controls contain DC to DC conversion stages to adjust battery pack voltage levels to the bus voltage of the EV's electrical system. The electric motor, in turn, is driven by simple two-level multiphase converters that provide the required AC signal(s) to the motor. Each motor is traditionally controlled by a separate controller, which drives the motor in a three phase design. Dual motor EVs would require two controllers, while EVs using four in-wheel motors would require four individual controllers. The conventional controller design also lacks the ability to drive next generation motors, such as switch reluctance motors (SRM), characterized by higher numbers of pole pieces. Adaptation would require higher phase designs, making the systems more complex and ultimately fail to address electric noise and driving performance, such as high torque ripple and acoustical noise.

Many of these deficiencies apply not only to automobiles but other motor driven vehicles, and also to stationary applications to a significant extent. For these and other reasons, needs exist for improved systems, devices, and methods for energy systems for mobile and stationary applications.

SUMMARY

Example embodiments of systems, devices, and methods are provided herein for cooling a modular energy system. The embodiments can utilize an enclosure surrounding the modular energy system to route the coolant in a manner that passes in proximity with components of modules of the modular energy system. The embodiments can provide for a sequence of pumping coolant such that the coolant cools components of the electric vehicle having the lowest desired operating temperature first, followed by the components having relatively higher desired operating temperatures.

Example embodiments of systems, devices, and methods are also provided herein for a modular energy system with removable and replaceable energy sources. The system can be configured in a wide variety of different electrical configurations, and positioned within an electric vehicle in a manner that permits rapid removal of energy sources having a relatively low state of charge and replacement of those energy sources with different energy sources having a relatively higher state of charge. The energy sources can be releasably latched in place within the electric vehicle such that each energy source is removable from electric connection with the converter electronics associated therewith.

Other systems, devices, methods, features and advantages of the subject matter described herein will be or will become apparent to one with skill in the art upon examination of the following figures and detailed description. It is intended that all such additional systems, methods, features and advantages be included within this description, be within the scope of the subject matter described herein, and be protected by the accompanying claims. In no way should the features of the example embodiments be construed as limiting the appended claims, absent express recitation of those features in the claims.

BRIEF DESCRIPTION OF FIGURES

The details of the subject matter set forth herein, both as to its structure and operation, may be apparent by study of the accompanying figures, in which like reference numerals refer to like parts. The components in the figures are not necessarily to scale, emphasis instead being placed upon illustrating the principles of the subject matter. Moreover, all illustrations are intended to convey concepts, where relative sizes, shapes and other detailed attributes may be illustrated schematically rather than literally or precisely.

FIGS. 1A-1C are block diagrams depicting example embodiments of a modular energy system.

FIGS. 1D-1E are block diagrams depicting example embodiments of control devices for an energy system.

FIGS. 2A-2B are block diagrams depicting example embodiments of a module and control system within an energy system.

FIG. 2C is a block diagram depicting an example embodiment of a physical configuration of a module.

FIG. 2D is a block diagram depicting an example embodiment of a physical configuration of a modular energy system.

FIGS. 7A-7E are block diagrams depicting example embodiments of modular energy systems having various topologies.

DETAILED DESCRIPTION

Figure 1A:
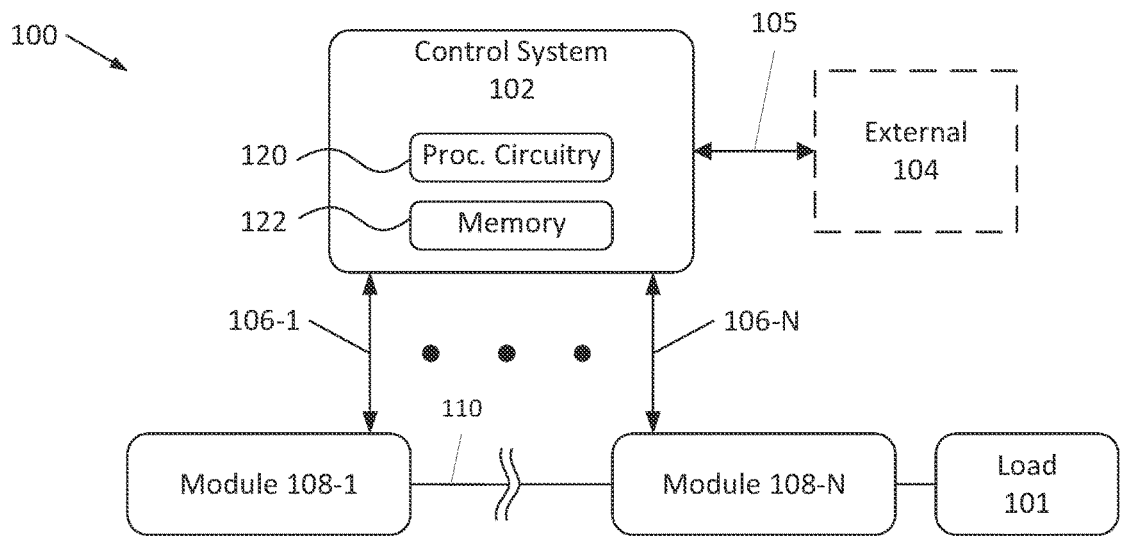

Before the present subject matter is described in detail, it is to be understood that this disclosure is not limited to the particular embodiments described, as such may, of course, vary. The terminology used herein is for the purpose of describing particular embodiments only, and is not intended to be limiting, since the scope of the present disclosure will be limited only by the appended claims.

Before describing the example embodiments pertaining to cooling systems and replaceable energy sources, it is first useful to describe these underlying modular energy systems in greater detail. With reference to FIGS. 1A through 10F, the following sections describe various applications in which embodiments of the modular energy systems can be implemented, embodiments of control systems or devices for the modular energy systems, configurations of the modular energy system embodiments with respect to charging sources and loads, embodiments of individual modules, embodiments of topologies for arrangement of the modules within the systems, embodiments of control methodologies, embodiments of balancing operating characteristics of modules within the systems, and embodiments of the use of interconnection modules.

Examples of Applications

Stationary applications are those in which the modular energy system is located in a fixed location during use, although it may be capable of being transported to alternative locations when not in use. The module-based energy system resides in a static location while providing electrical energy for consumption by one or more other entities, or storing or buffering energy for later consumption. Examples of stationary applications in which the embodiments disclosed herein can be used include, but are not limited to: energy systems for use by or within one or more residential structures or locales, energy systems for use by or within one or more industrial structures or locales, energy systems for use by or within one or more commercial structures or locales, energy systems for use by or within one or more governmental structures or locales (including both military and non-military uses), energy systems for charging the mobile applications described below (e.g., a charge source or a charging station), and systems that convert solar power, wind, geothermal energy, fossil fuels, or nuclear reactions into electricity for storage. Stationary applications often supply loads such as grids and microgrids, motors, and data centers. A stationary energy system can be used in either a storage or non-storage role.

Mobile applications, sometimes referred to as traction applications, are generally ones where a module-based energy system is located on or within an entity, and stores and provides electrical energy for conversion into motive force by a motor to move or assist in moving that entity. Examples of mobile entities with which the embodiments disclosed herein can be used include, but are not limited to, electric and/or hybrid entities that move over or under land, over or under sea, above and out of contact with land or sea (e.g., flying or hovering in the air), or through outer space. Examples of mobile entities with which the embodiments disclosed herein can be used include, but are not limited to, vehicles, trains, trams, ships, vessels, aircraft, and spacecraft. Examples of mobile vehicles with which the embodiments disclosed herein can be used include, but are not limited to, those having only one wheel or track, those having only two-wheels or tracks, those having only three wheels or tracks, those having only four wheels or tracks, and those having five or more wheels or tracks. Examples of mobile entities with which the embodiments disclosed herein can be used include, but are not limited to, a car, a bus, a truck, a motorcycle, a scooter, an industrial vehicle, a mining vehicle, a flying vehicle (e.g., a plane, a helicopter, a drone, etc.), a maritime vessel (e.g., commercial shipping vessels, ships, yachts, boats or other watercraft), a submarine, a locomotive or rail-based vehicle (e.g., a train, a tram, etc.), a military vehicle, a spacecraft, and a satellite.

In describing embodiments herein, reference may be made to a particular stationary application (e.g., grid, microgrid, data centers, cloud computing environments) or mobile application (e.g., an electric car). Such references are made for ease of explanation and do not mean that a particular embodiment is limited for use to only that particular mobile or stationary application. Embodiments of systems providing power to a motor can be used in both mobile and stationary applications. While certain configurations may be more suitable to some applications over others, all example embodiments disclosed herein are capable of use in both mobile and stationary applications unless otherwise noted.

Examples of Module-Based Energy Systems

FIG. 1A is a block diagram depicts an example embodiment of a module-based energy system 100. Here, system 100 includes control system 102 communicatively coupled with N converter-source modules 108-1 through 108-N, over communication paths or links 106-1 through 106-N, respectively. Modules 108 are configured to store energy and output the energy as needed to a load 101 (or other modules 108). In these embodiments, any number of two or more modules 108 can be used (e.g., N is greater than or equal to two). Modules 108 can be connected to each other in a variety of manners as will be described in more detail with respect to FIGS. 7A-7E. For ease of illustration, in FIGS. 1A-1C, modules 108 are shown connected in series, or as a one dimensional array, where the Nth module is coupled to load 101.

System 100 is configured to supply power to load 101. Load 101 can be any type of load such as a motor or a grid. System 100 is also configured to store power received from a charge source. FIG. 1F is a block diagram depicting an example embodiment of system 100 with a power input interface 151 for receiving power from a charge source 150 and a power output interface for outputting power to load 101. In this embodiment system 100 can receive and store power over interface 151 at the same time as outputting power over interface 152. FIG. 1G is a block diagram depicting another example embodiment of system 100 with a switchable interface 154. In this embodiment, system 100 can select, or be instructed to select, between receiving power from charge source 150 and outputting power to load 101. System 100 can be configured to supply multiple loads 101, including both primary and auxiliary loads, and/or receive power from multiple charge sources 150 (e.g., a utility-operated power grid and a local renewable energy source (e.g., solar)).

Figure 1B:
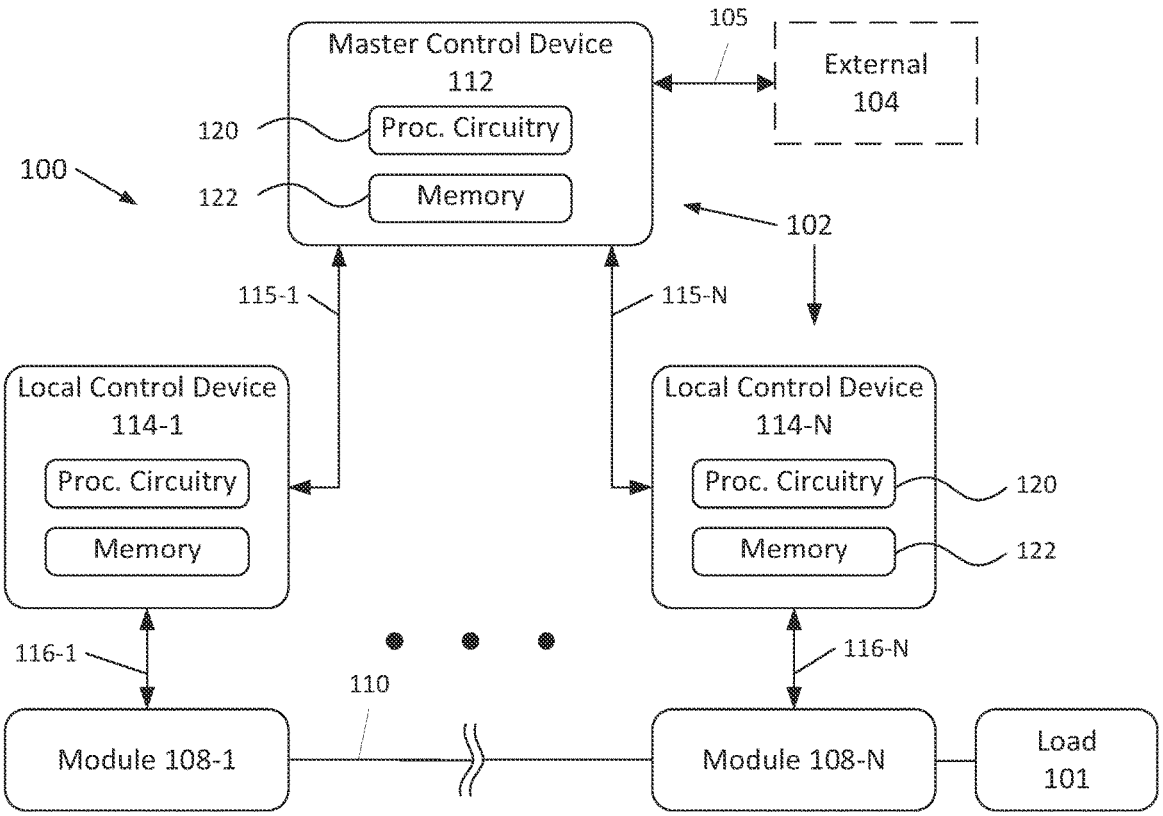
Figure 1F:
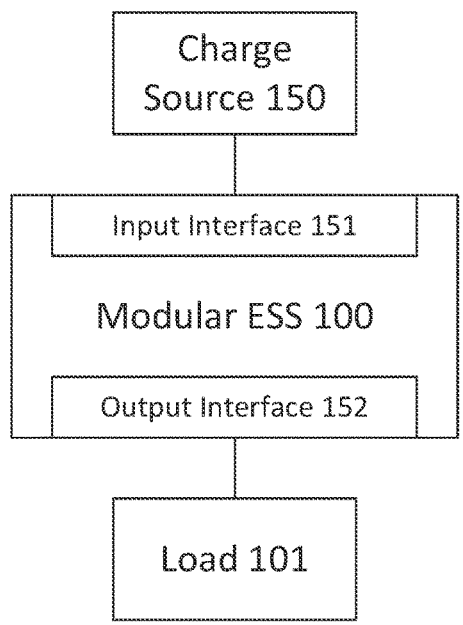
FIGS. 1F-1G are block diagrams depicting example embodiments of modular energy systems coupled with a load and a charge source.
Figure 1G:
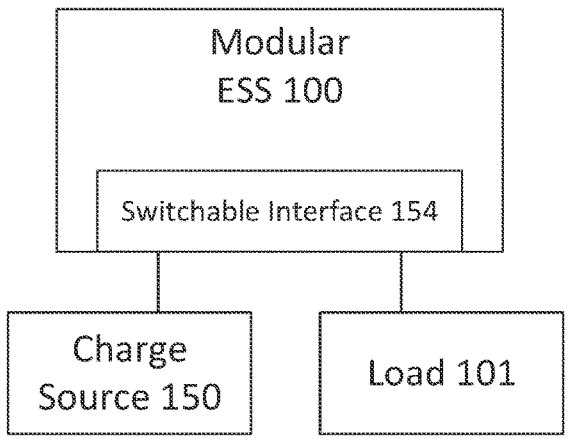

FIG. 1B depicts another example embodiment of system 100. Here, control system 102 is implemented as a master control device (MCD) 112 communicatively coupled with N different local control devices (LCDs) 114-1 through 114-N over communication paths or links 115-1 through 115-N, respectively. Each LCD 114-1 through 114-N is communicatively coupled with one module 108-1 through 108-N over communication paths or links 116-1 through 116-N, respectively, such that there is a 1:1 relationship between LCDs 114 and modules 108.

FIG. 1C depicts another example embodiment of system 100. Here, MCD 112 is communicatively coupled with M different LCDs 114-1 to 114-M over communication paths or links 115-1 to 115-M, respectively. Each LCD 114 can be coupled with and control two or more modules 108. In the example shown here, each LCD 114 is communicatively coupled with two modules 108, such that M LCDs 114-1 to 114-M are coupled with 2M modules 108-1 through 108-2M over communication paths or links 116-1 to 116-2M, respectively.

Control system 102 can be configured as a single device (e.g., FIG. 1A) for the entire system 100 or can be distributed across or implemented as multiple devices (e.g., FIGS. 1B-1C). In some embodiments, control system 102 can be distributed between LCDs 114 associated with the modules 108, such that no MCD 112 is necessary and can be omitted from system 100.

Control system 102 can be configured to execute control using software (instructions stored in memory that are executable by processing circuitry), hardware, or a combination thereof. The one or more devices of control system 102 can each include processing circuitry 120 and memory 122 as shown here. Example implementations of processing circuitry and memory are described further below.

Control system 102 can have a communicative interface for communicating with devices 104 external to system 100 over a communication link or path 105. For example, control system 102 (e.g., MCD 112) can output data or information about system 100 to another control device 104 (e.g., the Electronic Control Unit (ECU) or Motor Control Unit (MCU) of a vehicle in a mobile application, grid controller in a stationary application, etc.).

Communication paths or links 105, 106, 115, 116, and 118 (FIG. 2B) can each be wired (e.g., electrical, optical) or wireless communication paths that communicate data or information bidirectionally, in parallel or series fashion. Data can be communicated in a standardized (e.g., IEEE, ANSI) or custom (e.g., proprietary) format. In automotive applications, communication paths 115 can be configured to communicate according to FlexRay or CAN protocols. Communication paths 106, 115, 116, and 118 can also provide wired power to directly supply the operating power for system 102 from one or more modules 108. For example, the operating power for each LCD 114 can be supplied only by the one or more modules 108 to which that LCD 114 is connected and the operating power for MCD 112 can be supplied indirectly from one or more of modules 108 (e.g., such as through a car's power network).

Control system 102 is configured to control one or more modules 108 based on status information received from the same or different one or more of modules 108. Control can also be based on one or more other factors, such as requirements of load 101. Controllable aspects include, but are not limited to, one or more of voltage, current, phase, and/or output power of each module 108.

Status information of every module 108 in system 100 can be communicated to control system 102, which can independently control every module 108-1 . . . 108-N. Other variations are possible. For example, a particular module 108 (or subset of modules 108) can be controlled based on status information of that particular module 108 (or subset), based on status information of a different module 108 that is not that particular module 108 (or subset), based on status information of all modules 108 other than that particular module 108 (or subset), based on status information of that particular module 108 (or subset) and status information of at least one other module 108 that is not that particular module 108 (or subset), or based on status information of all modules 108 in system 100.

The status information can be information about one or more aspects, characteristics, or parameters of each module 108. Types of status information include, but are not limited to, the following aspects of a module 108 or one or more components thereof (e.g., energy source, energy buffer, converter, monitor circuitry): State of Charge (SOC) (e.g., the level of charge of an energy source relative to its capacity, such as a fraction or percent) of the one or more energy sources of the module, State of Health (SOH) (e.g., a figure of merit of the condition of an energy source compared to its ideal conditions) of the one or more energy sources of the module, temperature of the one or more energy sources or other components of the module, capacity of the one or more energy sources of the module, voltage of the one or more energy sources and/or other components of the module, current of the one or more energy sources and/or other components of the module, and/or the presence of absence of a fault in any one or more of the components of the module.

LCDs 114 can be configured to receive the status information from each module 108, or determine the status information from monitored signals or data received from or within each module 108, and communicate that information to MCD 112. In some embodiments, each LCD 114 can communicate raw collected data to MCD 112, which then algorithmically determines the status information on the basis of that raw data. MCD 112 can then use the status information of modules 108 to make control determinations accordingly. The determinations may take the form of instructions, commands, or other information (such as a modulation index described herein) that can be utilized by LCDs 114 to either maintain or adjust the operation of each module 108.

For example, MCD 112 may receive status information and assess that information to determine a difference between at least one module 108 (e.g., a component thereof) and at least one or more other modules 108 (e.g., comparable components thereof). For example, MCD 112 may determine that a particular module 108 is operating with one of the following conditions as compared to one or more other modules 108: with a relatively lower or higher SOC, with a relatively lower or higher SOH, with a relatively lower or higher capacity, with a relatively lower or higher voltage, with a relatively lower or higher current, with a relatively lower or higher temperature, or with or without a fault. In such examples, MCD 112 can output control information that causes the relevant aspect (e.g., output voltage, current, power, temperature) of that particular module 108 to be reduced or increased (depending on the condition). In this manner, the utilization of an outlier module 108 (e.g., operating with a relatively lower SOC or higher temperature), can be reduced so as to cause the relevant parameter of that module 108 (e.g., SOC or temperature) to converge towards that of one or more other modules 108.

The determination of whether to adjust the operation of a particular module 108 can be made by comparison of the status information to predetermined thresholds, limits, or conditions, and not necessarily by comparison to statuses of other modules 108. The predetermined thresholds, limits, or conditions can be static thresholds, limits, or conditions, such as those set by the manufacturer that do not change during use. The predetermined thresholds, limits, or conditions can be dynamic thresholds, limits, or conditions, that are permitted to change, or that do change, during use. For example, MCD 112 can adjust the operation of a module 108 if the status information for that module 108 indicates it to be operating in violation (e.g., above or below) of a predetermined threshold or limit, or outside of a predetermined range of acceptable operating conditions. Similarly, MCD 112 can adjust the operation of a module 108 if the status information for that module 108 indicates the presence of an actual or potential fault (e.g., an alarm, or warning) or indicates the absence or removal of an actual or potential fault. Examples of a fault include, but are not limited to, an actual failure of a component, a potential failure of a component, a short circuit or other excessive current condition, an open circuit, an excessive voltage condition, a failure to receive a communication, the receipt of corrupted data, and the like. Depending on the type and severity of the fault, the faulty module's utilization can be decreased to avoid damaging the module, or the module's utilization can be ceased altogether.

MCD 112 can control modules 108 within system 100 to achieve or converge towards a desired target. The target can be, for example, operation of all modules 108 at the same or similar levels with respect to each other, or within predetermined thresholds limits, or conditions. This process is also referred to as balancing or seeking to achieve balance in the operation or operating characteristics of modules 108. The term "balance" as used herein does not require absolute equality between modules 108 or components thereof, but rather is used in a broad sense to convey that operation of system 100 can be used to actively reduce disparities in operation between modules 108 that would otherwise exist.

MCD 112 can communicate control information to LCD 114 for the purpose of controlling the modules 108 associated with the LCD 114. The control information can be, e.g., a modulation index and a reference signal as described herein, a modulated reference signal, or otherwise. Each LCD 114 can use (e.g., receive and process) the control information to generate switch signals that control operation of one or more components (e.g., a converter) within the associated module(s) 108. In some embodiments, MCD 112 generates the switch signals directly and outputs them to LCD 114, which relays the switch signals to the intended module component.

All or a portion of control system 102 can be combined with a system external control device 104 that controls one or more other aspects of the mobile or stationary application. When integrated in this shared or common control device (or subsystem), control of system 100 can be implemented in any desired fashion, such as one or more software applications executed by processing circuitry of the shared device, with hardware of the shared device, or a combination thereof. Non-exhaustive examples of external control devices 104 include: a vehicular ECU or MCU having control capability for one or more other vehicular functions (e.g., motor control, driver interface control, traction control, etc.); a grid or micro-grid controller having responsibility for one or more other power management functions (e.g., load interfacing, load power requirement forecasting, transmission and switching, interface with charge sources (e.g., diesel, solar, wind), charge source power forecasting, back up source monitoring, asset dispatch, etc.); and a data center control subsystem (e.g., environmental control, network control, backup control, etc.).

FIGS. 1D and 1E are block diagrams depicting example embodiments of a shared or common control device (or system) 132 in which control system 102 can be implemented. In FIG. 1D, common control device 132 includes master control device 112 and external control device 104. Master control device 112 includes an interface 141 for communication with LCDs 114 over path 115, as well as an interface 142 for communication with external control device 104 over internal communication bus 136. External control device 104 includes an interface 143 for communication with master control device 112 over bus 136, and an interface 144 for communication with other entities (e.g., components of the vehicle or grid) of the overall application over communication path 136. In some embodiments, common control device 132 can be integrated as a common housing or package with devices 112 and 104 implemented as discrete integrated circuit (IC) chips or packages contained therein.

In FIG. 1E, external control device 104 acts as common control device 132, with the master control functionality implemented as a component 112 within device 104. This component 112 can be or include software or other program instructions stored and/or hardcoded within memory of device 104 and executed by processing circuitry thereof. The component can also contain dedicated hardware. The component can be a self-contained module or core, with one or more internal hardware and/or software interfaces (e.g., application program interface (API)) for communication with the operating software of external control device 104. External control device 104 can manage communication with LCDs 114 over interface 141 and other devices over interface 144. In various embodiments, device 104/132 can be integrated as a single IC chip, can be integrated into multiple IC chips in a single package, or integrated as multiple semiconductor packages within a common housing.

In the embodiments of FIGS. 1D and 1E, the master control functionality of system 102 is shared in common device 132, however, other divisions of shared control or permitted. For example, part of the master control functionality can be distributed between common device 132 and a dedicated MCD 112. In another example, both the master control functionality and at least part of the local control functionality can be implemented in common device 132 (e.g., with remaining local control functionality implemented in LCDs 114). In some embodiments, all of control system 102 is implemented in common device (or subsystem) 132. In some embodiments, local control functionality is implemented within a device shared with another component of each module 108, such as a Battery Management System (BMS).

Examples of Modules within Cascaded Energy Systems

Figure 2A:
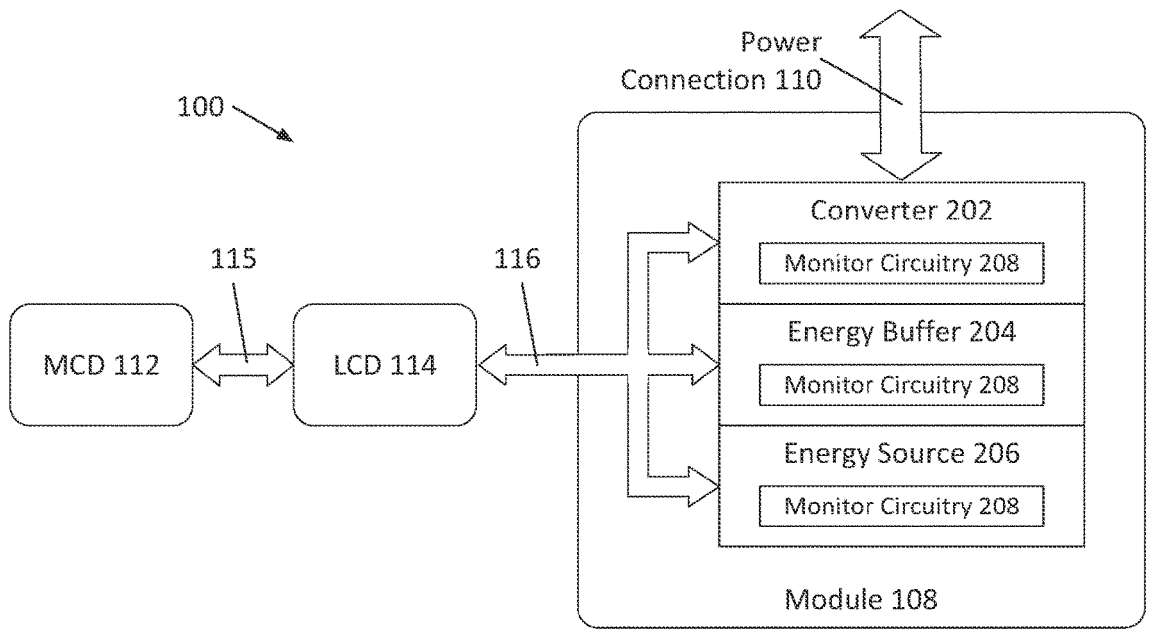

Module 108 can include one or more energy sources and a power electronics converter and, if desired, an energy buffer. FIGS. 2A-2B are block diagrams depicting additional example embodiments of system 100 with module 108 having a power converter 202, an energy buffer 204, and an energy source 206. Converter 202 can be a voltage converter or a current converter. The embodiments are described herein with reference to voltage converters, although the embodiments are not limited to such. Converter 202 can be configured to convert a direct current (DC) signal from energy source 204 into an alternating current (AC) signal and output it over power connection 110 (e.g., an inverter). Converter 202 can also receive an AC or DC signal over connection 110 and apply it to energy source 204 with either polarity in a continuous or pulsed form. Converter 202 can be or include an arrangement of switches (e.g., power transistors) such as a half bridge of full bridge (H-bridge). In some embodiments converter 202 includes only switches and the converter (and the module as a whole) does not include a transformer.

Converter 202 can be also (or alternatively) be configured to perform AC to DC conversion (e.g., a rectifier) such as to charge a DC energy source from an AC source, DC to DC conversion, and/or AC to AC conversion (e.g., in combination with an AC-DC converter). In some embodiments, such as to perform AC-AC conversion, converter 202 can include a transformer, either alone or in combination with one or more power semiconductors (e.g., switches, diodes, thyristors, and the like). In other embodiments, such as those where weight and cost is a significant factor, converter 202 can be configured to perform the conversions with only power switches, power diodes, or other semiconductor devices and without a transformer.

Energy source 206 is preferably a robust energy storage device capable of outputting direct current and having an energy density suitable for energy storage applications for electrically powered devices. The fuel cell can be a single fuel cell, multiple fuel cells connected in series or parallel, or a fuel cell module. Two or more energy sources can be included in each module, and the two or more sources can include two batteries of the same or different type, two capacitors of the same or different type, two fuel cells of the same or different type, one or more batteries combined with one or more capacitors and/or fuel cells, and one or more capacitors combined with one or more fuel cells.

Figure 4A:
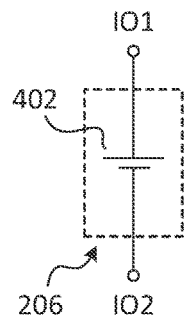
FIGS. 4A-4F are schematic views depicting example embodiments of energy sources.
Figure 4B:
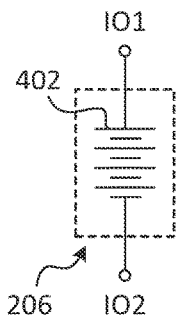
Figure 4C:
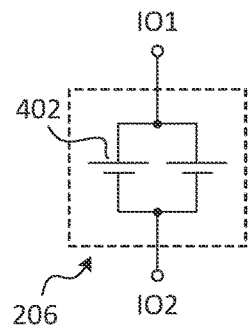
Figure 4D:
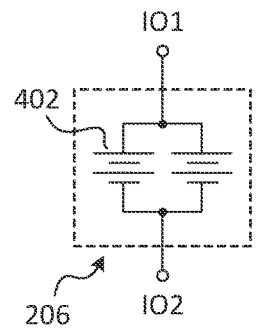

Energy source 206 can be an electrochemical battery, such as a single battery cell or multiple battery cells connected together in a battery module or array, or any combination thereof. FIGS. 4A-4D are schematic diagrams depicting example embodiments of energy source 206 configured as a single battery cell 402 (FIG. 4A), a battery module with a series connection of multiple (e.g., four) cells 402 (FIG. 4B), a battery module with a parallel connection of single cells 402 (FIG. 4C), and a battery module with a parallel connection with legs having multiple (e.g., two) cells 402 each (FIG. 4D). Examples of battery types are described elsewhere herein.

Energy source 206 can also be a high energy density (HED) capacitor, such as an ultracapacitor or supercapacitor. An HED capacitor can be configured as a double layer capacitor (electrostatic charge storage), pseudocapacitor (electrochemical charge storage), hybrid capacitor (electrostatic and electrochemical), or otherwise, as opposed to a solid dielectric type of a typical electrolytic capacitor. The HED capacitor can have an energy density of 10 to 100 times (or higher) that of an electrolytic capacitor, in addition to a higher capacity. For example, HED capacitors can have a specific energy greater than 1.0 watt hours per kilogram (Wh/kg), and a capacitance greater than 10-100 farads (F). As with the batteries described with respect to FIGS. 4A-4D, energy source 206 can be configured as a single HED capacitor or multiple HED capacitors connected together in an array (e.g., series, parallel, or a combination thereof).

Energy source 206 can also be a fuel cell. Examples of fuel cells include proton-exchange membrane fuel cells (PEMFC), phosphoric acid fuel cells (PAFC), solid acid fuel cells, alkaline fuel cells, high temperature fuel cells, solid oxide fuel cells, molten electrolyte fuel cells, and others. As with the batteries described with respect to FIGS. 4A-4D, energy source 206 can be configured as a single fuel cell or multiple fuel cells connected together in an array (e.g., series, parallel, or a combination thereof). The aforementioned examples of batteries, capacitors, and fuel cells are not intended to form an exhaustive list, and those of ordinary skill in the art will recognize other variants that fall within the scope of the present subject matter.

Energy buffer 204 can dampen or filter fluctuations in current across the DC line or link (e.g., $+V_{DCL}$ and $-V_{DCL}$ as described below), to assist in maintaining stability in the DC link voltage. These fluctuations can be relatively low (e.g., kilohertz) or high (e.g., megahertz) frequency fluctuations or harmonics caused by the switching of converter 202, or other transients. These fluctuations can be absorbed by buffer 204 instead of being passed to source 206 or to ports IO3 and IO4 of converter 202.

Power connection 110 is a connection for transferring energy or power to, from and through module 108. Module 108 can output energy from energy source 206 to power connection 110, where it can be transferred to other modules of the system or to a load. Module 108 can also receive energy from other modules 108 or a charging source (DC charger, single phase charger, multi-phase charger). Signals can also be passed through module 108 bypassing energy source 206. The routing of energy or power into and out of module 108 is performed by converter 202 under the control of LCD 114 (or another entity of system 102).

In the embodiment of FIG. 2A, LCD 114 is implemented as a component separate from module 108 (e.g., not within a shared module housing) and is connected to and capable of communication with converter 202 via communication path 116. In the embodiment of FIG. 2B, LCD 114 is included as a component of module 108 and is connected to and capable of communication with converter 202 via internal communication path 118 (e.g., a shared bus or discrete connections). LCD 114 can also be capable of receiving signals from, and transmitting signals to, energy buffer 204 and/or energy source 206 over paths 116 or 118.

Module 108 can also include monitor circuitry 208 configured to monitor (e.g., collect, sense, measure, and/or determine) one or more aspects of module 108 and/or the components thereof, such as voltage, current, temperature or other operating parameters that constitute status information (or can be used to determine status information by, e.g., LCD 114). A main function of the status information is to describe the state of the one or more energy sources 206 of the module 108 to enable determinations as to how much to utilize the energy source in comparison to other sources in system 100, although status information describing the state of other components (e.g., voltage, temperature, and/or presence of a fault in buffer 204, temperature and/or presence of a fault in converter 202, presence of a fault elsewhere in module 108, etc.) can be used in the utilization determination as well. Monitor circuitry 208 can include one or more sensors, shunts, dividers, fault detectors, Coulomb counters, controllers or other hardware and/or software configured to monitor such aspects. Monitor circuitry 208 can be separate from the various components 202, 204, and 206, or can be integrated with each component 202, 204, and 206 (as shown in FIGS. 2A-2B), or any combination thereof. In some embodiments, monitor circuitry 208 can be part of or shared with a Battery Management System (BMS) for a battery energy source 204. Discrete circuitry is not needed to monitor each type of status information, as more than one type of status information can be monitored with a single circuit or device, or otherwise algorithmically determined without the need for additional circuits.

LCD 114 can receive status information (or raw data) about the module components over communication paths 116, 118. LCD 114 can also transmit information to module components over paths 116, 118. Paths 116 and 118 can include diagnostics, measurement, protection, and control signal lines. The transmitted information can be control signals for one or more module components. The control signals can be switch signals for converter 202 and/or one or more signals that request the status information from module components. For example, LCD 114 can cause the status information to be transmitted over paths 116, 118 by requesting the status information directly, or by applying a stimulus (e.g., voltage) to cause the status information to be generated, in some cases in combination with switch signals that place converter 202 in a particular state.

The physical configuration or layout of module 108 can take various forms. In some embodiments, module 108 can include a common housing in which all module components, e.g., converter 202, buffer 204, and source 206, are housed, along with other optional components such as an integrated LCD 114. In other embodiments, the various components can be separated in discrete housings that are secured together. FIG. 2C is a block diagram depicting an example embodiment of a module 108 having a first housing 220 that holds an energy source 206 of the module and accompanying electronics such as monitor circuitry 208 (not shown), a second housing 222 that holds module electronics such as converter 202, energy buffer 204, and other accompany electronics such as monitor circuitry (not shown), and a third housing 224 that holds LCD 114 (not shown) for the module 108. Electrical connections between the various module components can proceed through the housings 220, 222, 224 and can be exposed on any of the housing exteriors for connection with other devices such as other modules 108 or MCD 112.

Modules 108 of system 100 can be physically arranged with respect to each other in various configurations that depend on the needs of the application and the number of loads. For example, in a stationary application where system 100 provides power for a microgrid, modules 108 can be placed in one or more racks or other frameworks. Such configurations may be suitable for larger mobile applications as well, such as maritime vessels. Alternatively, modules 108 can be secured together and located within a common housing, referred to as a pack. A rack or a pack may have its own dedicated cooling system shared across all modules. Pack configurations are useful for smaller mobile applications such as electric cars. System 100 can be implemented with one or more racks (e.g., for parallel supply to a microgrid) or one or more packs (e.g., serving different motors of the vehicle), or combination thereof. FIG. 2D is a block diagram depicting an example embodiment of system 100 configured as a pack with nine modules 108 electrically and physically coupled together within a common housing 230.

Examples of these and further configurations are described in Int'l. Appl. No. PCT/US20/25366, filed Mar. 27, 2020 and titled Module-Based Energy Systems Capable of Cascaded and Interconnected Configurations, and Methods Related Thereto, which is incorporated by reference herein in its entirety for all purposes.

Figure 3A:
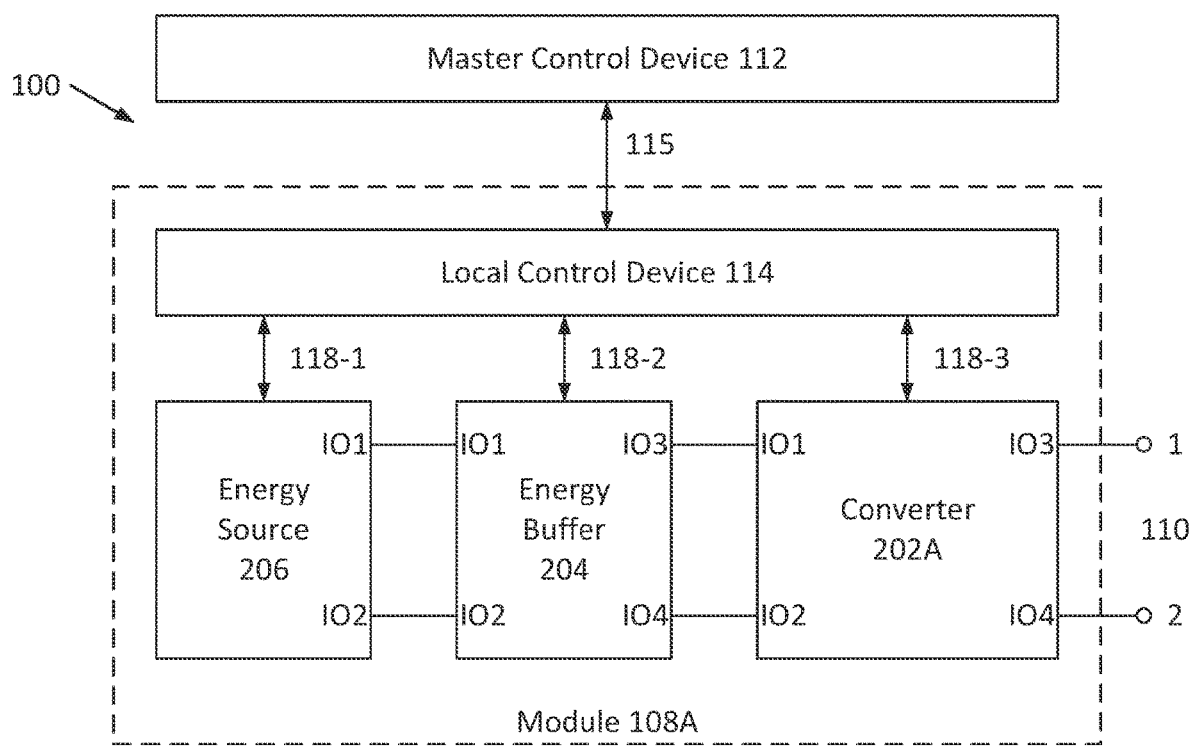
FIGS. 3A-3C are block diagrams depicting example embodiments of modules having various electrical configurations.
Figure 3B:
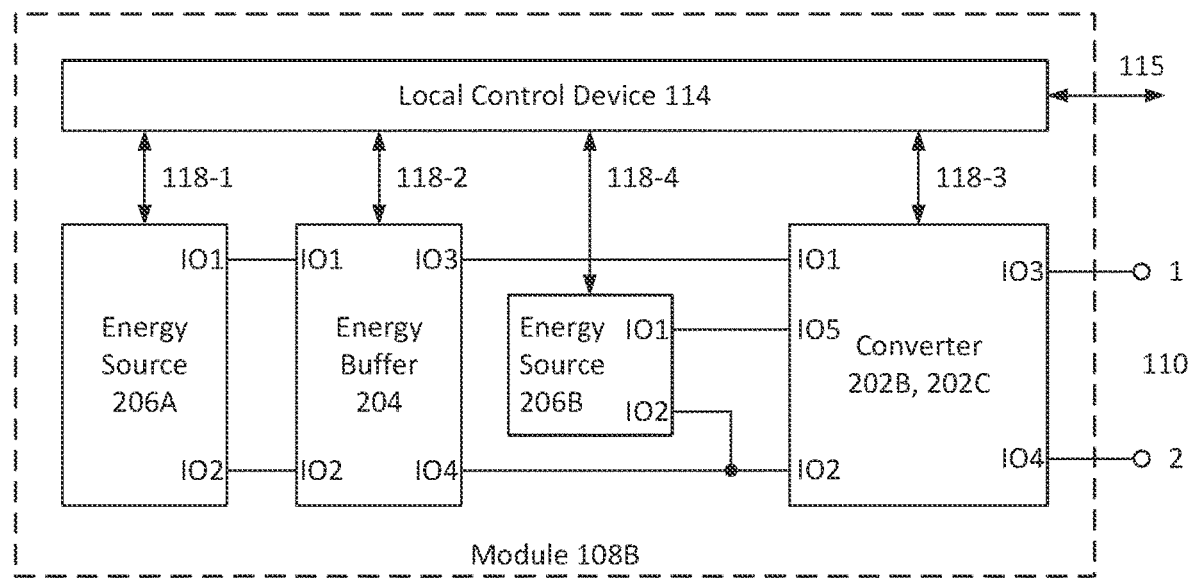
Figure 3C:
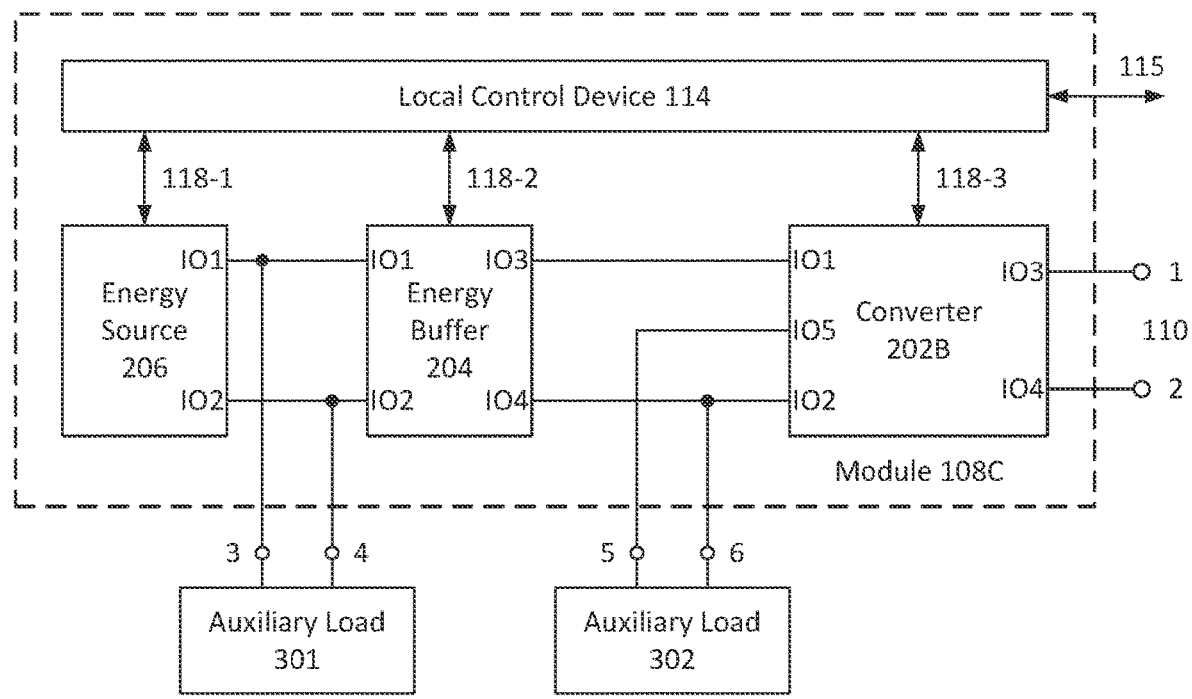

FIGS. 3A-3C are block diagrams depicting example embodiments of modules 108 having various electrical configurations. These embodiments are described as having one LCD 114 per module 108, with the LCD 114 housed within the associated module, but can be configured otherwise as described herein. FIG. 3A depicts a first example configuration of a module 108A within system 100. Module 108A includes energy source 206, energy buffer 204, and converter 202A. Each component has power connection ports (e.g., terminals, connectors) into which power can be input and/or from which power can be output, referred to herein as IO ports. Such ports can also be referred to as input ports or output ports depending on the context.

Figure 5A:
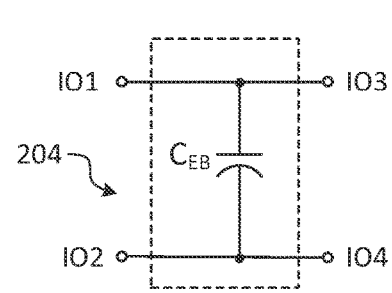
FIGS. 5A-5C are schematic views depicting example embodiments of energy buffers.
Figure 5B:
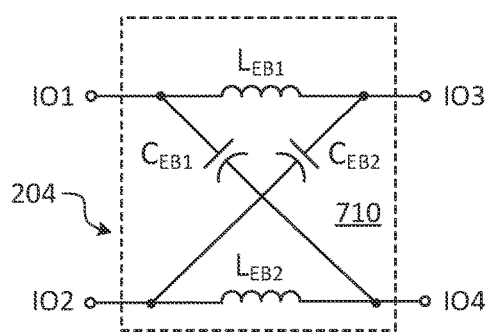
Figure 5C:
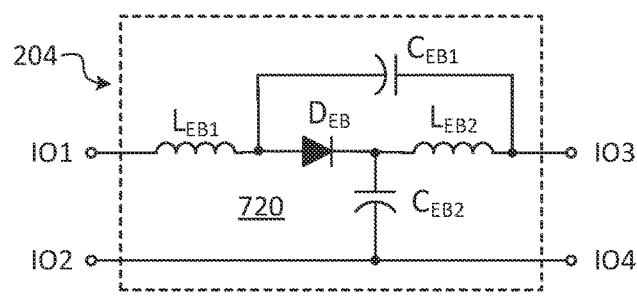

Energy source 206 can be configured as any of the energy source types described herein (e.g., a battery as described with respect to FIGS. 4A-4D, an HED capacitor, a fuel cell, or otherwise). Ports IO1 and IO2 of energy source 206 can be connected to ports IO1 and IO2, respectively, of energy buffer 204. Energy buffer 204 can be configured to buffer or filter high and low frequency energy pulsations arriving at buffer 204 through converter 202, which can otherwise degrade the performance of module 108. The topology and components for buffer 204 are selected to accommodate the maximum permissible amplitude of these high frequency voltage pulsations. Several (non-exhaustive) example embodiments of energy buffer 204 are depicted in the schematic diagrams of FIGS. 5A-5C. In FIG. 5A, buffer 204 is an electrolytic and/or film capacitor $C_{EB}$, in FIG. 5B buffer 204 is a Z-source network 710, formed by two inductors $L_{EB1}$ and $L_{EB2}$ and two electrolytic and/or film capacitors $C_{EB1}$ and $C_{EB2}$, and in FIG. 5C buffer 204 is a quasi Z-source network 720, formed by two inductors $L_{EB1}$ and $L_{EB2}$, two electrolytic and/or film capacitors $C_{EB1}$ and $C_{EB2}$ and a diode $D_{EB}$.

Figure 6A:
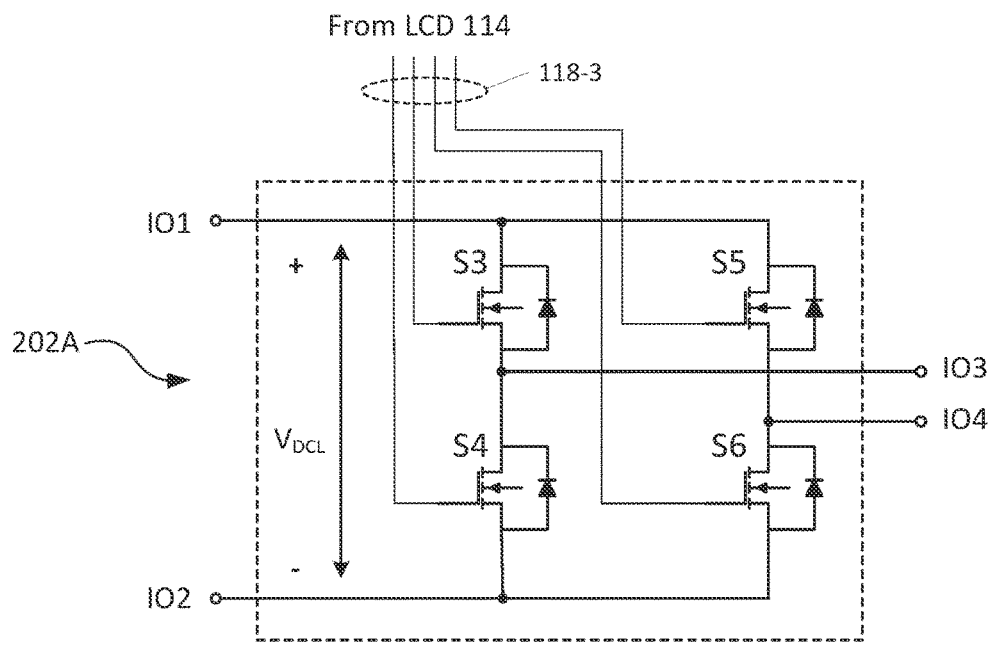
FIGS. 6A-6C are schematic views depicting example embodiments of converters.

Ports IO3 and IO4 of energy buffer 204 can be connected to ports IO1 and IO2, respectively, of converter 202A, which can be configured as any of the power converter types described herein. FIG. 6A is a schematic diagram depicting an example embodiment of converter 202A configured as a DC-AC converter that can receive a DC voltage at ports IO1 and IO2 and switch to generate pulses at ports IO3 and IO4. Converter 202A can include multiple switches, and here converter 202A includes four switches S3, S4, S5, S6 arranged in a full bridge configuration. Control system 102 or LCD 114 can independently control each switch via control input lines 118-3 to each gate.

The switches can be any suitable switch type, such as power semiconductors like the metal-oxide-semiconductor field-effect transistors (MOSFETs) shown here, insulated gate bipolar transistors (IGBTs), or gallium nitride (GaN) transistors. Semiconductor switches can operate at relatively high switching frequencies, thereby permitting converter 202 to be operated in pulse-width modulated (PWM) mode if desired, and to respond to control commands within a relatively short interval of time. This can provide a high tolerance of output voltage regulation and fast dynamic behavior in transient modes.

In this embodiment, a DC line voltage $V_{DCL}$ can be applied to converter 202 between ports IO1 and IO2. By connecting $V_{DCL}$ to ports IO3 and IO4 by different combinations of switches S3, S4, S5, S6, converter 202 can generate three different voltage outputs at ports IO3 and IO4: $+V_{DCL}$, 0, and $-V_{DCL}$. A switch signal provided to each switch controls whether the switch is on (closed) or off (open). To obtain $+V_{DCL}$, switches S3 and S6 are turned on while S4 and S5 are turned off, whereas $-V_{DCL}$ can be obtained by turning on switches S4 and S5 and turning off S3 and S6. The output voltage can be set to zero (including near zero) or a reference voltage by turning on S3 and S5 with S4 and S6 off, or by turning on S4 and S6 with S3 and S5 off. These voltages can be output from module 108 over power connection 110. Ports IO3 and IO4 of converter 202 can be connected to (or form) module IO ports 1 and 2 of power connection 110, so as to generate the output voltage for use with output voltages from other modules 108.

The control or switch signals for the embodiments of converter 202 described herein can be generated in different ways depending on the control technique utilized by system 100 to generate the output voltage of converter 202. In some embodiments, the control technique is a PWM technique such as space vector pulse-width modulation (SVPWM) or sinusoidal pulse-width modulation (SPWM), or variations thereof. FIG. 8A is a graph of voltage versus time depicting an example of an output voltage waveform 802 of converter 202. For ease of description, the embodiments herein will be described in the context of a PWM control technique, although the embodiments are not limited to such. Other classes of techniques can be used. One alternative class is based on hysteresis, examples of which are described in Int'l Publ. Nos. WO 2018/231810A1, WO 2018/232403A1, and WO 2019/183553A1, which are incorporated by reference herein for all purposes.

Each module 108 can be configured with multiple energy sources 206 (e.g., two, three, four, or more). Each energy source 206 of module 108 can be controllable (switchable) to supply power to connection 110 (or receive power from a charge source) independent of the other sources 206 of the module. For example, all sources 206 can output power to connection 110 (or be charged) at the same time, or only one (or a subset) of sources 206 can supply power (or be charged) at any one time. In some embodiments, the sources 206 of the module can exchange energy between them, e.g., one source 206 can charge another source 206. Each of the sources 206 can be configured as any energy source described herein (e.g., battery, HED capacitor, fuel cell). Each of the sources 206 can be the same type (e.g., each can be a battery), or a different type (e.g., a first source can be a battery and a second source can be an HED capacitor, or a first source can be a battery having a first type (e.g., NMC) and a second source can be a battery having a second type (e.g., LFP).

FIG. 3B is a block diagram depicting an example embodiment of a module 108B in a dual energy source configuration with a primary energy source 206A and secondary energy source 206B. Ports IO1 and IO2 of primary source 202A can be connected to ports IO1 and IO2 of energy buffer 204. Module 108B includes a converter 202B having an additional IO port. Ports IO3 and IO4 of buffer 204 can be connected ports IO1 and IO2, respectively, of converter 202B. Ports IO1 and IO2 of secondary source 206B can be connected to ports IO5 and IO2, respectively, of converter 202B (also connected to port IO4 of buffer 204).

In this example embodiment of module 108B, primary energy source 202A, along with the other modules 108 of system 100, supplies the average power needed by the load. Secondary source 202B can serve the function of assisting energy source 202 by providing additional power at load power peaks, or absorbing excess power, or otherwise.

Figure 4E:
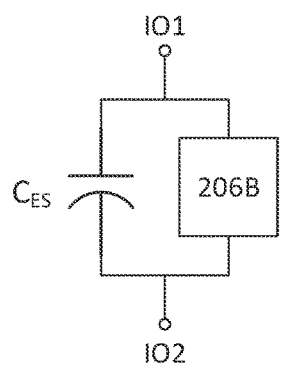
Figure 4F:
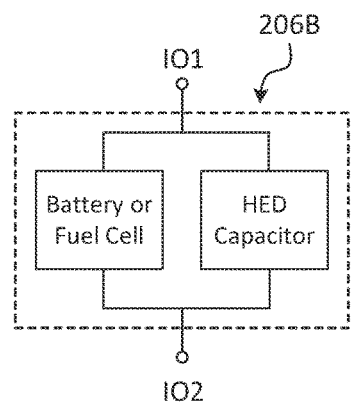

As mentioned both primary source 206A and secondary source 206B can be utilized simultaneously or at separate times depending on the switch state of converter 202B. If at the same time, an electrolytic and/or a film capacitor ($C_{ES}$) can be placed in parallel with source 206B as depicted in FIG. 4E to act as an energy buffer for the source 206B, or energy source 206B can be configured to utilize an HED capacitor in parallel with another energy source (e.g., a battery or fuel cell) as depicted in FIG. 4F.

Figure 6B:
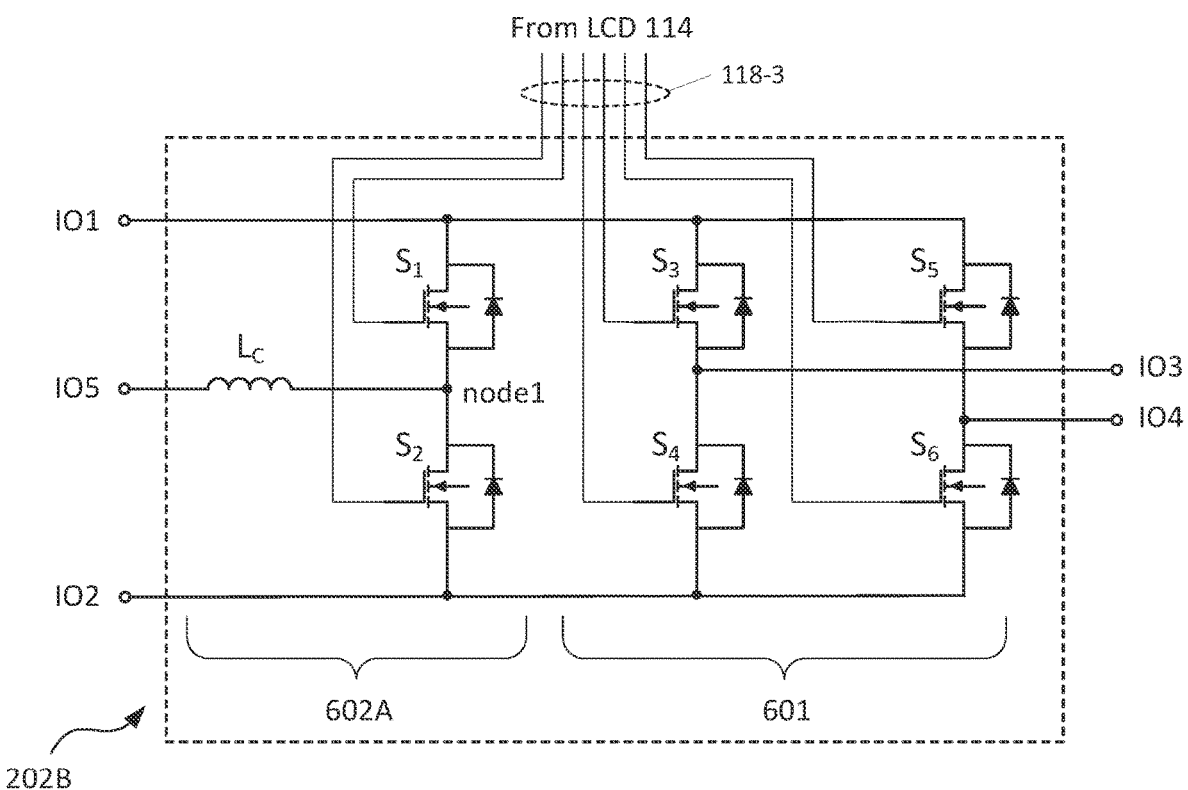
Figure 6C:
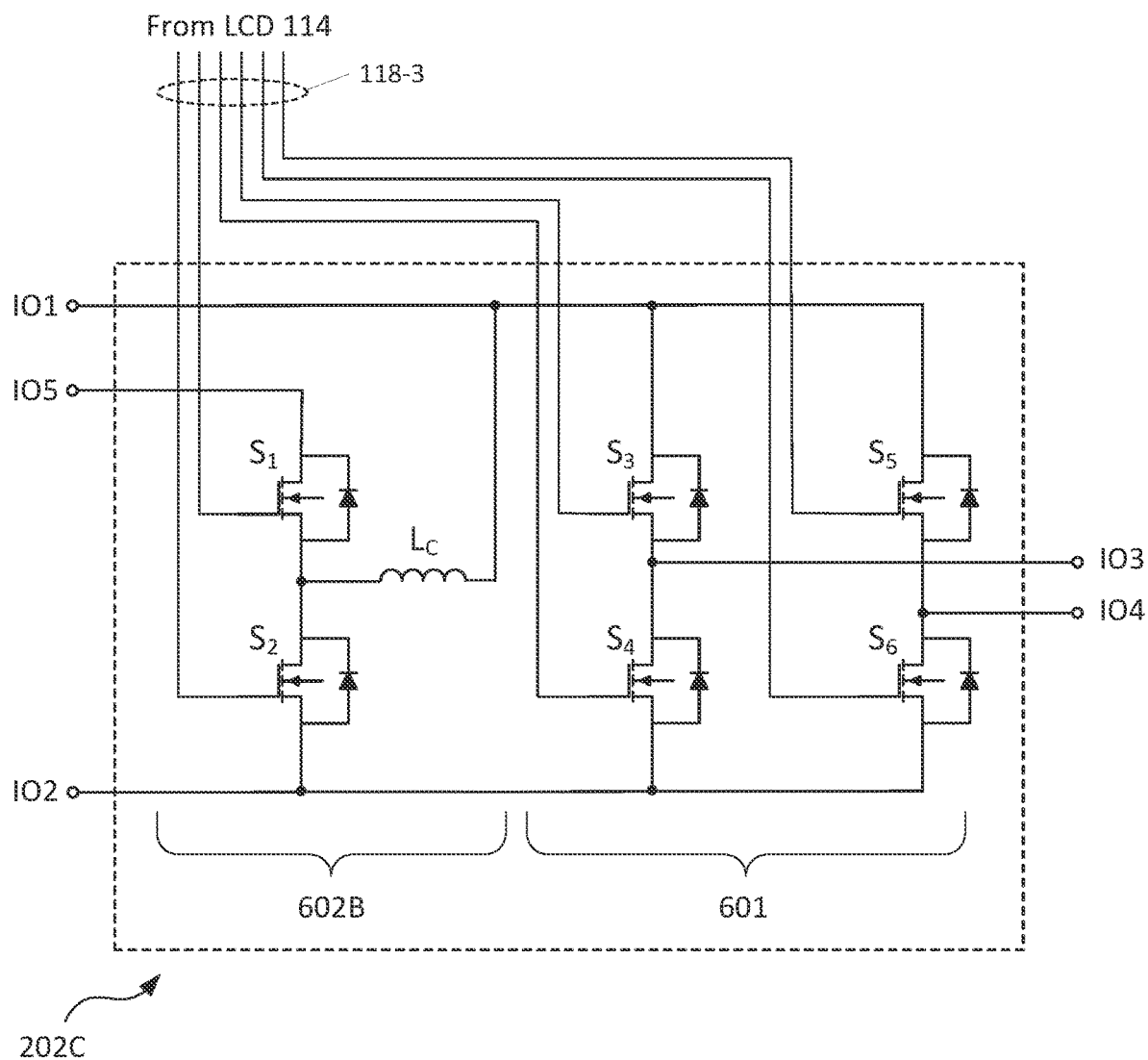

FIGS. 6B and 6C are schematic views depicting example embodiments of converters 202B and 202C, respectively. Converter 202B includes switch circuitry portions 601 and 602A. Portion 601 includes switches S3 through S6 configured as a full bridge in similar manner to converter 202A, and is configured to selectively couple IO1 and IO2 to either of IO3 and IO4, thereby changing the output voltages of module 108B. Portion 602A includes switches S1 and S2 configured as a half bridge and coupled between ports IO1 and IO2. A coupling inductor $L_C$ is connected between port IO5 and a node1 present between switches S1 and S2 such that switch portion 602A is a bidirectional converter that can regulate (boost or buck) voltage (or inversely current). Switch portion 602A can generate two different voltages at node1, which are $+V_{DCL2}$ and 0, referenced to port IO2, which can be at virtual zero potential. The current drawn from or input to energy source 202B can be controlled by regulating the voltage on coupling inductor $L_C$, using, for example, a pulse-width modulation technique or a hysteresis control method for commutating switches S1 and S2. Other techniques can also be used.

Converter 202C differs from that of 202B as switch portion 602B includes switches S1 and S2 configured as a half bridge and coupled between ports IO5 and IO2. A coupling inductor $L_C$ is connected between port IO1 and a node1 present between switches S1 and S2 such that switch portion 602B is configured to regulate voltage.

Control system 102 or LCD 114 can independently control each switch of converters 202B and 202C via control input lines 118-3 to each gate. In these embodiments and that of FIG. 6A, LCD 114 (not MCD 112) generates the switching signals for the converter switches. Alternatively, MCD 112 can generate the switching signals, which can be communicated directly to the switches, or relayed by LCD 114.

In embodiments where a module 108 includes three or more energy sources 206, converters 202B and 202C can be scaled accordingly such that each additional energy source 206B is coupled to an additional IO port leading to an additional switch circuitry portion 602A or 602B, depending on the needs of the particular source. For example a dual source converter 202 can include both switch portions 202A and 202B.

Modules 108 with multiple energy sources 206 are capable of performing additional functions such as energy sharing between sources 206, energy capture from within the application (e.g., regenerative braking), charging of the primary source by the secondary source even while the overall system is in a state of discharge, and active filtering of the module output. The active filtering function can also be performed by modules having a typical electrolytic capacitor instead of a secondary energy source. Examples of these functions are described in more detail in Int'l. Appl. No. PCT/US20/25366, filed Mar. 27, 2020 and titled Module-Based Energy Systems Capable of Cascaded and Interconnected Configurations, and Methods Related Thereto, and Int'l. Publ. No. WO 2019/183553, filed Mar. 22, 2019, and titled Systems and Methods for Power Management and Control, both of which are incorporated by reference herein in their entireties for all purposes.

Each module 108 can be configured to supply one or more auxiliary loads with its one or more energy sources 206. Auxiliary loads are loads that require lower voltages than the primary load 101. Examples of auxiliary loads can be, for example, an on-board electrical network of an electric vehicle, or an HVAC system of an electric vehicle. The load of system 100 can be, for example, one of the phases of the electric vehicle motor or electrical grid. This embodiment can allow a complete decoupling between the electrical characteristics (terminal voltage and current) of the energy source and those of the loads.

FIG. 3C is a block diagram depicting an example embodiment of a module 108C configured to supply power to a first auxiliary load 301 and a second auxiliary load 302, where module 108C includes an energy source 206, energy buffer 204, and converter 202B coupled together in a manner similar to that of FIG. 3B. First auxiliary load 301 requires a voltage equivalent to that supplied from source 206. Load 301 is coupled to IO ports 3 and 4 of module 108C, which are in turn coupled to ports IO and IO2 of source 206. Source 206 can output power to both power connection 110 and load 301. Second auxiliary load 302 requires a constant voltage lower than that of source 206. Load 302 is coupled to IO ports 5 and 6 of module 108C, which are coupled to ports IO5 and IO2, respectively, of converter 202B. Converter 202B can include switch portion 602 having coupling inductor $L_C$ coupled to port IO5 (FIG. 6B). Energy supplied by source 206 can be supplied to load 302 through switch portion 602 of converter 202B. It is assumed that load 302 has an input capacitor (a capacitor can be added to module 108C if not), so switches S1 and S2 can be commutated to regulate the voltage on and current through coupling inductor $L_C$ and thus produce a stable constant voltage for load 302. This regulation can step down the voltage of source 206 to the lower magnitude voltage is required by load 302.

Module 108C can thus be configured to supply one or more first auxiliary loads in the manner described with respect to load 301, with the one or more first loads coupled to IO ports 3 and 4. Module 108C can also be configured to supply one or more second auxiliary loads in the manner described with respect to load 302. If multiple second auxiliary loads 302 are present, then for each additional load 302 module 108C can be scaled with additional dedicated module output ports (like 5 and 6), an additional dedicated switch portion 602, and an additional converter IO port coupled to the additional portion 602.

Energy source 206 can thus supply power for any number of auxiliary loads (e.g., 301 and 302), as well as the corresponding portion of system output power needed by primary load 101. Power flow from source 206 to the various loads can be adjusted as desired.

Module 108 can be configured as needed with two or more energy sources 206 (FIG. 3B) and to supply first and/or second auxiliary loads (FIG. 3C) through the addition of a switch portion 602 and converter port IO5 for each additional source 206B or second auxiliary load 302. Additional module IO ports (e.g., 3, 4, 5, 6) can be added as needed. Module 108 can also be configured as an interconnection module to exchange energy (e.g., for balancing) between two or more arrays, two or more packs, or two or more systems 100 as described further herein. This interconnection functionality can likewise be combined with multiple source and/or multiple auxiliary load supply capabilities.

Control system 102 can perform various functions with respect to the components of modules 108A, 108B, and 108C. These functions can include management of the utilization (amount of use) of each energy source 206, protection of energy buffer 204 from over-current, over-voltage and high temperature conditions, and control and protection of converter 202.

For example, to manage (e.g., adjust by increasing, decreasing, or maintaining) utilization of each energy source 206, LCD 114 can receive one or more monitored voltages, temperatures, and currents from each energy source 206 (or monitor circuitry). The monitored voltages can be at least one of, preferably all, voltages of each elementary component independent of the other components (e.g., each individual battery cell, HED capacitor, and/or fuel cell) of the source 206, or the voltages of groups of elementary components as a whole (e.g., voltage of the battery array, HED capacitor array, and/or fuel cell array). Similarly the monitored temperatures and currents can be at least one of, preferably all, temperatures and currents of each elementary component independent of the other components of the source 206, or the temperatures and currents of groups of elementary components as a whole, or any combination thereof. The monitored signals can be status information, with which LCD 114 can perform one or more of the following: calculation or determination of a real capacity, actual State of Charge (SOC) and/or State of Health (SOH) of the elementary components or groups of elementary components; set or output a warning or alarm indication based on monitored and/or calculated status information; and/or transmission of the status information to MCD 112. LCD 114 can receive control information (e.g., a modulation index, synchronization signal) from MCD 112 and use this control information to generate switch signals for converter 202 that manage the utilization of the source 206.

To protect energy buffer 204, LCD 114 can receive one or more monitored voltages, temperatures, and currents from energy buffer 204 (or monitor circuitry). The monitored voltages can be at least one of, preferably all, voltages of each elementary component of buffer 204 (e.g., of $C_{EB}$, $C_{EB1}$, $C_{EB2}$, $L_{EB1}$, $L_{EB2}$, $D_{EB}$) independent of the other components, or the voltages of groups of elementary components or buffer 204 as a whole (e.g., between IO1 and IO2 or between IO3 and IO4). Similarly the monitored temperatures and currents can be at least one of, preferably all, temperatures and currents of each elementary component of buffer 204 independent of the other components, or the temperatures and currents of groups of elementary components or of buffer 204 as a whole, or any combination thereof. The monitored signals can be status information, with which LCD 114 can perform one or more of the following: set or output a warning or alarm indication; communicate the status information to MCD 112; or control converter 202 to adjust (increase or decrease) the utilization of source 206 and module 108 as a whole for buffer protection.

To control and protect converter 202, LCD 114 can receive the control information from MCD 112 (e.g., a modulated reference signal, or a reference signal and a modulation index), which can be used with a PWM technique in LCD 114 to generate the control signals for each switch (e.g., S1 through S6). LCD 114 can receive a current feedback signal from a current sensor of converter 202, which can be used for overcurrent protection together with one or more fault status signals from driver circuits (not shown) of the converter switches, which can carry information about fault statuses (e.g., short circuit or open circuit failure modes) of all switches of converter 202. Based on this data, LCD 114 can make a decision on which combination of switching signals to be applied to manage utilization of module 108, and potentially bypass or disconnect converter 202 (and the entire module 108) from system 100.

If controlling a module 108C that supplies a second auxiliary load 302, LCD 114 can receive one or more monitored voltages (e.g., the voltage between IO ports 5 and 6) and one or more monitored currents (e.g., the current in coupling inductor $L_C$, which is a current of load 302) in module 108C. Based on these signals, LCD 114 can adjust the switching cycles (e.g., by adjustment of modulation index or reference waveform) of S1 and S2 to control (and stabilize) the voltage for load 302.

Examples of Cascaded Energy System Topologies

Figures 7A, 7B, 7C:
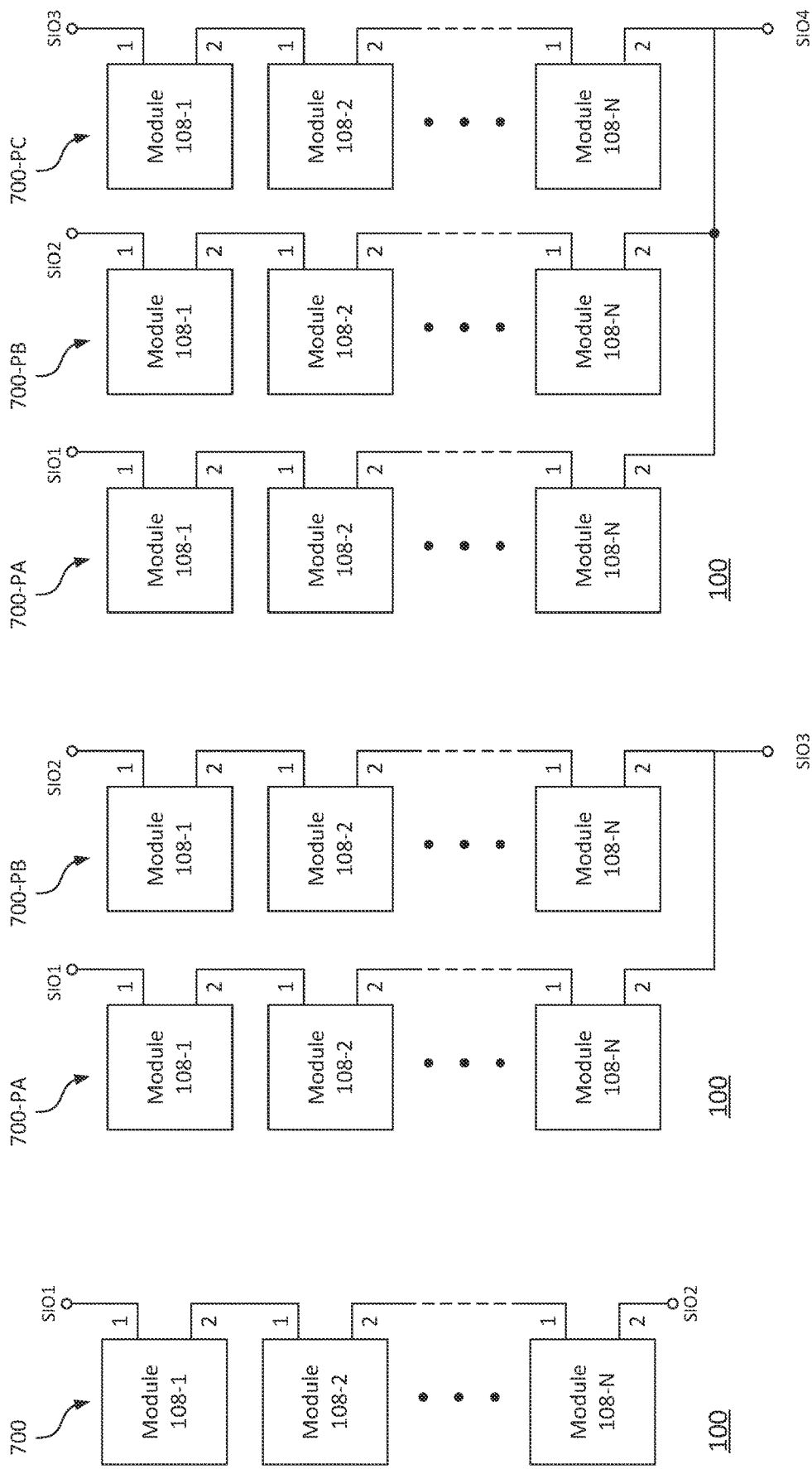

Two or more modules 108 can be coupled together in a cascaded array that outputs a voltage signal formed by a superposition of the discrete voltages generated by each module 108 within the array. FIG. 7A is a block diagram depicting an example embodiment of a topology for system 100 where N modules 108-1, 108-2 . . . 108-N are coupled together in series to form a serial array 700. In this and all embodiments described herein, N can be any integer greater than one. Array 700 includes a first system IO port SIO1 and a second system IO port SIO2 across which is generated an array output voltage. Array 700 can be used as a DC or single phase AC energy source for DC or AC single-phase loads, which can be connected to SIO1 and SIO2 of array 700. FIG. 8A is a plot of voltage versus time depicting an example output signal produced by a single module 108 having a 48 volt energy source. FIG. 8B is a plot of voltage versus time depicting an example single phase AC output signal generated by array 700 having six 48V modules 108 coupled in series.

System 100 can be arranged in a broad variety of different topologies to meet varying needs of the applications. System 100 can provide multi-phase power (e.g., two-phase, three-phase, four-phase, five-phase, six-phase, etc.) to a load by use of multiple arrays 700, where each array can generate an AC output signal having a different phase angle.

FIG. 7B is a block diagram depicting system 100 with two arrays 700-PA and 700-PB coupled together. Each array 700 is one-dimensional, formed by a series connection of N modules 108. The two arrays 700-PA and 700-PB can each generate a single-phase AC signal, where the two AC signals have different phase angles PA and PB (e.g., 180 degrees apart). IO port 1 of module 108-1 of each array 700-PA and 700-PB can form or be connected to system IO ports SIO1 and SIO2, respectively, which in turn can serve as a first output of each array that can provide two phase power to a load (not shown). Or alternatively ports SIO1 and SIO2 can be connected to provide single phase power from two parallel arrays. IO port 2 of module 108-N of each array 700-PA and 700-PB can serve as a second output for each array 700-PA and 700-PB on the opposite end of the array from system IO ports SIO1 and SIO2, and can be coupled together at a common node and optionally used for an additional system IO port SIO3 if desired, which can serve as a neutral. This common node can be referred to as a rail, and IO port 2 of modules 108-N of each array 700 can be referred to as being on the rail side of the arrays.

FIG. 7C is a block diagram depicting system 100 with three arrays 700-PA, 700-PB, and 700-PC coupled together. Each array 700 is one-dimensional, formed by a series connection of N modules 108. The three arrays 700-1 and 700-2 can each generate a single-phase AC signal, where the three AC signals have different phase angles PA, PB, PC (e.g., 120 degrees apart). IO port 1 of module 108-1 of each array 700-PA, 700-PB, and 700-PC can form or be connected to system IO ports SIO1, SIO2, and SIO3, respectively, which in turn can provide three phase power to a load (not shown). IO port 2 of module 108-N of each array 700-PA, 700-PB, and 700-PC can be coupled together at a common node and optionally used for an additional system IO port SIO4 if desired, which can serve as a neutral.

The concepts described with respect to the two-phase and three-phase embodiments of FIGS. 7B and 7C can be extended to systems 100 generating still more phases of power. For example, a non-exhaustive list of additional examples includes: system 100 having four arrays 700, each of which is configured to generate a single phase AC signal having a different phase angle (e.g., 90 degrees apart); system 100 having five arrays 700, each of which is configured to generate a single phase AC signal having a different phase angle (e.g., 72 degrees apart); and system 100 having six arrays 700, each array configured to generate a single phase AC signal having a different phase angle (e.g., 60 degrees apart).

System 100 can be configured such that arrays 700 are interconnected at electrical nodes between modules 108 within each array. FIG. 7D is a block diagram depicting system 100 with three arrays 700-PA, 700-PB, and 700-PC coupled together in a combined series and delta arrangement. Each array 700 includes a first series connection of M modules 108, where M is two or greater, coupled with a second series connection of N modules 108, where N is two or greater. The delta configuration is formed by the interconnections between arrays, which can be placed in any desired location. In this embodiment, IO port 2 of module 108-(M+N) of array 700-PC is coupled with IO port 2 of module 108-M and IO port 1 of module 108-(M+1) of array 700-PA, IO port 2 of module 108-(M+N) of array 700-PB is coupled with IO port 2 of module 108-M and IO port 1 of module 108-(M+1) of array 700-PC, and IO port 2 of module 108-(M+N) of array 700-PA is coupled with IO port 2 of module 108-M and IO port 1 of module 108-(M+1) of array 700-PB.

FIG. 7E is a block diagram depicting system 100 with three arrays 700-PA, 700-PB, and 700-PC coupled together in a combined series and delta arrangement. This embodiment is similar to that of FIG. 7D except with different cross connections. In this embodiment, IO port 2 of module 108-M of array 700-PC is coupled with IO port 1 of module 108-1 of array 700-PA, IO port 2 of module 108-M of array 700-PB is coupled with IO port 1 of module 108-1 of array 700-PC, and IO port 2 of module 108-M of array 700-PA is coupled with IO port 1 of module 108-1 of array 700-PB. The arrangements of FIGS. 7D and 7E can be implemented with as little as two modules in each array 700. Combined delta and series configurations enable an effective exchange of energy between all modules 108 of the system (interphase balancing) and phases of power grid or load, and also allows reducing the total number of modules 108 in an array 700 to obtain the desired output voltages.

In the embodiments described herein, although it is advantageous for the number of modules 108 to be the same in each array 700 within system 100, such is not required and different arrays 700 can have differing numbers of modules 108. Further, each array 700 can have modules 108 that are all of the same configuration (e.g., all modules are 108A, all modules are 108B, all modules are 108C, or others) or different configurations (e.g., one or more modules are 108A, one or more are 108B, and one or more are 108C, or otherwise). As such, the scope of topologies of system 100 covered herein is broad.

Example Embodiments of Control Methodologies

As mentioned, control of system 100 can be performed according to various methodologies, such as hysteresis or PWM. Several examples of PWM include space vector modulation and sine pulse width modulation, where the switching signals for converter 202 are generated with a phase shifted carrier technique that continuously rotates utilization of each module 108 to equally distribute power among them.

Figure 8C:
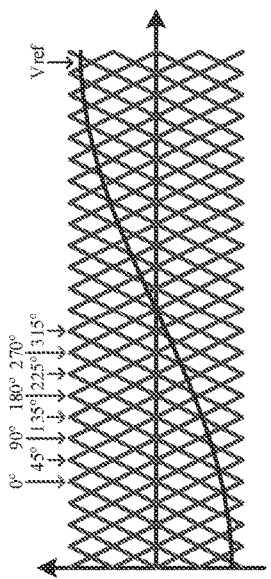
FIG. 8C is a plot depicting an example reference signal and carrier signals usable in a pulse width modulation control technique.
Figure 8D:
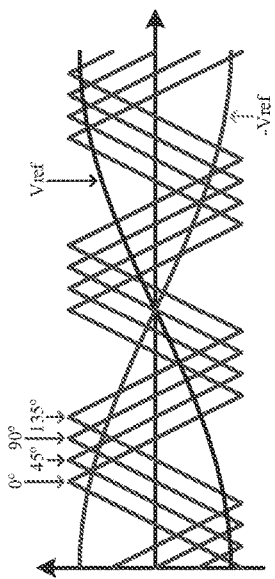
FIG. 8D is a plot depicting example reference signals and carrier signals usable in a pulse width modulation control technique.
Figure 8E:
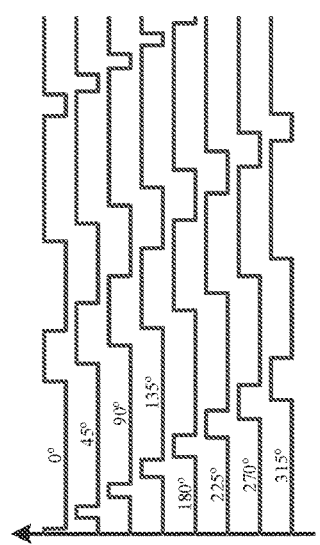
FIG. 8E is a plot depicting example switch signals generated according to a pulse width modulation control technique.
Figure 8F:
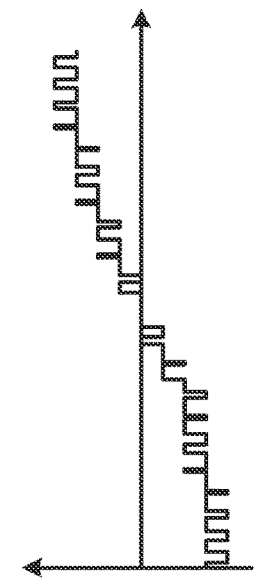
FIG. 8F as a plot depicting an example multilevel output voltage generated by superposition of output voltages from an array of modules under a pulse width modulation control technique.
Figure 8A:
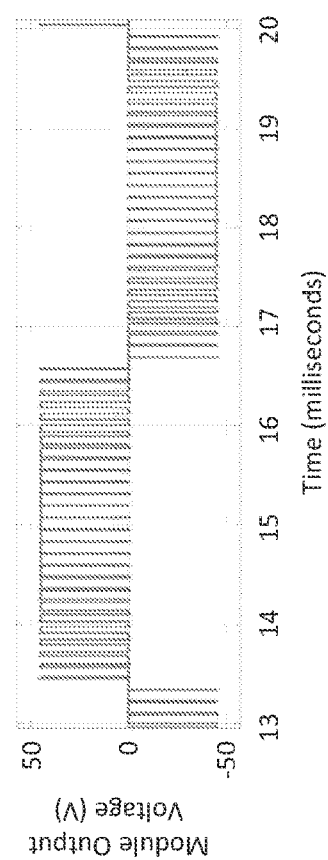
FIG. 8A is a plot depicting an example output voltage of a module.
Figure 8B:
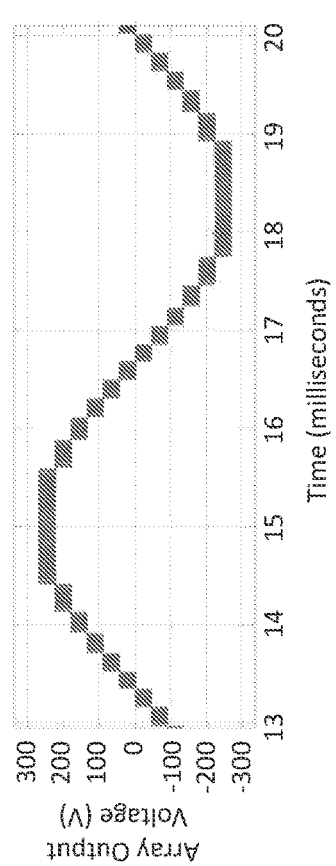
FIG. 8B is a plot depicting an example multilevel output voltage of an array of modules.

FIGS. 8C-8F are plots depicting an example embodiment of a phase-shifted PWM control methodology that can generate a multilevel output PWM waveform using incrementally shifted two-level waveforms. An X-level PWM waveform can be created by the summation of (X−1)/2 two-level PWM waveforms. These two-level waveforms can be generated by comparing a reference waveform Vref to carriers incrementally shifted by 360°/(X−1). The carriers are triangular, but the embodiments are not limited to such. A nine-level example is shown in FIG. 8C (using four modules 108). The carriers are incrementally shifted by 360°/(9−1)=45° and compared to Vref. The resulting two-level PWM waveforms are shown in FIG. 8E. These two-level waveforms may be used as the switching signals for semiconductor switches (e.g., S1 though S6) of converters 202. As an example with reference to FIG. 8E, for a one-dimensional array 700 including four modules 108 each with a converter 202, the 0° signal is for control of S3 and the 180° signal for S6 of the first module 108-1, the 45° signal is for S3 and the 225° signal for S6 of the second module 108-2, the 90 signal is for S3 and the 270 signal is for S6 of the third module 108-3, and the 135 signal is for S3 and the 315 signal is for S6 of the fourth module 108-4. The signal for S3 is complementary to S4 and the signal for S5 is complementary to S6 with sufficient dead-time to avoid shoot through of each half-bridge. FIG. 8F depicts an example single phase AC waveform produced by superposition (summation) of output voltages from the four modules 108.

An alternative is to utilize both a positive and a negative reference signal with the first (N−1)/2 carriers. A nine-level example is shown in FIG. 8D. In this example, the 0° to 135° switching signals (FIG. 8E) are generated by comparing +Vref to the 0° to 135° carriers of FIG. 8D and the 180° to 315° switching signals are generated by comparing −Vref to the 0° to 135° carriers of FIG. 8D. However, the logic of the comparison in the latter case is reversed. Other techniques such as a state machine decoder may also be used to generate gate signals for the switches of converter 202.

In multi-phase system embodiments, the same carriers can be used for each phase, or the set of carriers can be shifted as a whole for each phase. For example, in a three phase system with a single reference voltage (Vref), each array 700 can use the same number of carriers with the same relative offsets as shown in FIGS. 8C and 8D, but the carriers of the second phase are shift by 120 degrees as compared to the carriers of the first phase, and the carriers of the third phase are shifted by 240 degrees as compared to the carriers of the first phase. If a different reference voltage is available for each phase, then the phase information can be carried in the reference voltage and the same carriers can be used for each phase. In many cases the carrier frequencies will be fixed, but in some example embodiments, the carrier frequencies can be adjusted, which can help to reduce losses in EV motors under high current conditions.

The appropriate switching signals can be provided to each module by control system 102. For example, MCD 112 can provide Vref and the appropriate carrier signals to each LCD 114 depending upon the module or modules 108 that LCD 114 controls, and the LCD 114 can then generate the switching signals. Or all LCDs 114 in an array can be provided with all carrier signals and the LCD can select the appropriate carrier signals.

The relative utilizations of each module 108 can adjusted based on status information to perform balancing or of one or more parameters as described herein. Balancing of parameters can involve adjusting utilization to minimize parameter divergence over time as compared to a system where individual module utilization adjustment is not performed. The utilization can be the relative amount of time a module 108 is discharging when system 100 is in a discharge state, or the relative amount of time a module 108 is charging when system 100 is in a charge state.

As described herein, modules 108 can be balanced with respect to other modules in an array 700, which can be referred to as intra array or intraphase balancing, and different arrays 700 can be balanced with respect to each other, which can be referred to as interarray or interphase balancing. Arrays 700 of different subsystems can also be balanced with respect to each other. Control system 102 can simultaneously perform any combination of intraphase balancing, interphase balancing, utilization of multiple energy sources within a module, active filtering, and auxiliary load supply.

Figure 9A:
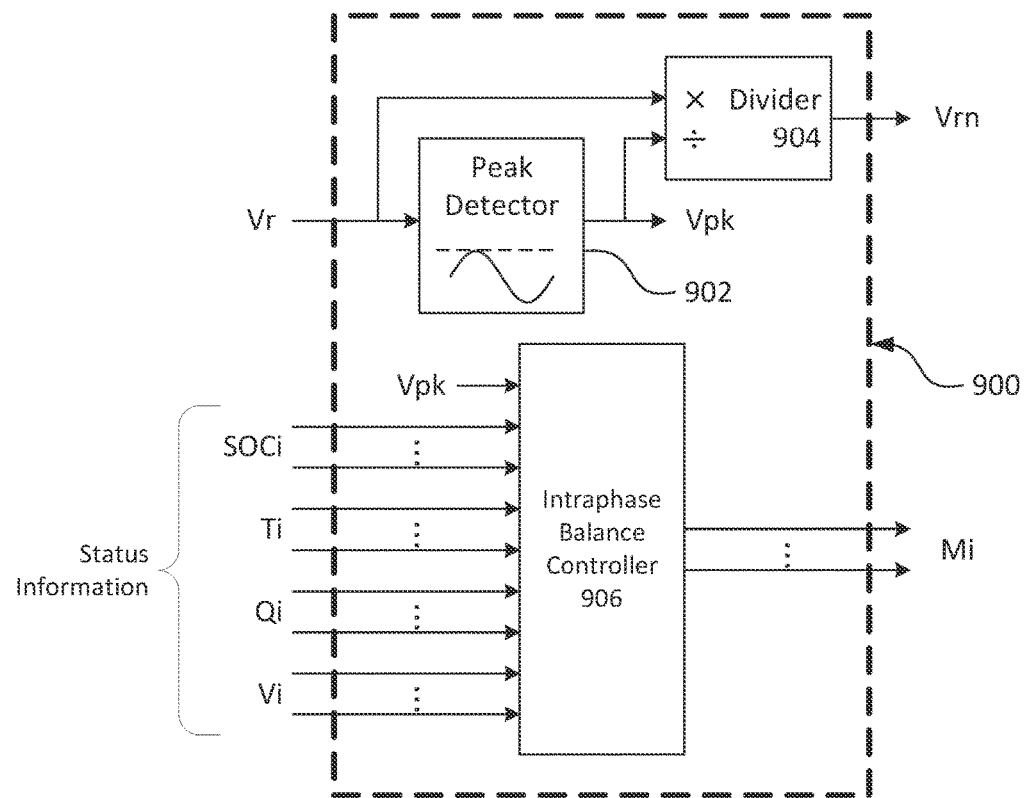
FIGS. 9A-9B are block diagrams depicting example embodiments of controllers for a modular energy system.

FIG. 9A is a block diagram depicting an example embodiment of an array controller 900 of control system 102 for a single-phase AC or DC array. Array controller 900 can include a peak detector 902, a divider 904, and an intraphase (or intra array) balance controller 906. Array controller 900 can receive a reference voltage waveform (Vr) and status information about each of the N modules 108 in the array (e.g., state of charge (SOCi), temperature (Ti), capacity (Qi), and voltage (Vi)) as inputs, and generate a normalized reference voltage waveform (Vrn) and modulation indexes (Mi) as outputs. Peak detector 902 detects the peak (Vpk) of Vr, which can be specific to the phase that controller 900 is operating with and/or balancing. Divider 904 generates Vrn by dividing Vr by its detected Vpk. Intraphase balance controller 906 uses Vpk along with the status information (e.g., SOCi, Ti, Qi, Vi, etc.) to generate modulation indexes Mi for each module 108 within the array 700 being controlled.

The modulation indexes and Vrn can be used to generate the switching signals for each converter 202. The modulation index can be a number between zero and one (inclusive of zero and one). For a particular module 108, the normalized reference Vrn can be modulated or scaled by Mi, and this modulated reference signal (Vrnm) can be used as Vref (or −Vref) according to the PWM technique described with respect to FIGS. 8C-8F, or according to other techniques. In this manner, the modulation index can be used to control the PWM switching signals provided to the converter switching circuitry (e.g., S3-S6 or S1-S6), and thus regulate the operation of each module 108. For example, a module 108 being controlled to maintain normal or full operation may receive an Mi of one, while a module 108 being controlled to less than normal or full operation may receive an Mi less than one, and a module 108 controlled to cease power output may receive an Mi of zero. This operation can be performed in various ways by control system 102, such as by MCD 112 outputting Vrn and Mi to the appropriate LCDs 114 for modulation and switch signal generation, by MCD 112 performing modulation and outputting the modulated Vrnm to the appropriate LCDs 114 for switch signal generation, or by MCD 112 performing modulation and switch signal generation and outputting the switch signals to the LCDs or the converters 202 of each module 108 directly. Vrn can be sent continually with Mi sent at regular intervals, such as once for every period of the Vrn, or one per minute, etc.

Controller 906 can generate an Mi for each module 108 using any type or combination of types of status information (e.g., SOC, temperature (T), Q, SOH, voltage, current) described herein. For example, when using SOC and T, a module 108 can have a relatively high Mi if SOC is relatively high and temperature is relatively low as compared to other modules 108 in array 700. If either SOC is relatively low or T is relatively high, then that module 108 can have a relatively low Mi, resulting in less utilization than other modules 108 in array 700. Controller 906 can determine Mi such that the sum of module voltages does not exceed Vpk. For example, Vpk can be the sum of the products of the voltage of each module's source 206 and Mi for that module (e.g., $Vpk=M_1V_1+M_2V_2+M_3V_3 \ldots +M_NV_N$, etc). A different combination of modulation indexes, and thus respective voltage contributions by the modules, may be used but the total generated voltage should remain the same.

Controller 900 can control operation, to the extent it does not prevent achieving the power output requirements of the system at any one time (e.g., such as during maximum acceleration of an EV), such that SOC of the energy source(s) in each module 108 remains balanced or converges to a balanced condition if they are unbalanced, and/or such that temperature of the energy source(s) or other component (e.g., energy buffer) in each module remains balanced or converges to a balanced condition if they are unbalanced. Power flow in and out of the modules can be regulated such that a capacity difference between sources does not cause an SOC deviation. Balancing of SOC and temperature can indirectly cause some balancing of SOH. Voltage and current can be directly balanced if desired, but in many embodiments the main goal of the system is to balance SOC and temperature, and balancing of SOC can lead to balance of voltage and current in a highly symmetric systems where modules are of similar capacity and impedance.

Since balancing all parameters may not be possible at the same time (e.g., balancing of one parameter may further unbalance another parameter), a combination of balancing any two or more parameters (SOC, T, Q, SOH, V, I) may be applied with priority given to either one depending on the requirements of the application. Priority in balancing can be given to SOC over other parameters (T, Q, SOH, V, I), with exceptions made if one of the other parameters (T, Q, SOH, V, I) reaches a severe unbalanced condition outside a threshold.

Figure 9B:
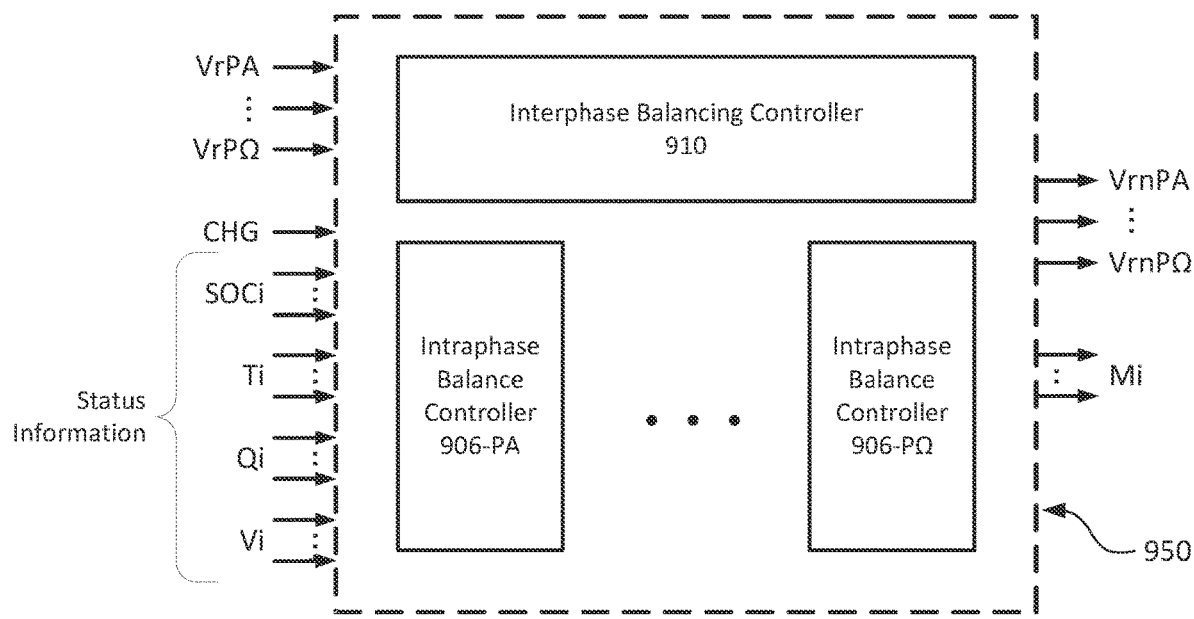

Balancing between arrays 700 of different phases (or arrays of the same phase, e.g., if parallel arrays are used) can be performed concurrently with intraphase balancing. FIG. 9B depicts an example embodiment of an Ω-phase (or Ω-array) controller 950 configured for operation in an Ω-phase system 100, having at least Ω arrays 700, where Ω is any integer greater than one. Controller 950 can include one interphase (or interarray) controller 910 and Ω intraphase balance controllers 906-PA . . . 906-PΩ for phases PA through PΩ, as well as peak detector 902 and divider 904 (FIG. 9A) for generating normalized references VrnPA through VrnPΩ from each phase-specific reference VrPA through VrPΩ. Intraphase controllers 906 can generate Mi for each module 108 of each array 700 as described with respect to FIG. 9A. Interphase balance controller 910 is configured or programmed to balance aspects of modules 108 across the entire multi-dimensional system, for example, between arrays of different phases. This may be achieved through injecting common mode to the phases (e.g., neutral point shifting) or through the use of interconnection modules (described herein) or through both. Common mode injection involves introducing a phase and amplitude shift to the reference signals VrPA through VrPΩ to generate normalized waveforms VrnPA through VrnPΩ to compensate for unbalance in one or more arrays, and is described further in Int'l. Appl. No. PCT/US20/25366 incorporated herein.

Controllers 900 and 950 (as well as balance controllers 906 and 910) can be implemented in hardware, software or a combination thereof within control system 102. Controllers 900 and 950 can be implemented within MCD 112, distributed partially or fully among LCDs 114, or may be implemented as discrete controllers independent of MCD 112 and LCDs 114.

Example Embodiments of Interconnection (IC) Modules

Modules 108 can be connected between the modules of different arrays 700 for the purposes of exchanging energy between the arrays, acting as a source for an auxiliary load, or both. Such modules are referred to herein as interconnection (IC) modules 108IC. IC module 108IC can be implemented in any of the already described module configurations (108A, 108B, 108C) and others to be described herein. IC modules 108IC can include any number of one or more energy sources, an optional energy buffer, switch circuitry for supplying energy to one or more arrays and/or for supplying power to one or more auxiliary loads, control circuitry (e.g., a local control device), and monitor circuitry for collecting status information about the IC module itself or its various loads (e.g., SOC of an energy source, temperature of an energy source or energy buffer, capacity of an energy source, SOH of an energy source, voltage and/or current measurements pertaining to the IC module, voltage and/or current measurements pertaining to the auxiliary load(s), etc.).

Figures 10A, 10B:
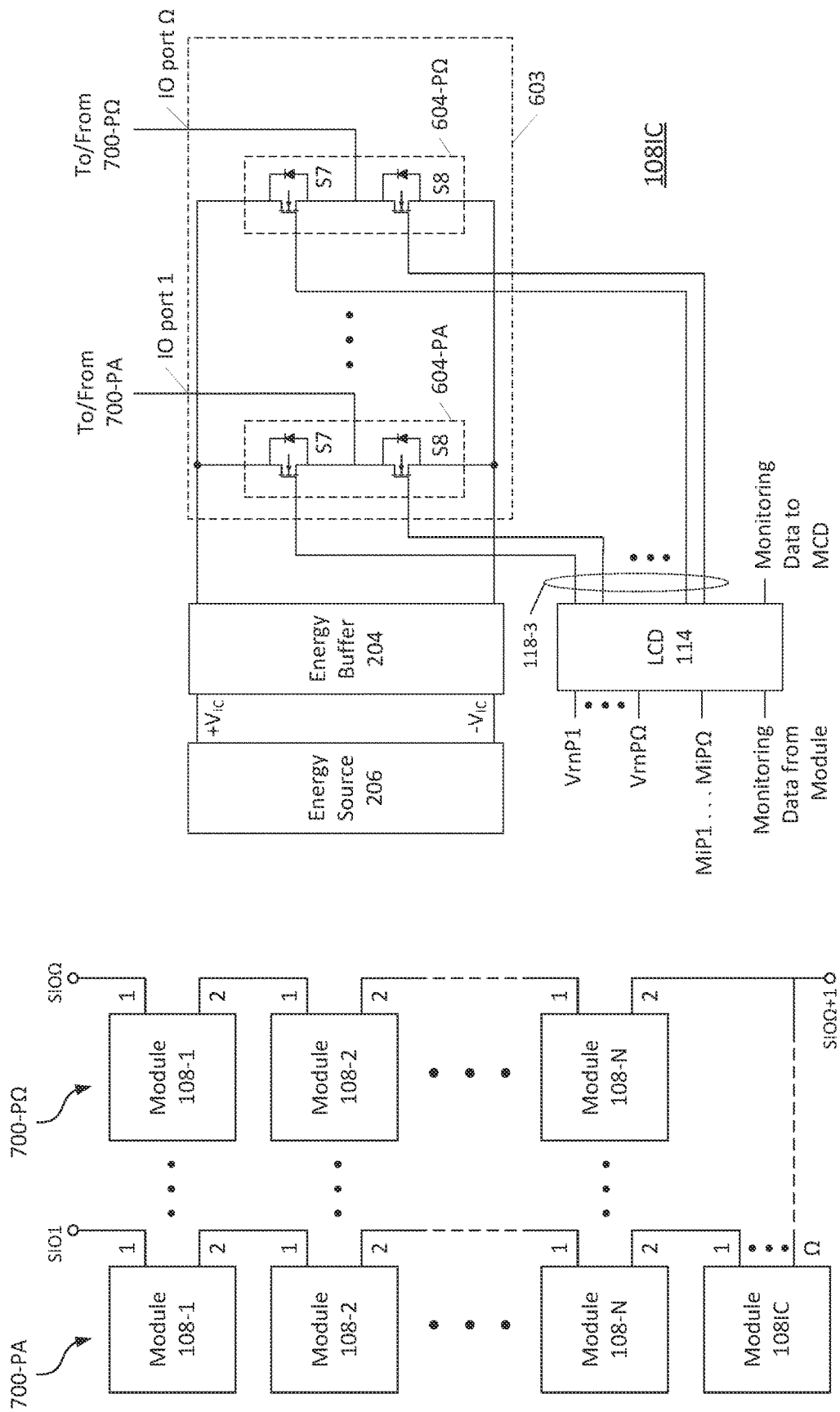
FIG. 10A is a block diagram depicting an example embodiment of a multiphase modular energy system having interconnection module.
FIG. 10B is a schematic diagram depicting an example embodiment of an interconnection module in the multiphase embodiment of FIG. 10A.

FIG. 10A is a block diagram depicting an example embodiment of a system 100 capable of producing Ω-phase power with Ω arrays 700-PA through 700-PΩ, where Ω can be any integer greater than one. In this and other embodiments, IC module 108IC can be located on the rail side of arrays 700 such the arrays 700 to which module 108IC are connected (arrays 700-PA through 700-PΩ in this embodiment) are electrically connected between module 108IC and outputs (e.g., SIO1 through SIOΩ) to the load. Here, module 108IC has Ω IO ports for connection to IO port 2 of each module 108-N of arrays 700-PA through 700-PΩ. In the configuration depicted here, module 108IC can perform interphase balancing by selectively connecting the one or more energy sources of module 108IC to one or more of the arrays 700-PA through 700-PΩ (or to no output, or equally to all outputs, if interphase balancing is not required). System 100 can be controlled by control system 102 (not shown, see FIG. 1A).

FIG. 10B is a schematic diagram depicting an example embodiment of module 108IC. In this embodiment module 108IC includes an energy source 206 connected with energy buffer 204 that in turn is connected with switch circuitry 603. Switch circuitry 603 can include switch circuitry units 604-PA through 604-PΩ for independently connecting energy source 206 to each of arrays 700-PA through 700-PΩ, respectively. Various switch configurations can be used for each unit 604, which in this embodiment is configured as a half-bridge with two semiconductor switches S7 and S8. Each half bridge is controlled by control lines 118-3 from LCD 114. This configuration is similar to module 108A described with respect to FIG. 3A. As described with respect to converter 202, switch circuitry 603 can be configured in any arrangement and with any switch types (e.g., MOSFET, IGBT, Silicon, GaN, etc.) suitable for the requirements of the application.

Switch circuitry units 604 are coupled between positive and negative terminals of energy source 206 and have an output that is connected to an IO port of module 108IC. Units 604-PA through 604-PΩ can be controlled by control system 102 to selectively couple voltage $+V_{IC}$ or $-V_{IC}$ to the respective module I/O ports 1 through Ω. Control system 102 can control switch circuitry 603 according to any desired control technique, including the PWM and hysteresis techniques mentioned herein. Here, control circuitry 102 is implemented as LCD 114 and MCD 112 (not shown). LCD 114 can receive monitoring data or status information from monitor circuitry of module 108IC. This monitoring data and/or other status information derived from this monitoring data can be output to MCD 112 for use in system control as described herein. LCD 114 can also receive timing information (not shown) for purposes of synchronization of modules 108 of the system 100 and one or more carrier signals (not shown), such as the sawtooth signals used in PWM (FIGS. 8C-8D).

For interphase balancing, proportionally more energy from source 206 can be supplied to any one or more of arrays 700-PA through 700-Pa that is relatively low on charge as compared to other arrays 700. Supply of this supplemental energy to a particular array 700 allows the energy output of those cascaded modules 108-1 thru 108-N in that array 700 to be reduced relative to the unsupplied phase array(s).

For example, in some example embodiments applying PWM, LCD 114 can be configured to receive the normalized voltage reference signal (Vrn) (from MCD 112) for each of the one or more arrays 700 that module 108IC is coupled to, e.g., VrnPA through VrnPΩ. LCD 114 can also receive modulation indexes MiPA through MiPΩ for the switch units 604-PA through 604-PΩ for each array 700, respectively, from MCD 112. LCD 114 can modulate (e.g., multiply) each respective Vrn with the modulation index for the switch section coupled directly to that array (e.g., VrnA multiplied by MiA) and then utilize a carrier signal to generate the control signal(s) for each switch unit 604. In other embodiments, MCD 112 can perform the modulation and output modulated voltage reference waveforms for each unit 604 directly to LCD 114 of module 108IC. In still other embodiments, all processing and modulation can occur by a single control entity that can output the control signals directly to each unit 604.

This switching can be modulated such that power from energy source 206 is supplied to the array(s) 700 at appropriate intervals and durations. Such methodology can be implemented in various ways.

Based on the collected status information for system 100, such as the present capacity (Q) and SOC of each energy source in each array, MCD 112 can determine an aggregate charge for each array 700 (e.g., aggregate charge for an array can be determined as the sum of capacity times SOC for each module of that array). MCD 112 can determine whether a balanced or unbalanced condition exists (e.g., through the use of relative difference thresholds and other metrics described herein) and generate modulation indexes MiPA through MiPΩ accordingly for each switch unit 604-PA through 604-PΩ.

During balanced operation, Mi for each switch unit 604 can be set at a value that causes the same or similar amount of net energy over time to be supplied by energy source 206 and/or energy buffer 204 to each array 700. For example, Mi for each switch unit 604 could be the same or similar, and can be set at a level or value that causes the module 108IC to perform a net or time average discharge of energy to the one or more arrays 700-PA through 700-PΩ during balanced operation, so as to drain module 108IC at the same rate as other modules 108 in system 100. In some embodiments, Mi for each unit 604 can be set at a level or value that does not cause a net or time average discharge of energy during balanced operation (causes a net energy discharge of zero). This can be useful if module 108IC has a lower aggregate charge than other modules in the system.

When an unbalanced condition occurs between arrays 700, then the modulation indexes of system 100 can be adjusted to cause convergence towards a balanced condition or to minimize further divergence. For example, control system 102 can cause module 108IC to discharge more to the array 700 with low charge than the others, and can also cause modules 108-1 through 108-N of that low array 700 to discharge relatively less (e.g., on a time average basis). The relative net energy contributed by module 108IC increases as compared to the modules 108-1 through 108-N of the array 700 being assisted, and also as compared to the amount of net energy module 108IC contributes to the other arrays. This can be accomplished by increasing Mi for the switch unit 604 supplying that low array 700, and by decreasing the modulation indexes of modules 108-1 through 108-N of the low array 700 in a manner that maintains Vout for that low array at the appropriate or required levels, and maintaining the modulation indexes for other switch units 604 supplying the other higher arrays relatively unchanged (or decreasing them).

The configuration of module 108IC in FIGS. 10A-10B can be used alone to provide interphase or interarray balancing for a single system, or can be used in combination with one or more other modules 108IC each having an energy source and one or more switch portions 604 coupled to one or more arrays. For example, a module 108IC with Ω switch portions 604 coupled with Ω different arrays 700 can be combined with a second module 108IC having one switch portion 604 coupled with one array 700 such that the two modules combine to service a system 100 having Ω+1 arrays 700. Any number of modules 108IC can be combined in this fashion, each coupled with one or more arrays 700 of system 100.

Figure 10C:
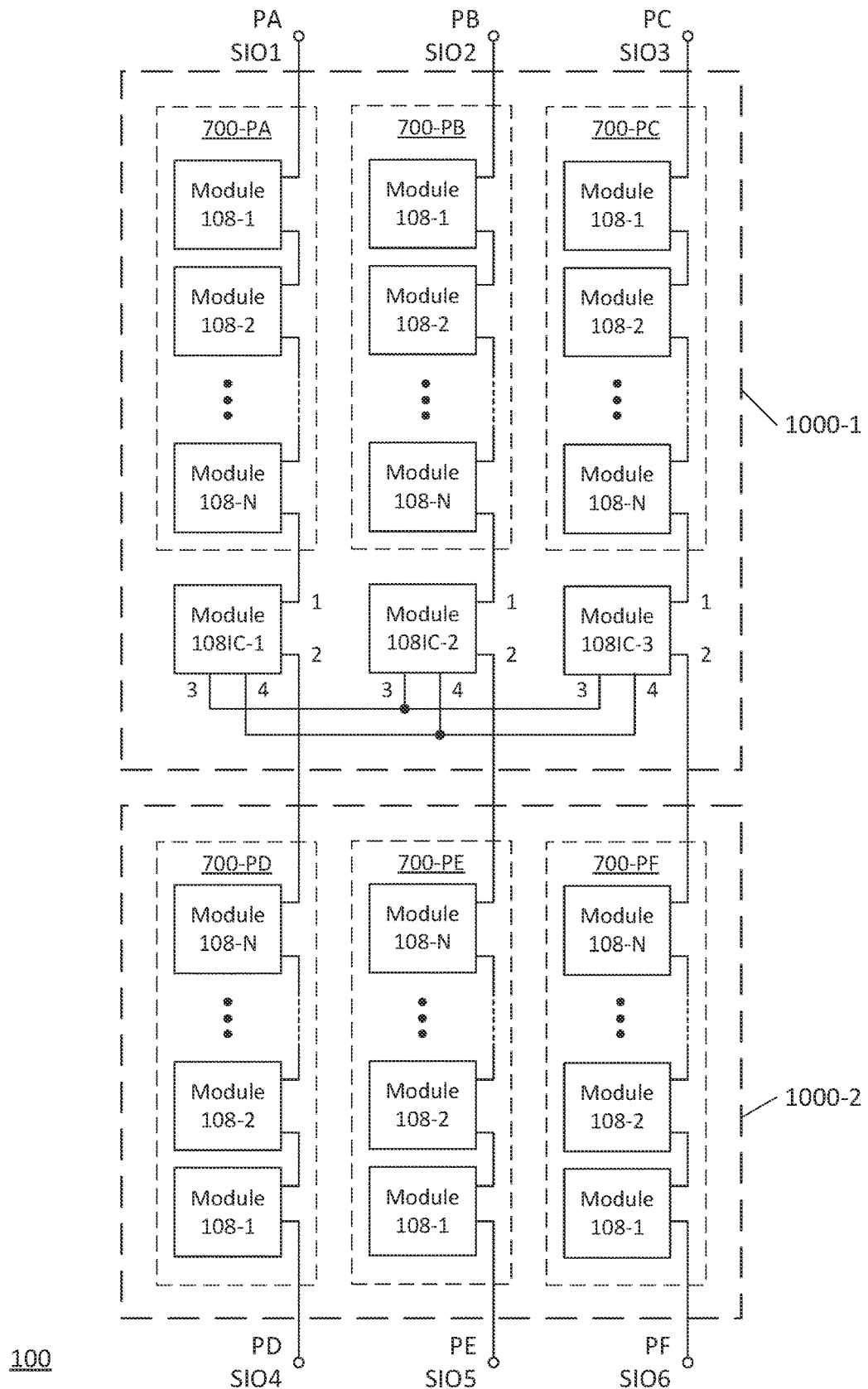
FIG. 10C is a block diagram depicting an example embodiment of a modular energy system having two subsystems connected together by interconnection modules.

Furthermore, IC modules can be configured to exchange energy between two or more subsystems of system 100. FIG. 10C is a block diagram depicting an example embodiment of system 100 with a first subsystem 1000-1 and a second subsystem 1000-2 interconnected by IC modules. Specifically, subsystem 1000-1 is configured to supply three-phase power, PA, PB, and PC, to a first load (not shown) by way of system I/O ports SIO1, SIO2, and SIO3, while subsystem 1000-2 is configured to supply three-phase power PD, PE, and PF to a second load (not shown) by way of system I/O ports SIO4, SIO5, and SIO06, respectively. For example, subsystems 1000-1 and 1000-2 can be configured as different packs supplying power for different motors of an EV or as different racks supplying power for different microgrids.

In this embodiment each module 108IC is coupled with a first array of subsystem 1000-1 (via IO port 1) and a first array of subsystem 1000-2 (via IO port 2), and each module 108IC can be electrically connected with each other module 108IC by way of I/O ports 3 and 4, which are coupled with the energy source 206 of each module 108IC as described with respect to module 108C of FIG. 3C. This connection places sources 206 of modules 108IC-1, 108IC-2, and 108IC-3 in parallel, and thus the energy stored and supplied by modules 108IC is pooled together by this parallel arrangement. Other arrangements such as serious connections can also be used. Modules 108IC are housed within a common enclosure of subsystem 1000-1, however the interconnection modules can be external to the common enclosure and physically located as independent entities between the common enclosures of both subsystems 1000.

Each module 108IC has a switch unit 604-1 coupled with IO port 1 and a switch unit 604-2 coupled with I/O port 2, as described with respect to FIG. 10B. Thus, for balancing between subsystems 1000 (e.g., inter-pack or inter-rack balancing), a particular module 108IC can supply relatively more energy to either or both of the two arrays to which it is connected (e.g., module 108IC-1 can supply to array 700-PA and/or array 700-PD). The control circuitry can monitor relative parameters (e.g., SOC and temperature) of the arrays of the different subsystems and adjust the energy output of the IC modules to compensate for imbalances between arrays or phases of different subsystems in the same manner described herein as compensating for imbalances between two arrays of the same rack or pack. Because all three modules 108IC are in parallel, energy can be efficiently exchanged between any and all arrays of system 100. In this embodiment, each module 108IC supplies two arrays 700, but other configurations can be used including a single IC module for all arrays of system 100 and a configuration with one dedicated IC module for each array 700 (e.g., six IC modules for six arrays, where each IC module has one switch unit 604). In all cases with multiple IC modules, the energy sources can be coupled together in parallel so as to share energy as described herein.

In systems with IC modules between phases, interphase balancing can also be performed by neutral point shifting (or common mode injection) as described above. Such a combination allows for more robust and flexible balancing under a wider range of operating conditions. System 100 can determine the appropriate circumstances under which to perform interphase balancing with neutral point shifting alone, interphase energy injection alone, or a combination of both simultaneously.

Figure 10D:
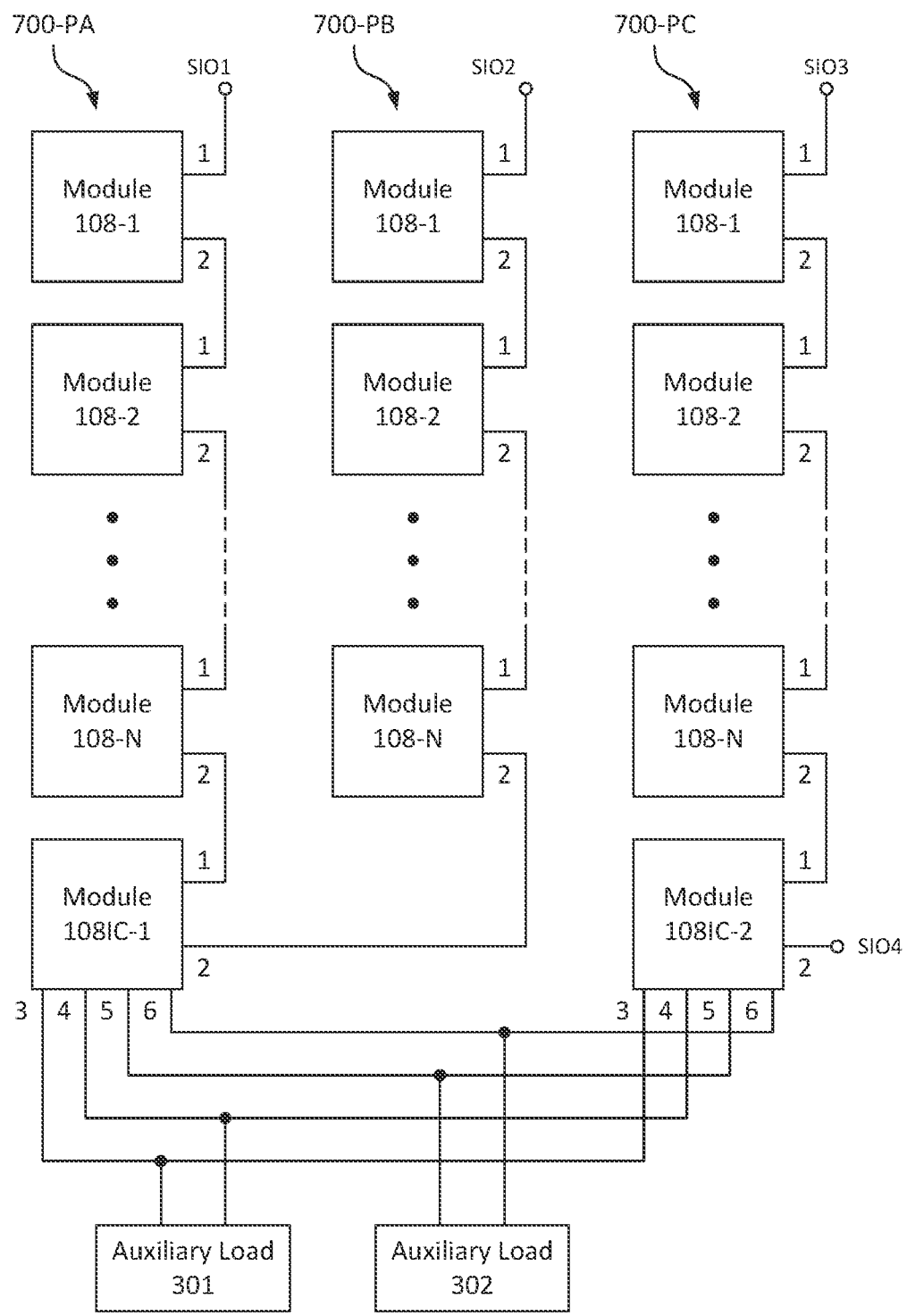
FIG. 10D is a block diagram depicting an example embodiment of a three-phase modular energy system having interconnection modules supplying auxiliary loads.
Figure 10E:
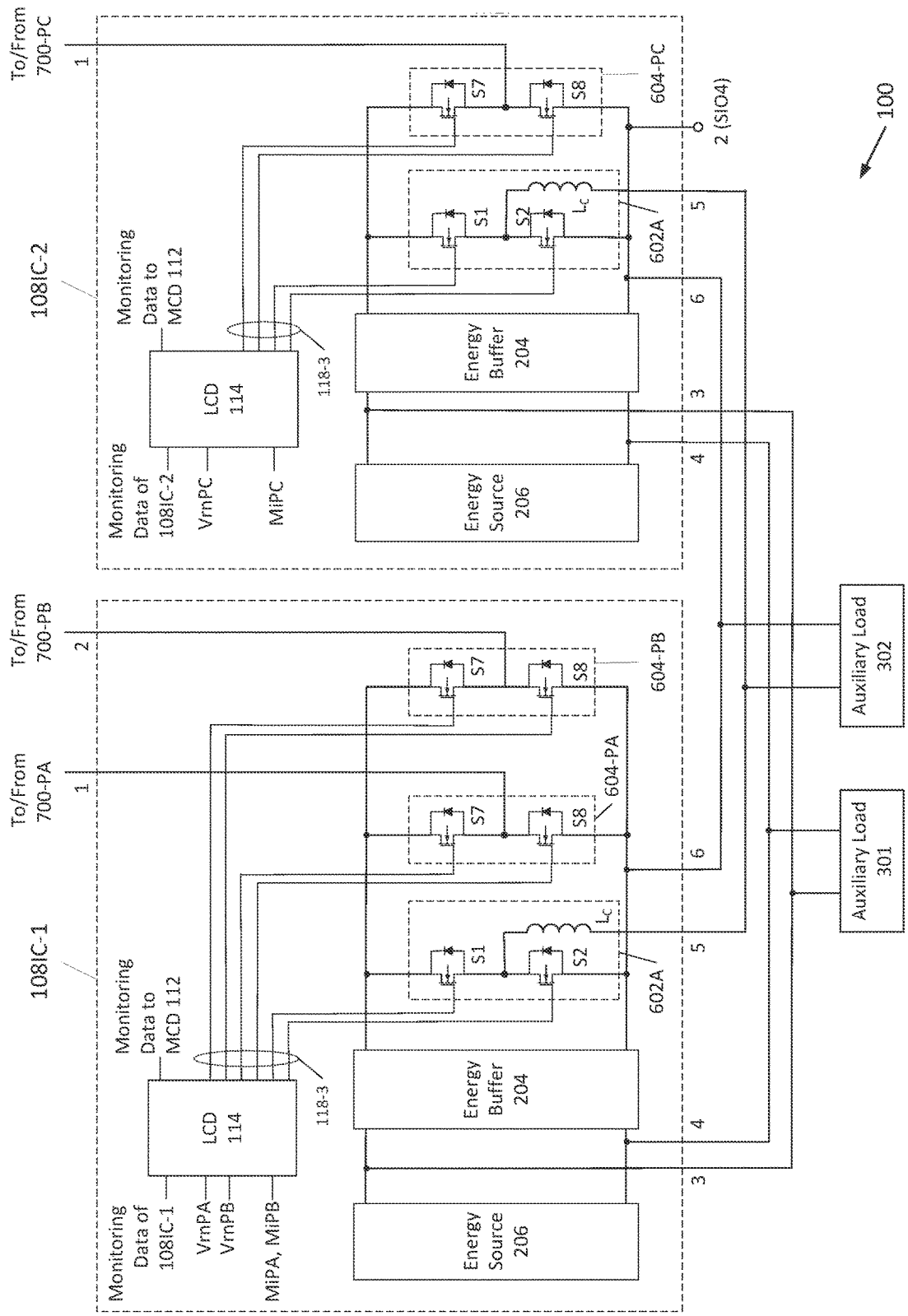
FIG. 10E is a schematic view depicting an example embodiment of the interconnection modules in the multiphase embodiment of FIG. 10D.

IC modules can also be configured to supply power to one or more auxiliary loads 301 (at the same voltage as source 206) and/or one or more auxiliary loads 302 (at voltages stepped down from source 302). FIG. 10D is a block diagram depicting an example embodiment of a three-phase system 100A with two modules 108IC connected to perform interphase balancing and to supply auxiliary loads 301 and 302. FIG. 10E is a schematic diagram depicting this example embodiment of system 100 with emphasis on modules 108IC-1 ad 108IC-2. Here, control circuitry 102 is again implemented as LCD 114 and MCD 112 (not shown). The LCDs 114 can receive monitoring data from modules 108IC (e.g., SOC of ES1, temperature of ES1, Q of ES1, voltage of auxiliary loads 301 and 302, etc.) and can output this and/or other monitoring data to MCD 112 for use in system control as described herein. Each module 108IC can include a switch portion 602A (or 602B described with respect to FIG. 6C) for each load 302 being supplied by that module, and each switch portion 602 can be controlled to maintain the requisite voltage level for load 302 by LCD 114 either independently or based on control input from MCD 112. In this embodiment, each module 108IC includes a switch portion 602A connected together to supply the one load 302, although such is not required.

Figure 10F:
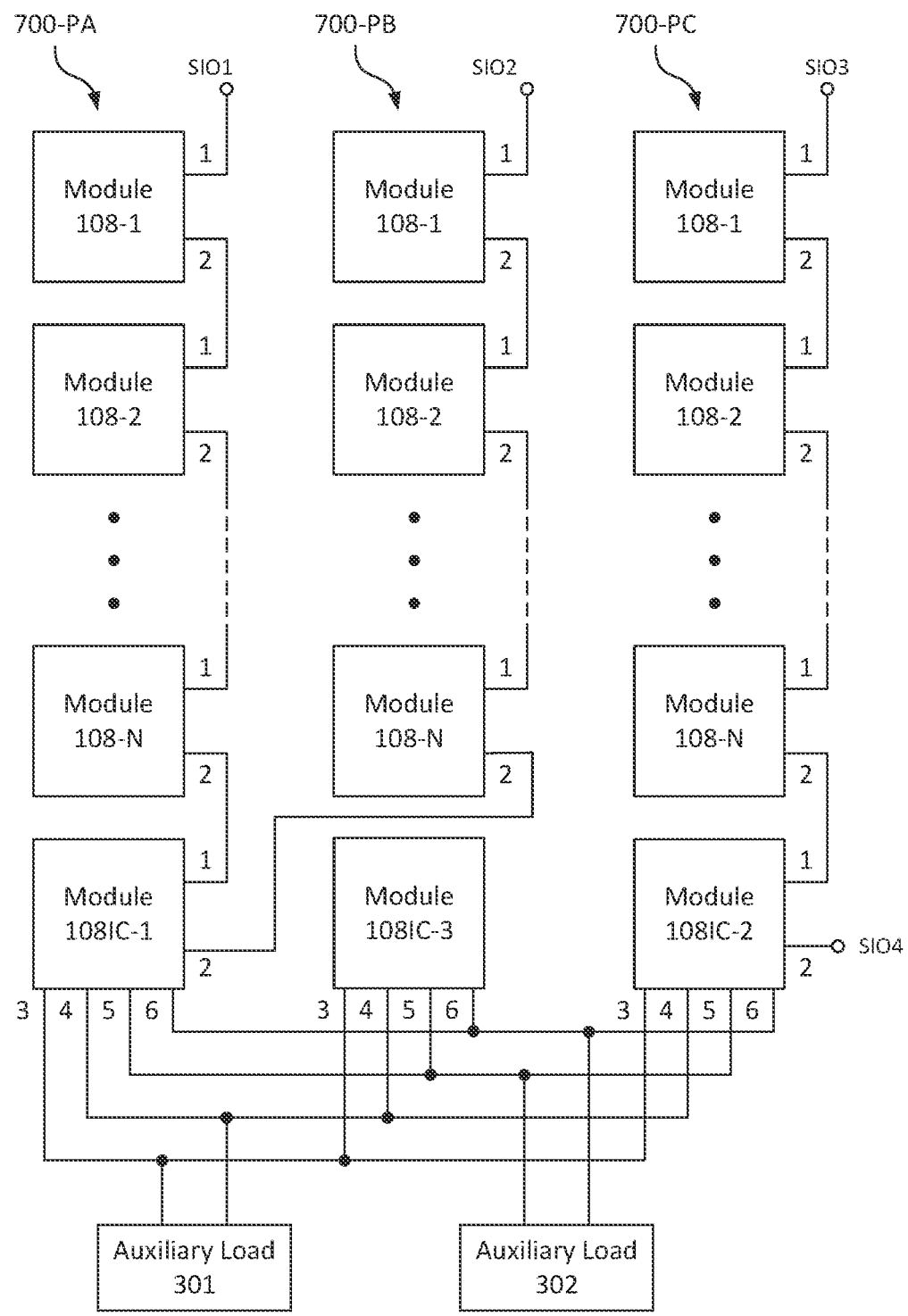
FIG. 10F is a block diagram depicting an example embodiment of a three-phase modular energy system having interconnection modules supplying auxiliary loads.

FIG. 10F is a block diagram depicting another example embodiment of a three-phase system configured to supply power to one or more auxiliary loads 301 and 302 with modules 108IC-1, 108IC-2, and 108IC-3. In this embodiment, modules 108IC-1 and 108IC-2 are configured in the same manner as described with respect to FIGS. 10D-10E. Module 108IC-3 is configured in a purely auxiliary role and does not actively inject voltage or current into any array 700 of system 100. In this embodiment, module 108IC-3 can be configured like module 108C of FIG. 3B, having a converter 202B,C (FIGS. 6B-6C) with one or more auxiliary switch portions 602A, but omitting switch portion 601. As such, the one or more energy sources 206 of module 108IC-3 are interconnected in parallel with those of modules 108IC-1 and 108IC-2, and thus this embodiment of system 100 is configured with additional energy for supplying auxiliary loads 301 and 302, and for maintaining charge on the sources 206A of modules 108IC-1 and 108IC-2 through the parallel connection with the source 206 of module 108IC-3.

The energy source 206 of each IC module can be at the same voltage and capacity as the sources 206 of the other modules 108-1 through 108-N of the system, although such is not required. For example, a relatively higher capacity can be desirable in an embodiment where one module 108IC applies energy to multiple arrays 700 (FIG. 10A) to allow the IC module to discharge at the same rate as the modules of the phase arrays themselves. If the module 108IC is also supplying an auxiliary load, then an even greater capacity may be desired so as to permit the IC module to both supply the auxiliary load and discharge at relatively the same rate as the other modules.

The aforementioned embodiments described with respect to FIGS. 1A-10F can be used with all of the following embodiments pertaining to cooling systems for system 100 and the implementation of system 100 within applications having removable and replaceable modules.

Example Embodiments of Cooling Systems

Figure 11A:
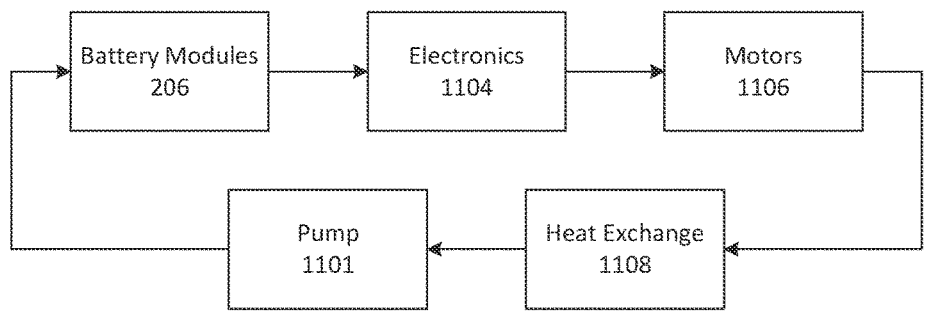
FIG. 11A is a block diagram depicting an example embodiment of a process flow for cooling components of an electric vehicle.

Because the amount of heat generated by system 100 during operation can be significant, it is often necessary to provide a cooling system that has the function of circulating coolant in proximity with the various elements of system 100 and/or the motors and any other elements of the EV that require cooling. FIG. 11A depicts an example of a cooling arrangement 1100 where coolant is pumped by a pump 1101 through various elements of the arrangement 1100. The coolant can circulate such that the components with the greatest cooling requirements are called first and those with the more relaxed thermal requirements are cooled last. For example in this embodiment, pump 1101 circulates coolant first to battery modules 206, which may require coolant at a relatively low temperature between 20 and 30° C., and then to the power converter 202 and control (e.g., LCD 114) electronics 1104 of the modules 108, which may require coolant at a relatively higher temperature of up to 40 or 50° C., and finally to the one or more motors 1106 which may require coolant at a still higher temperature of less than 60° C. After circulating in close proximity to these components to cool them, the coolant can proceed through a heat exchanger 1108 where its temperature is brought back down to a temperature close to the requirements of battery modules 206, at which point it is circulated through pump 1101 and the loop repeats.

Figure 11B:
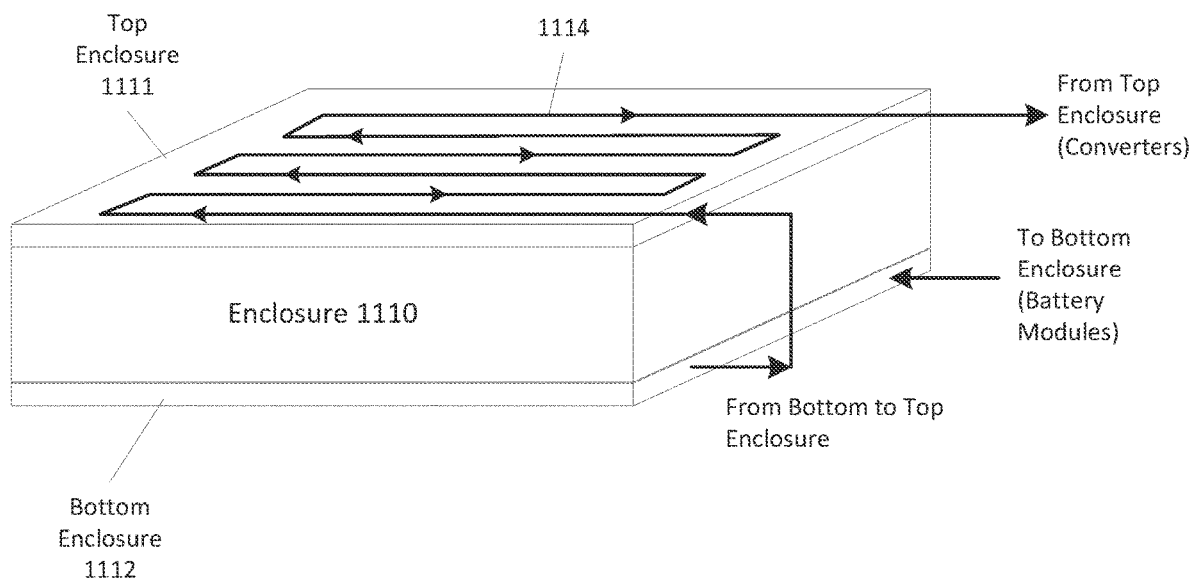
FIG. 11B is a perspective view depicting an example embodiment of enclosure configured for cooling a modular energy system.

One or more of the subsystems 1000 described herein can be implemented within a common enclosure. An energy storage system contained within a common enclosure is often referred to as a pack, e.g., a battery pack. FIG. 11B depicts an example of a common enclosure 1110 for one or more subsystems of system 100. The common enclosure 1110 would include each of the modules 108 of the one or more subsystems and can also include any interconnection modules that are present. The energy sources, energy buffers, power electronics (switching circuitry) of the converter, control electronics, and any other components of the modules would be contained within the common enclosure 1110. See, for example, FIG. 11E, where the battery module 206 is located at bottom and the associated power converter and control electronics 1104 are located above the batteries within the enclosure. The common enclosure 1110 can include a bottom enclosure 1112, such as a base, and an opposing top enclosure 1111, such as a lid, and both the top and bottom enclosures can include one or more conduits for circulating coolant through those aspects of the enclosures 1111 and 1112 to cool modules 108. As shown here, coolant from pump 301 can be circulated to bottom enclosure 1112 where it passes through a conduit network 1114 like that shown for the top enclosure 1111, and thus passes in proximity to the batteries and provides cooling to them. The coolant can exit bottom enclosure 1112 and pass to top enclosure 1111 (either through a conduit external to the enclosure 1110 or via a conduit in the side of or within enclosure 1110), and circulate through conduit network 1114, where it passes in proximity to the electronics of the modules and cools them. The coolant can then exit from top enclosure 1111 were it can proceed to the next component of the system such as motor(s) 1106.

Figure 11C:
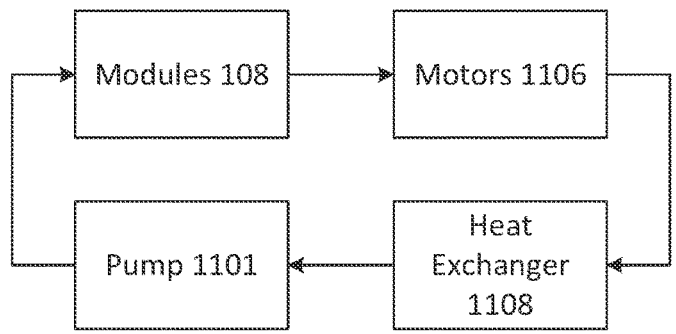
FIG. 11C is a block diagram depicting another example embodiment of a process flow for cooling components of an electric vehicle.
Figure 11D:
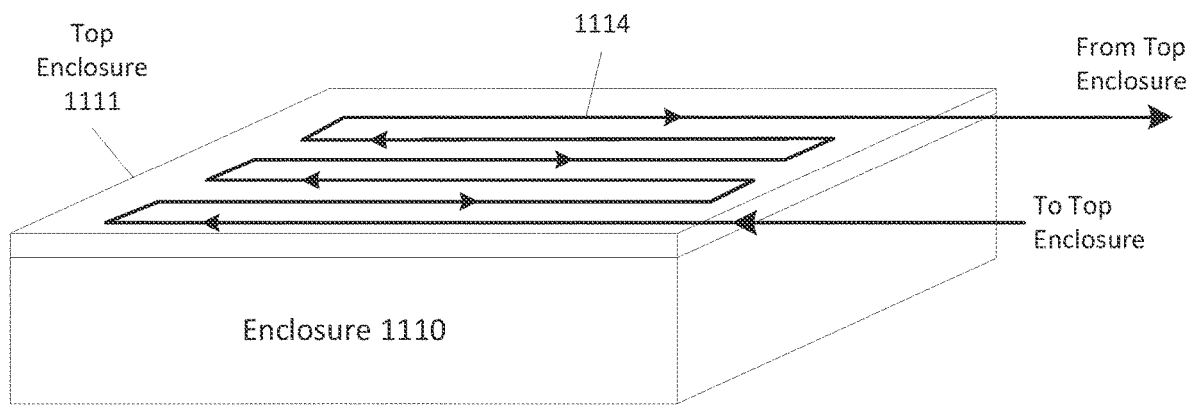
FIG. 11D is a perspective view depicting another example embodiment of enclosure configured for cooling a modular energy system.

In some embodiments it is possible to provide coolant through only the top of enclosure 1111 and cool all aspects of modules 108 without first cooling the batteries and then subsequently cooling the electronics. FIG. 11C depicts an example arrangement 320 where coolant is circulated from pump 301 to modules 320 where it cools both the batteries and the associated electronics at the same time, and then passes to motor(s) 1106 and to heat exchanger 1108. FIG. 11D depicts an example embodiment similar to that of FIG. 11B, but where coolant passes through the conduit network 1114 only within the top enclosure.

Figure 11E:
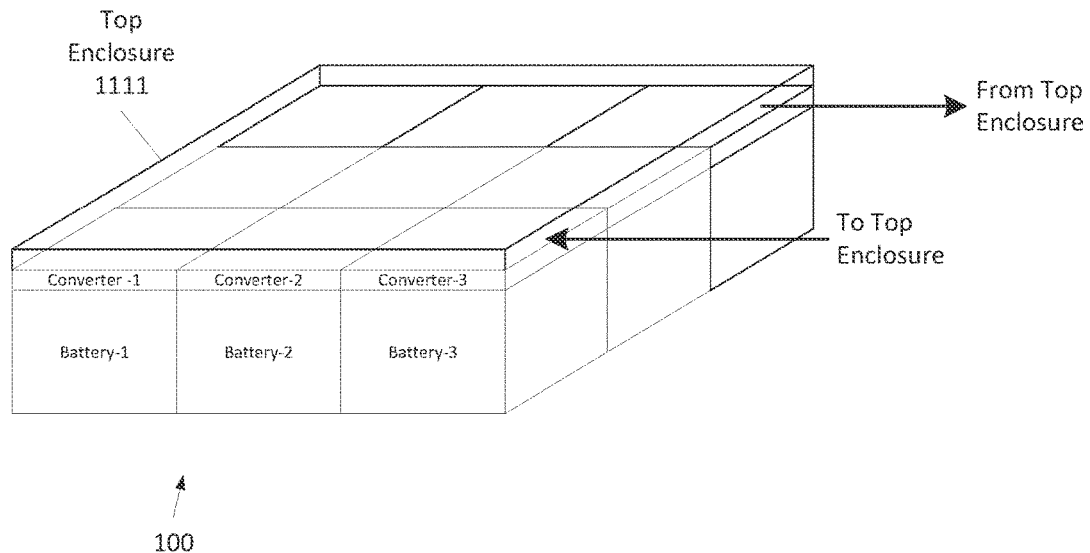
FIG. 11E is a perspective view depicting an example embodiment of module component placement with respect to a top enclosure.

FIG. 11E is a perspective view showing an example layout for modules within enclosure 1110. Here each module is shown as a battery adjacent to its converter (e.g., a first module is the combination of battery-1 and converter-1, and so forth). Only top enclosure 1111 is shown here and the sides and bottom of enclosure 1110, as well as the conduit network within the top enclosure, are omitted for clarity. In this example, the converter is placed above the battery and coolant runs through top enclosure 1111 above the converter such that heat from the battery passes upward through the converter to top enclosure 1111 where it is removed through the circulating coolant. A reverse configuration can also be implemented, where the converter is placed at the bottom and the battery is placed above the converter and heat is again extracted through the top enclosure per FIG. 11E or through both the bottom and top per FIG. 11B. In still another embodiment, the converter and battery can be arranged as shown in FIG. 11E or in the reverse configuration but coolant can be passed only through the bottom enclosure. In yet another embodiment the converter and battery can be placed side to side and coolant can be circulated through the top and/or bottom enclosure. All the aforementioned variations can be implemented with coolant also passing through a conduit network in the top, bottom, and/or sidewalls of the enclosure.

Figure 11F:
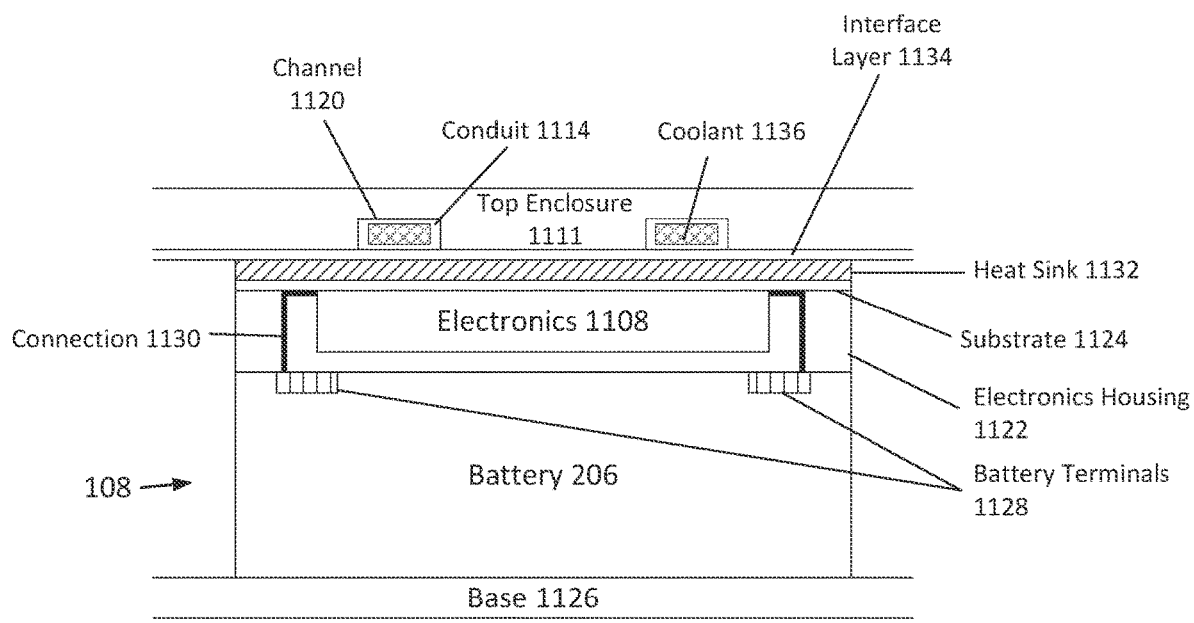
FIG. 11F is a cross-sectional view depicting an example embodiment of a module in proximity with a cooling apparatus.

FIG. 11F is a cross-section of an example embodiment where converter and control electronics 1108 are positioned above battery 206. This embodiment will be described with respect to conduits 1114 within top enclosure 1111 but the features of this embodiment can be likewise applied to conduits 1114 passing within the bottom of the enclosure or the side of the enclosure as described. In FIG. 11F, electronics 1108 of the converter and control system are contained within an electronics housing 1122. Electronics 1108 are mounted on one or more substrates 1124 such as a printed circuit board (PCB) or insulated metal substrate (IMS) board that provides the electrical connections passing between the various components. The PCB or IMS is oriented above electronics 1108 such that the electronics are mounted in an upside down fashion. Battery 206 is located beneath housing 1122 and rests on a base 1126, which can be the bottom enclosure. Battery 206 has positive and negative terminals 1128 located on the battery's top. Electrical connections 1130 extend from terminals 1128 through (or alternatively exterior to) housing 1122 to the PCB or IMS and/or to the converter electronics for switching. The PCB or IMS is located immediately adjacent to a heatsink plate 1132 composed of a highly thermally conductive material, e.g., aluminum, aluminum alloy, copper, or steel.

Top enclosure 1111 includes conduit 1114 for coolant 1136 described with respect to FIGS. 11B and 11D. Conduit 1114 can be composed of a highly thermally conductive material, e.g., aluminum, copper, or steel, and shaped with a polygonal cross-section as depicted here, although other shapes such as elliptical or circular or a combination of rounded and polygonal shapes can be used. Conduit 1114 can be located within a channel 1120 in top enclosure 1111 having a shape corresponding to the conduit. For example, if conduit 1114 has a polygonal cross-section then channel 1120 can also have a polygonal cross-section to allow conduit 1114 to be located therein. Top enclosure 1111 can also be composed of a highly thermally conductive material, e.g., aluminum, copper, or steel. Channels 1120 can be machined or etched into top enclosure 1111 and conduit 1114 can be press fit therein.

As shown here, two sections of conduit 1114 pass over a particular module 108 of system 100. If desired, an interface layer 1134 can be present between the bottom surface of conduits 1114 and the top surface of heatsink 1132. Interface layer 1134 can be a material with high thermal conductivity and a degree of deformability or elasticity to form continuous and durable contact between heatsink 1132 and the bottom surface of conduit 1114 (as well as the bottom surface of top enclosure 1111). Interface layer 1134 can be relatively thinner than top enclosure 1111 and heatsink 1132 and interface layer 1134 can be composed of, e.g., a thermally conductive polymer.

In this embodiment, conduits 1114 are shown passing over one module, however, the density of the layout of conduits 1114 will vary based on the thermal requirements of the application. While preferably at least one conduit 1114 passes over each module, such is not required. One conduit 1114 can be shared by two or more modules. Conduits 1114 can be routed over the center of the module or can be at positions approximately one third of the distance from the side of the module as depicted in FIG. 11F, or otherwise.

The configuration described with respect to FIG. 11F can accomplish reliable cooling for the embodiments described herein using only the top enclosure of enclosure 1110. As mentioned, similar arrangements can be placed along the sides of enclosure 1110 and/or along the bottom of enclosure 1110 such that conduit 1114 is adjacent to the bottom of the batteries or separated from the bottom of the batteries by a second interface layer.

Example Embodiments of Removable and Replaceable Modules

The example topologies described herein can be configured to permit the energy source 206 of each module 108 to be removed from its location within the EV and replaced. This removable and replaceable capability can be used to quickly and conveniently replace batteries (or other energy sources) that are relatively low on charge with ones that are relatively high on charge, thus potentially greatly reducing the time necessary to charge the EV. Such capability is advantageous for environments where the EV is utilized for an extended period of time throughout the day, such as fleet operations (e.g., ridesharing, delivery, or car rental).

Figure 12A:
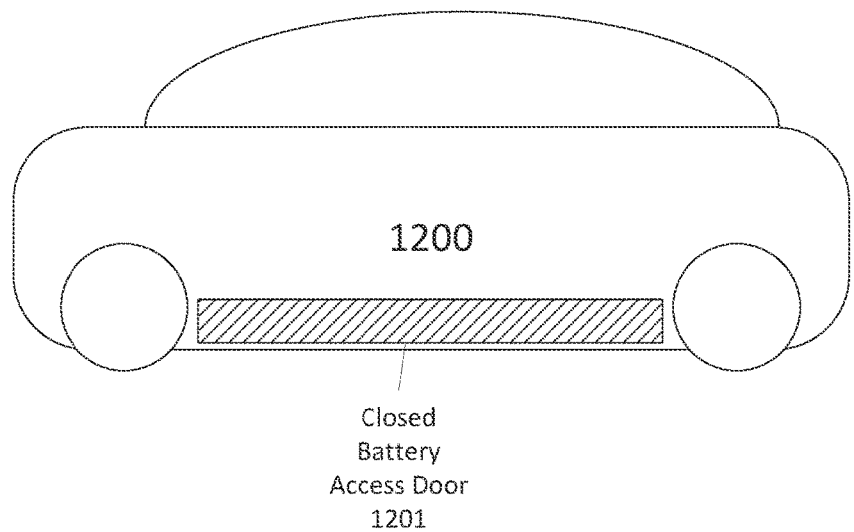
FIGS. 12A-12B are side views depicting an example embodiment of an electric vehicle configured to operate with replaceable battery modules.
Figure 12B:
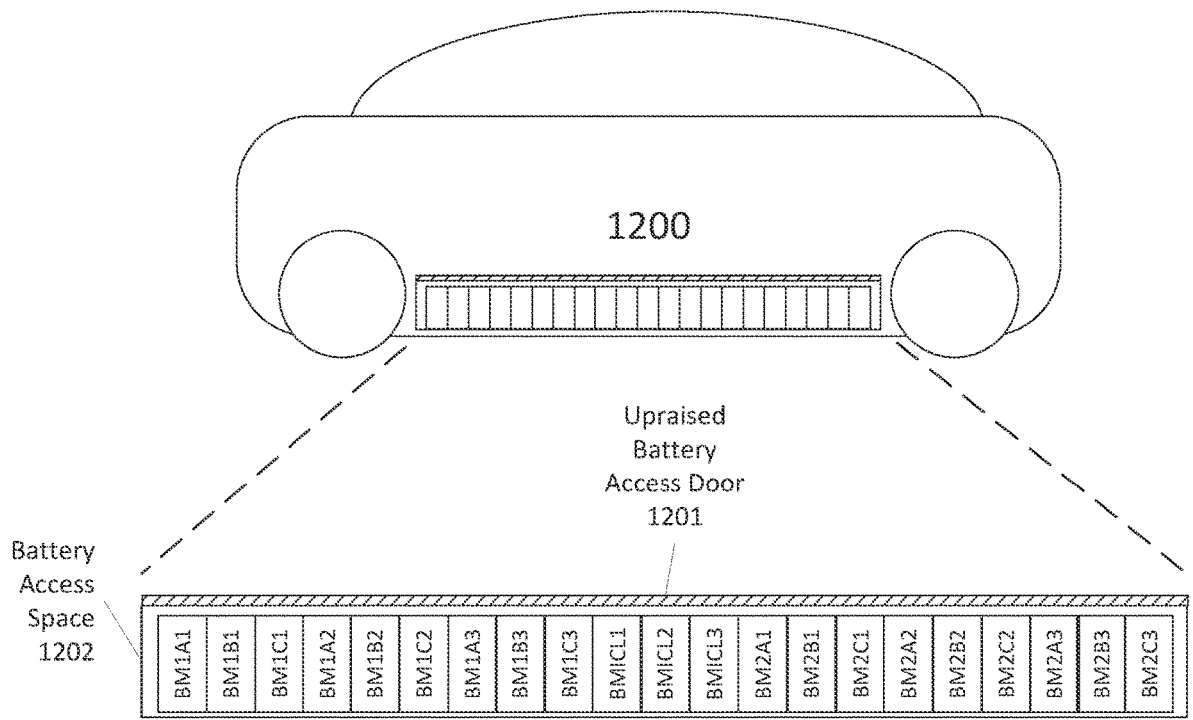

FIGS. 12A and 12B depict an example embodiment of an EV 1200 having replaceable battery (or other source) capability. In this embodiment each side (left and right) of the EV has a battery access panel or door total one that is closed during operation of the EV and opened to permit access to a space 1202 holding the various batteries of system 100. The batteries can have a slim form factor such that the battery has a relatively long length and a relatively short height as will be described in more detail herein. The short height permits the batteries to be placed along the bottom of the chassis, such that any passenger or driver can set above the batteries and their modules, without significantly adding to the overall height of EV 1200. FIG. 12A depicts EV 1200 with battery access door total one closed and FIG. 12B depicts EV 1200 with battery access door 1201 opened, in this case in an upraised position. Opening battery access door total one exposes battery access space 1202 from which each battery can be removed and replaced with another (or the same battery after charging or repair in certain cases).

In the embodiment of FIGS. 12A-12B, and also of FIG. 13A described below, each battery is configured as a battery module (BM) having multiple cells. The modular energy system includes multiple subsystems for powering different electric motors of EV 1200. Each battery module is referenced with respect to the subsystem in which it resides, the phase of the array in which it resides, and the level of the array in which the module housing the battery module resides. For example, a battery module associated with a first subsystem, an array for phase A of the first subsystem, and a module in level 2 (e.g., module 108-2) of the array, is reference as BM1A2 (Battery Module, Subsystem 1, Phase A, Level 2). A battery module associated with an interconnection module 108IC, configured in accordance with any of the embodiments described herein, is referenced by its status as an interconnection module (IC), the battery access door 1201 through which it is accessible (L for left, R for right), and the number of the interconnection module (e.g., 1, 2, 3). For example, a battery module that is part of the third interconnection module accessible from the left side of the vehicle is referenced as BMICL3. Converters (C) of FIG. 13A are referenced in similar fashion.

Figure 13A:
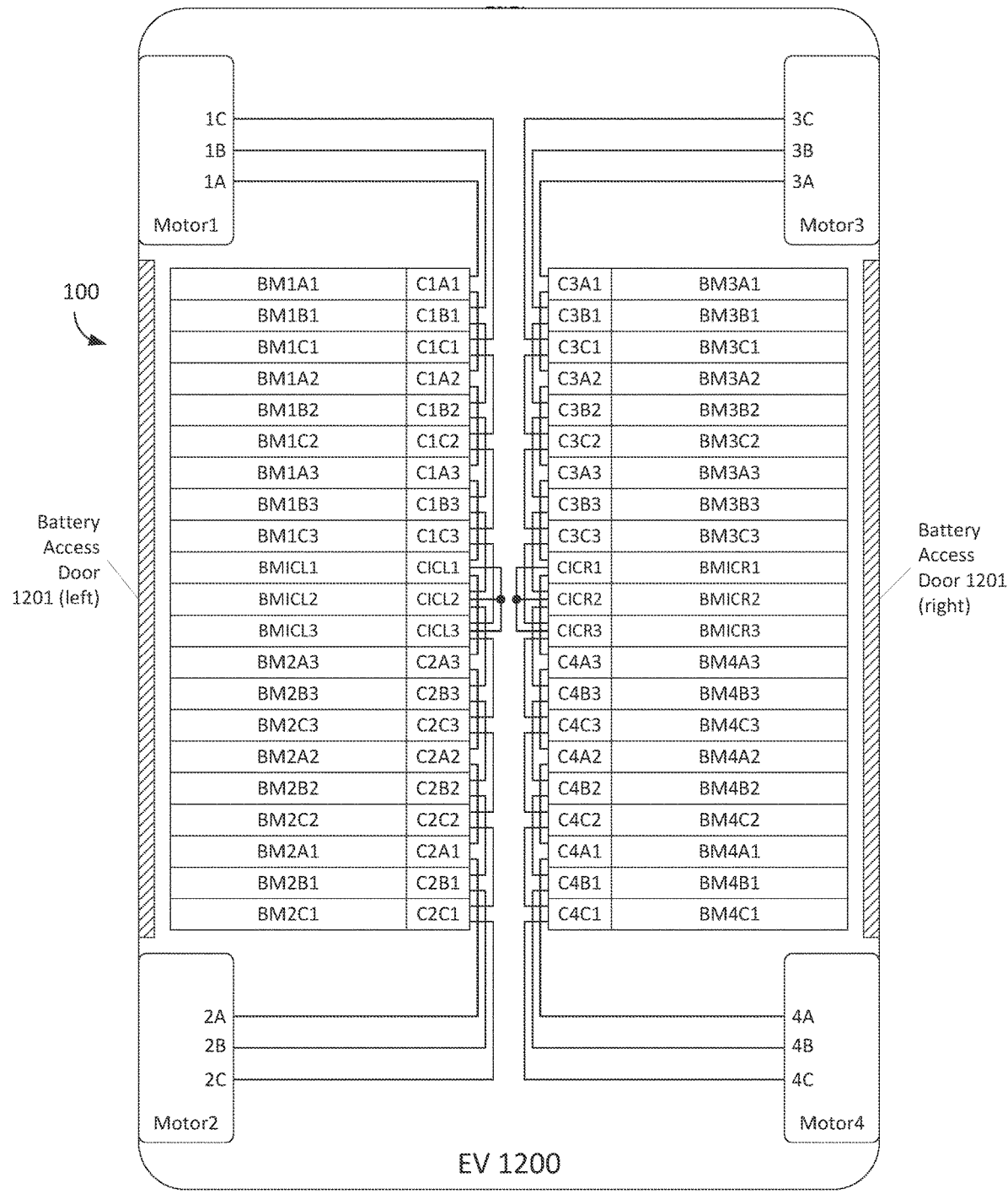
FIG. 13A is a schematic diagram depicting an example embodiment of a modular energy system having replaceable battery modules within an electric vehicle.
Figure 13B:
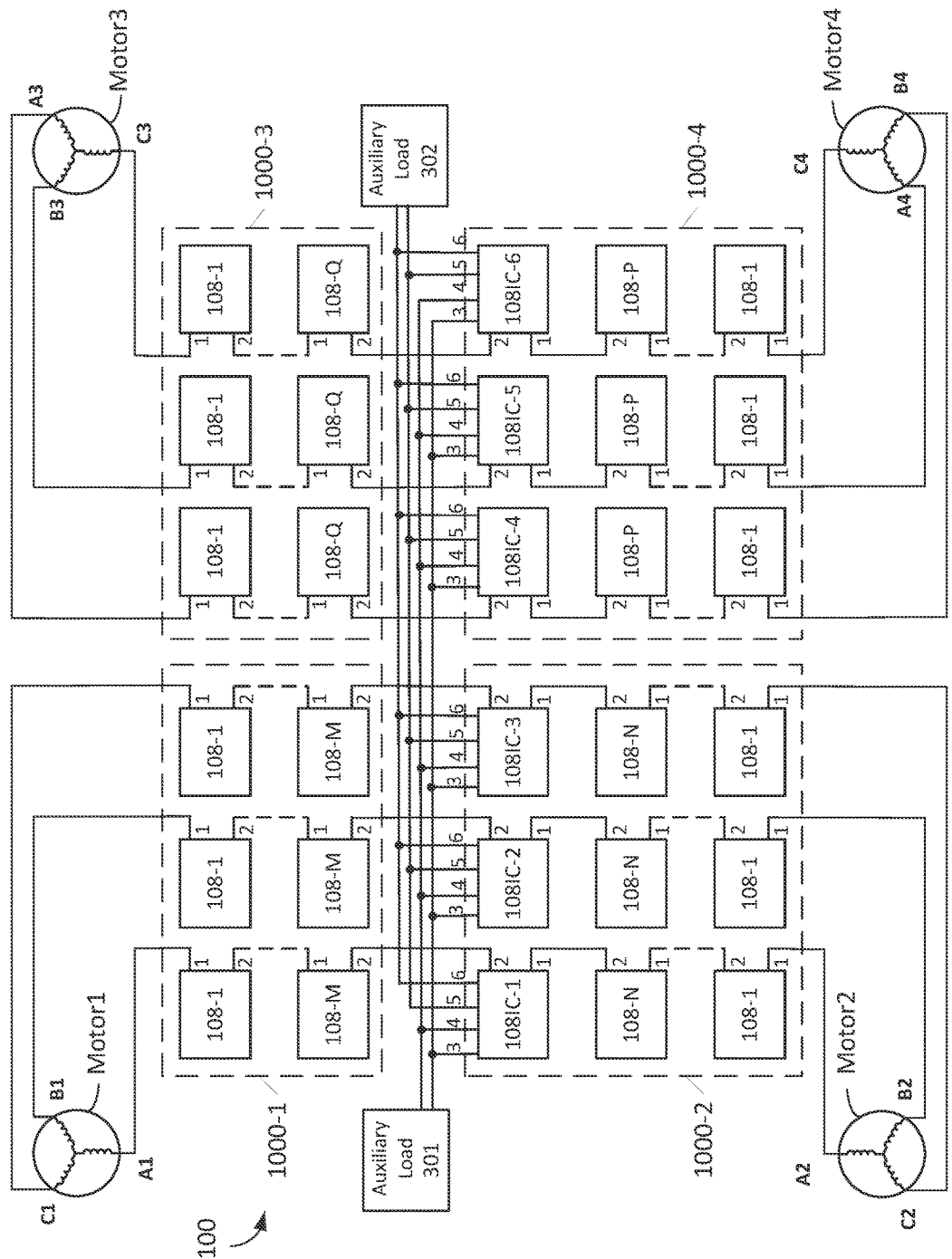
FIG. 13B is a block diagram depicting an example embodiment of an electrical layout for the modular energy system of FIG. 13A.

FIG. 13A is a top-down view of a cross-section of an example embodiment of EV 1200 with system 100 therein. In this embodiment, EV 1200 includes four in-wheel motors 1-4. Battery access doors 1201 are shown at left and right. System 100 is configured in an electrical arrangement similar to that described with respect to FIG. 13B. In this embodiment each motor is powered by three arrays each having three modules 108 therein. System 100 can be configured for any number of modules N in each array where N is two or more. Here, each module is represented by a battery module coupled with a converter, in the other components are not shown. The converter can include all electronics associated with the module (including a local control device 114 for that module). Electronics specific to the battery, e.g., such as a battery management system (BMS), can be located with the battery module. Power connections between the modules are shown in the center region of EV 1200. These connections can be implemented with insulated bus bars. The insulated bus bars can be arranged along the interior side of the converters as shown here, along the bottom of the converters, along the top of the converters, or any combination thereof to efficiently transfer power. Although not shown, data communication between the modules and with a master control device 112 is also present.

Also shown are six IC modules 108IC. Interconnection modules ICL1, ICL2, and ICL3 interconnect the subsystems supplying motors 1 and 2 while interconnection modules ICR1, ICR2, and ICR3 interconnect the subsystems supplying motors 3 and 4. The interconnection modules can be used to supply auxiliary loads (not shown) and to perform interphase balancing.

Figure 14A:
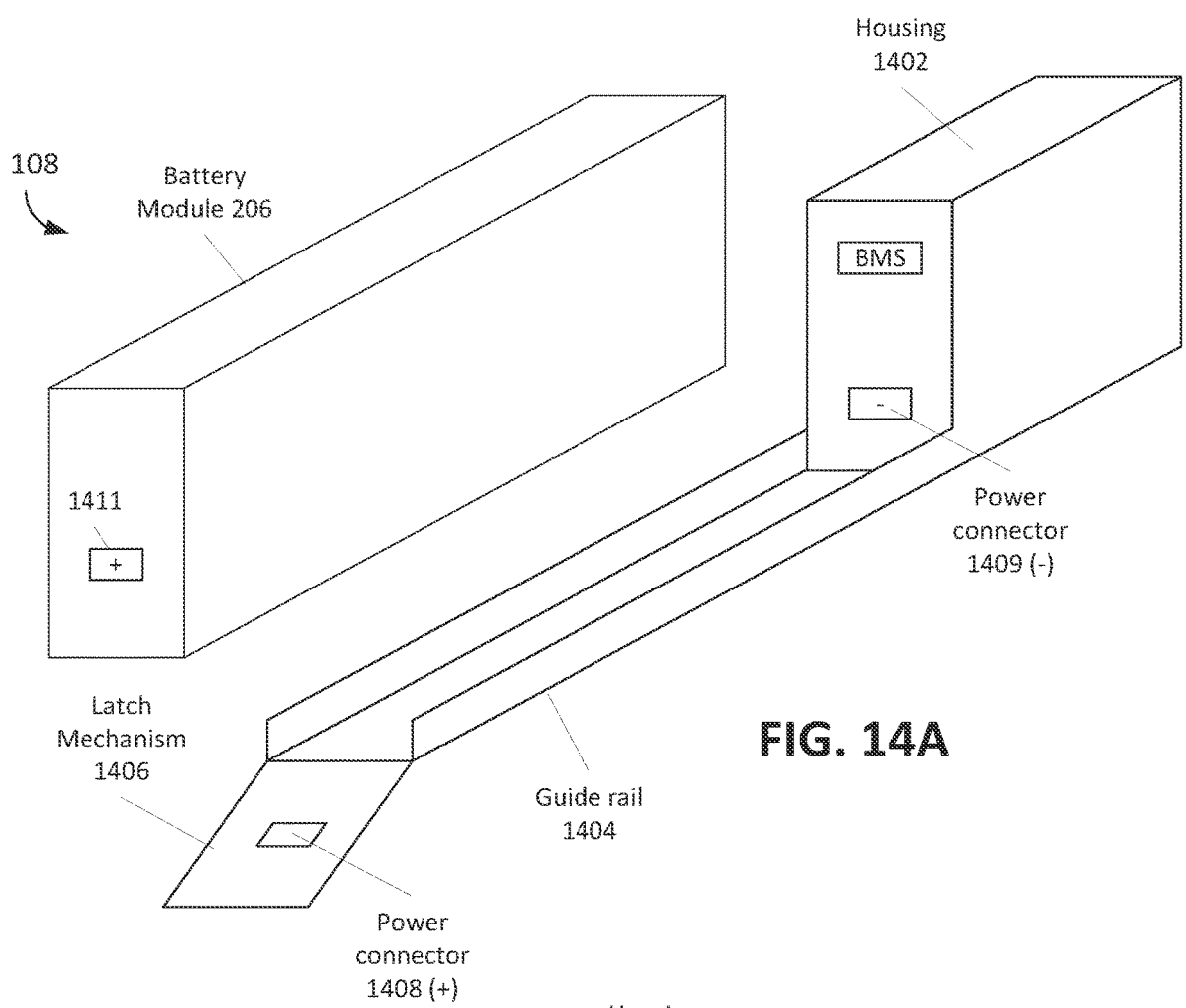
FIGS. 14A, 14D, 14E, and 14F are perspective views depicting example embodiments of a converter module with a replaceable battery module in various states of engagement and disengagement.
Figure 14B:
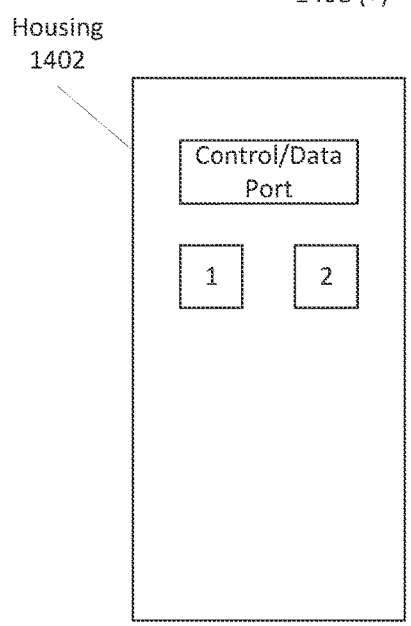
FIGS. 14B-14C are end views depicting example embodiments of a housing for module electronics.
Figure 14C:
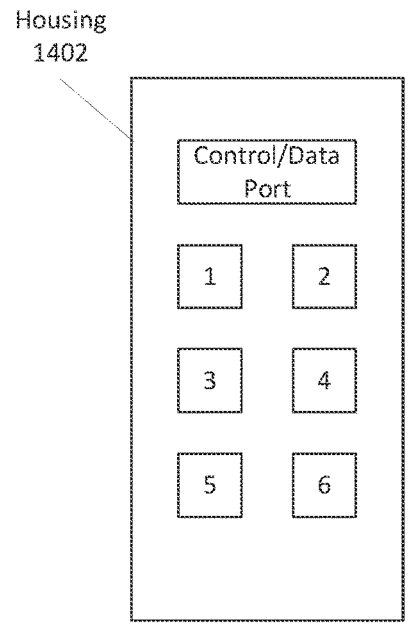

FIG. 14A is a perspective view depicting an example embodiment of a battery module 206 and a housing 1402 for the module electronics. Battery module 206 can be configured with any standard operating voltage (e.g., 24V, 48V, 60V, etc.) and has a slim form factor. The long dimension (length) shown here can be greater than 18 inches, while the width and height can be 6 inches or less. In other embodiments, the length can be at least twice the width, at least three times the width, at least four times the width, or at least five times the width. In this embodiment the width is approximately one half the height. Housing 1402 is attached to a guide rail 1404 that can guide a sliding motion of battery module 206 into electrical connection with the converter and other electronics (e.g., energy buffer 204, LCD 114). Battery module 206 has a positive terminal 1411 as shown here and a negative terminal on the opposite side (not shown). The orientation can be reversed depending on the embodiment. Another configuration, where both positive and negative terminals are located on the same side (facing housing 1402), can also be implemented as shown in FIG. 14F. Battery module 206 also has a data connection (not shown) to carry information about the battery such as charge and temperature information, in this data connection can mate with the electrical connector labeled as BMS on housing 1402. Battery module 206 can be latched or locked into a locked and connected position with the electronics within housing 1402. FIG. 14A depicts one example embodiment of a latch mechanism 1406 in the form of a panel that can swivel with respect to guard rail 1404. The panel includes a power connector 1408 (+) that can connect with the positive terminal 1411 of the battery. Another power connector 1409 (−) is shown beneath the BMS port and this connector can mate with the negative terminal on battery module 206.

Figure 14D:
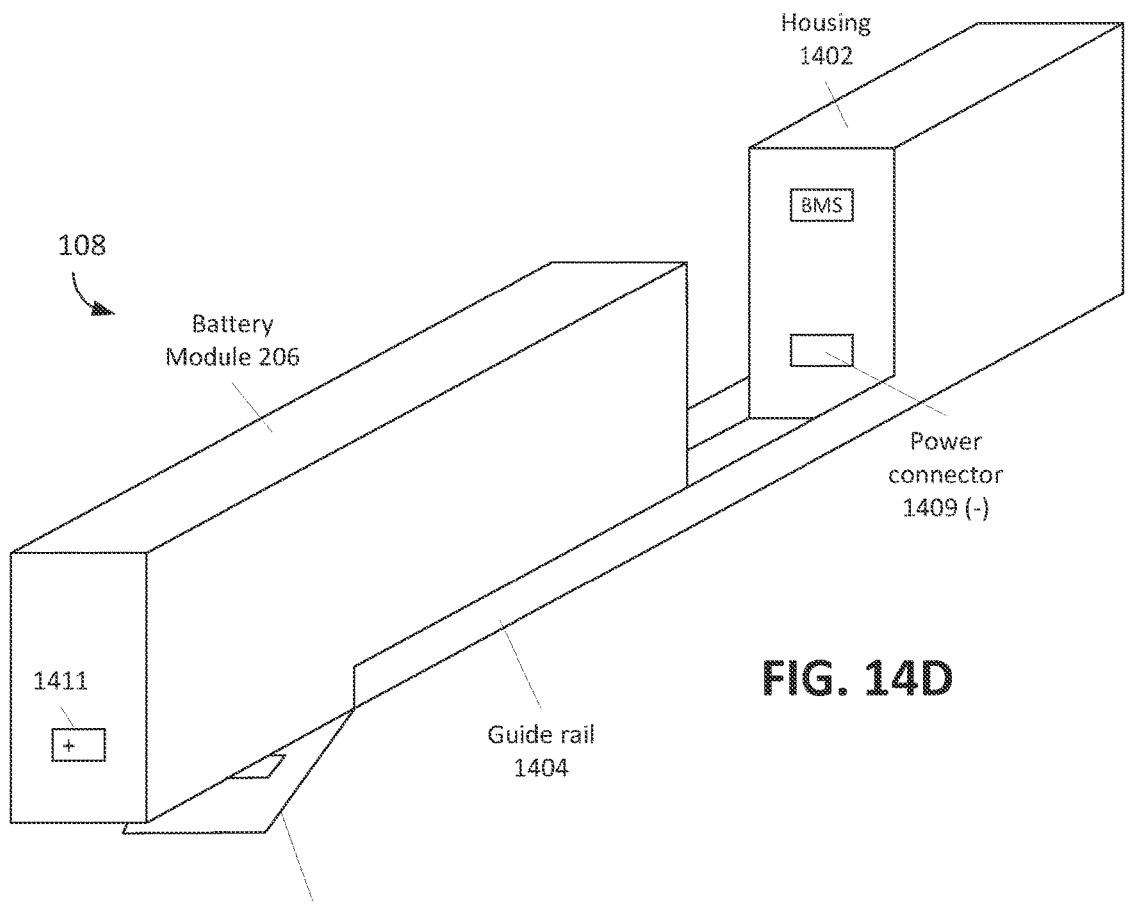
Figure 14E:
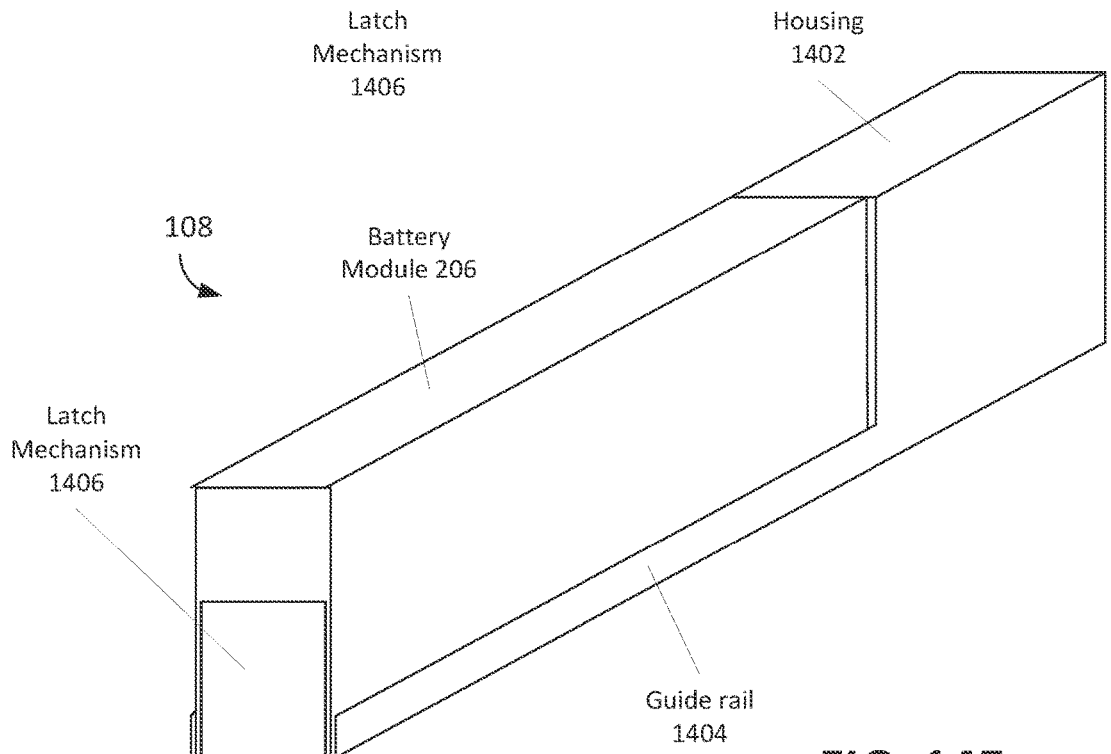
Figure 14F:
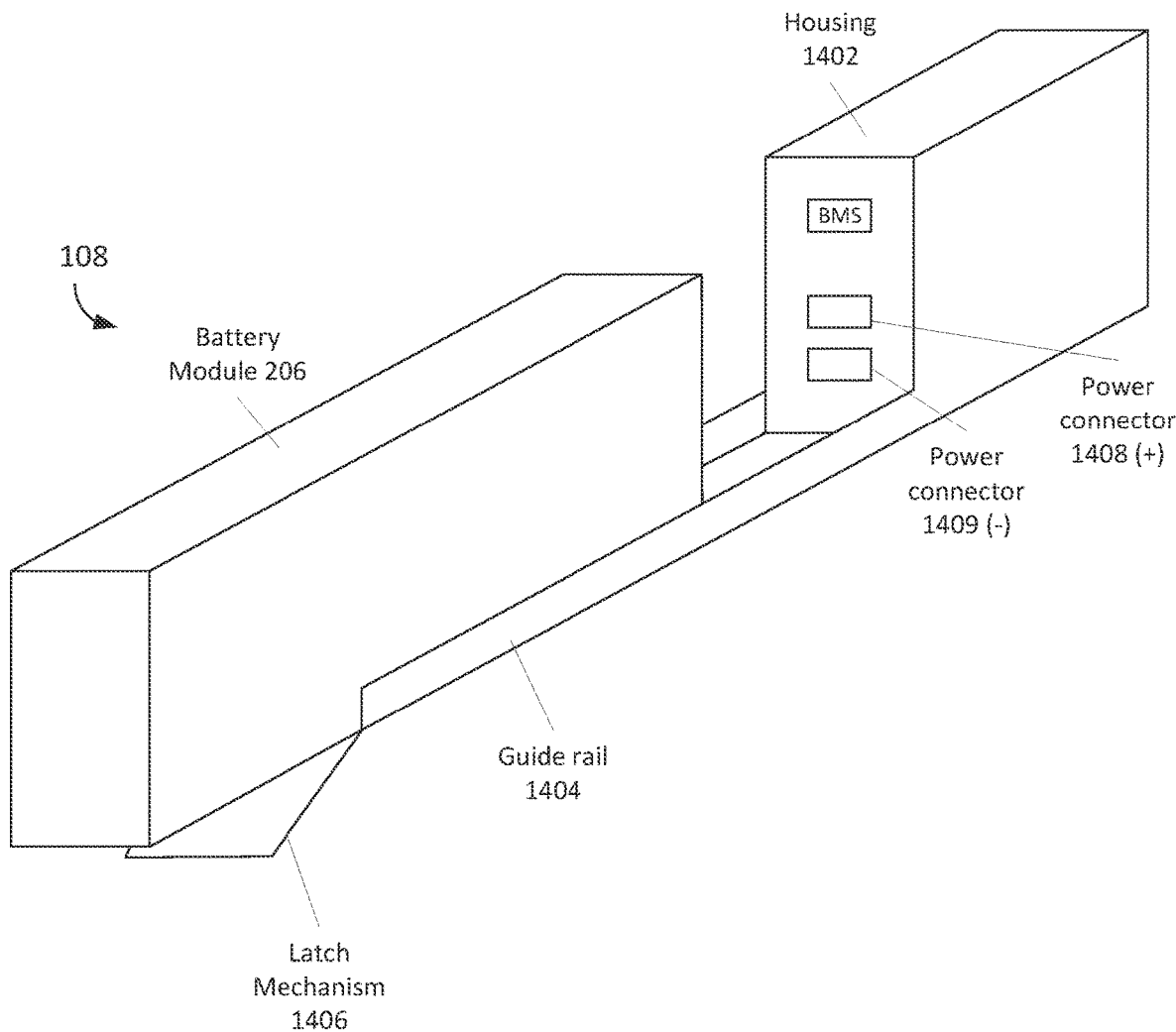

FIG. 14D depicts battery module 206 in the process of being slid into (or out of) electrical contact with the electronics within housing 1402. FIG. 14E depicts battery module 206 after having been fully advanced into contact with the electronics and after latch mechanism 1406 has been upraised into a locked position that forms electrical connection with the positive terminal of battery module 206. Power from this connection can be routed along the bottom side of guard rail 1404 to the electronics on the opposite end. In the position of FIG. 14E, battery module 206 is in a secured position with respect to housing 1402 and all electrical connections between battery 206 and the electronics within housing 1402 have been made. The battery modules 206 will be in the position depicted in FIG. 14E during operation of the EV.

To remove a battery module 206 that been fully or partially discharged, the EV's battery access door 1201 can be opened, the latch mechanism 1406 for that battery module 206 can be opened and the battery module 206 can be slid out of electrical contact with the electronics, along guard rail 1404, and removed from EV 1200 through the open battery access door 1201. In this manner all battery modules 206 of all modules can be removed and replaced in quick succession to convert an EV 1200 that is low on charge to one that is high on charge or fully charged within a matter of a few minutes (e.g., five minutes or less).

FIG. 14B is an end on view depicting the end of housing 1402 opposite that having the BMS and power connector 1409 (−) port. Shown here is a control and data port for exchanging information to and from a local control device 114 (not shown) within housing 1402. Information from this control and data port can be routed to other modules of system 100 and to a master control device 112 (not shown). Also shown are power connection ports 1 and 2 for connection to other components of system 100 depending on the position of the module within system 100 (e.g., connection to other modules, or to the motor). See, e.g., IO ports 1 and 2 of modules 108A-108C of FIGS. 3A-3C.

FIG. 14C is an end on view depicting the end of an interconnection module housing 1402. The interconnection module 108IC can be configured substantially the same to that described with FIGS. 14A, 14B, 14D, 14E, and 14F but with the additional power connection ports 3, 4, 5, and/or 6 (e.g., IO ports 3-6 of module 108C of FIG. 3C) for supplying power to other interconnection modules 108IC and to auxiliary loads 301 and 302 (e.g., FIG. 13B).

The various data and power connection ports described with respect to FIGS. 14A-14F can be implemented in any desired fashion. For example, ports on battery module 206 can be configured as male ports designed to couple with corresponding female ports on housing 1402 and latch mechanism 1406, or vice versa. The IO ports shown in FIGS. 14B and 14C can each be implemented as male or female ports designed to couple with bus bars or other connectors for carrying data and/or power to and from housing 1402.

While not limited to such, the present embodiments can be used with electric vehicles having a universal EV platform, which includes an electric powertrain with the energy storage system and one or more motors attached thereto, in-wheel motors without a drivetrain, or a combination. The universal EV platform can be a base frame or chassis of the EV that can be attached, mated, or otherwise integrated with any number of EV bodies depending on the particular application, such as an automated driverless and passengerless body (e.g., a low voltage application for automated delivery services), a medium-sized body for use in applications carrying at least one passenger or driver (and thus having moderate or medium voltage requirements) that do not require transportation of heavy loads (e.g., a sedan or coupe or sports car), and a large sized body for moving multiple passengers with a driver and/or large loads (and thus requiring relatively high voltage power requirements) (e.g., a passenger bus, the carrying of freight, etc.).

Various aspects of the present subject matter are set forth below, in review of, and/or in supplementation to, the embodiments described thus far, with the emphasis here being on the interrelation and interchangeability of the following embodiments. In other words, an emphasis is on the fact that each feature of the embodiments can be combined with each and every other feature unless explicitly stated or taught otherwise.

In many embodiments, a modular energy system controllable to supply power to a load is provided, the system including: a plurality of modules connected together to output an AC voltage signal including a superposition of first output voltages from each module, wherein each module includes an energy source and converter electronics connected to the energy source and configured to generate the first output voltage from the energy source; and an enclosure for the plurality of modules, wherein the enclosure is configured to pass coolant to cool the plurality of modules.

In some embodiments, the enclosure includes a conduit section configured to pass the coolant. The enclosure can include a channel having a shape corresponding to a shape of the conduit section, wherein the conduit section is located within the channel. The conduit section can be press fit within the channel. A first module of the plurality of modules can have the converter electronics mounted on a substrate, and the substrate can be positioned between the conduit section and the converter electronics of the first module. The substrate and converter electronics can be positioned between the energy source of the first module and the conduit section. The system can further include a heatsink positioned between the conduit section and the substrate. The system can further include an interface layer positioned between the conduit section and the heatsink. The interface layer can be deformable. The conduit section can be in contact with the interface layer, the interface layer can be in contact with the heatsink, and the heatsink can be in contact with the substrate. Each of the plurality of modules can have the converter electronics mounted on a substrate, and the substrate can be positioned between the conduit section and the converter electronics of each module.

In some embodiments, the enclosure includes a first base section, a second section opposing the base section, and a sidewall section. The conduit section can be within at least one of the first base section, the second section, and the sidewall section. The second section can be a lid of the enclosure and wherein the conduit section is within the lid.

In many embodiments, a method of cooling a modular energy system of an electric vehicle is provided, the method including: pumping coolant through a cooling apparatus in proximity with the modular energy system such that the coolant cools modules of the modular energy system; then pumping the coolant in proximity with a motor of the EV to cool the motor; and then pumping the coolant through a heat exchanger to cool the coolant.

In some embodiments, pumping coolant through the cooling apparatus includes: pumping coolant in proximity with at least one battery of a module of the modular energy system to cool the at least one battery; and then pumping coolant in proximity with electronics of the module to cool the electronics.

In some embodiments, pumping coolant through the cooling apparatus includes pumping coolant through a section of an enclosure of the modular energy system. The section can be at least one of a base section, a second section opposing the base section, and a sidewall section.

In some embodiments, pumping coolant through the cooling apparatus includes pumping coolant through a base section of an enclosure of the modular energy system and then through a second section of the enclosure that opposes the base section. Batteries of modules of the modular energy system can be located adjacent the base section, and electronics of the modules of the modular energy system can be located adjacent the second section. Pumping coolant through the cooling apparatus can include pumping coolant through only one of the base section, the second section, and the sidewall section.

In many embodiments, a modular energy system controllable to supply power to a motor of an electric vehicle is provided, the system including: at least three arrays, each array comprising a plurality of modules connected together to output an AC voltage signal comprising a superposition of first output voltages from each module, wherein each module comprises an energy source and converter electronics configured to generate the first output voltage from the energy source, wherein the AC voltage signals output by the three arrays supply three-phase power to the motor, wherein the energy source is releasably connectable to the converter electronics.

In some embodiments, the system further includes a latch mechanism configured to releasably connect the energy source to the converter electronics. Each module can include a housing for holding the converter electronics. The housing can be coupled to a guide rail for the energy source. The energy source can be slidable along the guide rail.

In some embodiments, the energy source has a width, a length, and height, wherein the length is at least twice the width. The length can be at least three times the width. The length can be at least four times the width.

In some embodiments, the latch mechanism includes a power connector for connecting the energy source to the converter electronics.

In some embodiments, the system includes at least one interconnection module including an energy source and a converter, wherein the converter of the interconnection module is coupled to at least two of the arrays. The interconnection module can include a housing that holds the converter of the interconnection module, wherein the housing includes a control port, at least two connectors for coupling the converter to the at least two of the arrays, and at least two connectors for coupling the energy source or the converter of the interconnection module to at least one auxiliary load.

In some embodiments, the energy source is a battery module. The housing of each module can include a connector for connecting a battery management system of the battery module to a local control device housed within the housing.

In some embodiments, the system further includes a control system for controlling the converters of the modules. The control system can be configured to control intraphase balancing within each array. The control system can be configured to control interphase balancing across the arrays.

In many embodiments, an electric vehicle is provided, the electric vehicle including: an electric motor; a modular energy system configured in accordance with any of the embodiments described herein to supply power for the electric motor; and at least one access panel configured to move between a first position that covers energy sources of the modular energy system and a second position that exposes the energy sources for removal.

In some embodiments, the at least one access panel is a door configured to pivot.

In many embodiments, a method of managing power for an electric vehicle is provided, where the electric vehicle includes a modular energy system having at least three arrays, each array including a plurality of modules connected together in a cascaded fashion to generate an AC voltage signal for a motor of the electric vehicle, wherein each module includes a battery module and converter electronics, and where the method includes: removing a first battery module from a first position within the electric vehicle; and inserting a second battery module into the first position within the electric vehicle, wherein the second battery module has a relatively higher state of charge than the first battery module.

In some embodiments, removing the first battery module includes unlocking the first battery module from a locked state within the electric vehicle. The method can further include locking the second battery module in the first position.

In some embodiments, the method can further include moving an access panel of the electric vehicle from a closed position that covers the first battery module to an open position that exposes the first battery module prior to removing the first battery module. The access panel can be beneath a passenger door.

In some embodiments, the method further includes removing all battery modules from the electric vehicle and inserting different battery modules having relatively higher states of charge than the removed battery modules.

In some embodiments, removing the first battery module from the first position within the electric vehicle includes removing the first battery module from electrical contact with first converter electronics associated with the first battery module. Inserting the second battery module into the first position within the electric vehicle can include inserting the second battery module into electrical contact with the first converter electronics.

In some embodiments, removing the first battery module from the first position within the electric vehicle can include sliding the first battery module along a guide rail.

In some embodiments, inserting the second battery module into the first position within the electric vehicle can include sliding the second battery module along a guide rail.

The term "module" as used herein refers to one of two or more devices or sub-systems within a larger system. The module can be configured to work in conjunction with other modules of similar size, function, and physical arrangement (e.g., location of electrical terminals, connectors, etc.). Modules having the same function and energy source(s) can be configured identical (e.g., size and physical arrangement) to all other modules within the same system (e.g., rack or pack), while modules having different functions or energy source(s) may vary in size and physical arrangement. While each module may be physically removable and replaceable with respect to the other modules of the system (e.g., like wheels on a car, or blades in an information technology (IT) blade server), such is not required. For example, a system may be packaged in a common housing that does not permit removal and replacement any one module, without disassembly of the system as a whole. However, any and all embodiments herein can be configured such that each module is removable and replaceable with respect to the other modules in a convenient fashion, such as without disassembly of the system.

The term "master control device" is used herein in a broad sense and does not require implementation of any specific protocol such as a master and slave relationship with any other device, such as the local control device.

The term "output" is used herein in a broad sense, and does not preclude functioning in a bidirectional manner as both an output and an input. Similarly, the term "input" is used herein in a broad sense, and does not preclude functioning in a bidirectional manner as both an input and an output.

The terms "terminal" and "port" are used herein in a broad sense, can be either unidirectional or bidirectional, can be an input or an output, and do not require a specific physical or mechanical structure, such as a female or male configuration.

Different reference number notations are used herein. These notations are used to facilitate the description of the present subject matter and do not limit the scope of that subject matter. Generally, a genus of elements is referred to with a number, e.g., "123", and a subgenus thereof is referred to with a letter appended to the number, e.g., 123A or 123B. References to the genus without the letter appendix (e.g., 123) refers to the genus as a whole, inclusive of all subgenuses. Some figures show multiple instances of the same element. Those elements may be appended with a number or a letter in a "-X" format, e.g., 123-1, 123-2, or 123-PA. This -X format does not imply that the elements must be configured identically in each instance, but is rather used to facilitate differentiation when referencing the elements in the figures. Reference to the genus 123 without the -X appendix broadly refers to all instances of the element within the genus.

Various aspects of the present subject matter are set forth below, in review of, and/or in supplementation to, the embodiments described thus far, with the emphasis here being on the interrelation and interchangeability of the following embodiments. In other words, an emphasis is on the fact that each feature of the embodiments can be combined with each and every other feature unless explicitly stated otherwise or logically implausible.

Processing circuitry can include one or more processors, microprocessors, controllers, and/or microcontrollers, each of which can be a discrete or stand-alone chip or distributed amongst (and a portion of) a number of different chips. Any type of processing circuitry can be implemented, such as, but not limited to, personal computing architectures (e.g., such as used in desktop PC's, laptops, tablets, etc.), programmable gate array architectures, proprietary architectures, custom architectures, and others. Processing circuitry can include a digital signal processor, which can be implemented in hardware and/or software. Processing circuitry can execute software instructions stored on memory that cause processing circuitry to take a host of different actions and control other components.

Processing circuitry can also perform other software and/or hardware routines. For example, processing circuitry can interface with communication circuitry and perform analog-to-digital conversions, encoding and decoding, other digital signal processing, multimedia functions, conversion of data into a format (e.g., in-phase and quadrature) suitable for provision to communication circuitry, and/or can cause communication circuitry to transmit the data (wired or wirelessly).

Any and all communication signals described herein can be communicated wirelessly except where noted or logically implausible. Communication circuitry can be included for wireless communication. The communication circuitry can be implemented as one or more chips and/or components (e.g., transmitter, receiver, transceiver, and/or other communication circuitry) that perform wireless communications over links under the appropriate protocol (e.g., Wi-Fi, Bluetooth, Bluetooth Low Energy, Near Field Communication (NFC), Radio Frequency Identification (RFID), proprietary protocols, and others). One or more other antennas can be included with communication circuitry as needed to operate with the various protocols and circuits. In some embodiments, communication circuitry can share antenna for transmission over links. RF communication circuitry can include a transmitter and a receiver (e.g., integrated as a transceiver) and associated encoder logic.

Processing circuitry can also be adapted to execute the operating system and any software applications, and perform those other functions not related to the processing of communications transmitted and received.

Computer program instructions for carrying out operations in accordance with the described subject matter may be written in any combination of one or more programming languages, including an object oriented programming language such as Java, JavaScript, Smalltalk, C++, C#, Transact-SQL, XML, PHP or the like and conventional procedural programming languages, such as the "C" programming language or similar programming languages.

Memory, storage, and/or computer readable media can be shared by one or more of the various functional units present, or can be distributed amongst two or more of them (e.g., as separate memories present within different chips). Memory can also reside in a separate chip of its own.

To the extent the embodiments disclosed herein include or operate in association with memory, storage, and/or computer readable media, then that memory, storage, and/or computer readable media are non-transitory. Accordingly, to the extent that memory, storage, and/or computer readable media are covered by one or more claims, then that memory, storage, and/or computer readable media is only non-transitory. The terms "non-transitory" and "tangible" as used herein, are intended to describe memory, storage, and/or computer readable media excluding propagating electromagnetic signals, but are not intended to limit the type of memory, storage, and/or computer readable media in terms of the persistency of storage or otherwise. For example, "non-transitory" and/or "tangible" memory, storage, and/or computer readable media encompasses volatile and non-volatile media such as random access media (e.g., RAM, SRAM, DRAM, FRAM, etc.), read-only media (e.g., ROM, PROM, EPROM, EEPROM, flash, etc.) and combinations thereof (e.g., hybrid RAM and ROM, NVRAM, etc.) and variants thereof.

It should be noted that all features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

As used herein and in the appended claims, the singular forms "a," "an," and "the" include plural referents unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

The invention claimed is:

1. A modular energy system controllable to supply power to a load, comprising:
   a plurality of modules connected together to output an AC voltage signal comprising a superposition of first output voltages from each module, wherein each module comprises an energy source and converter electronics connected to the energy source and configured to generate the first output voltage from the energy source; and
   an enclosure for the plurality of modules, wherein the enclosure is configured to pass coolant to cool the plurality of modules and comprises a conduit section configured to pass the coolant;
   wherein a first module of the plurality of modules has the converter electronics mounted on a substrate, and wherein the substrate is positioned between the conduit section and the converter electronics of the first module; and
   further comprising a heatsink positioned between the conduit section and the substrate.

2. The system of claim 1, wherein the enclosure comprises a channel having a shape corresponding to a shape of the conduit section, wherein the conduit section is located within the channel.

3. The system of claim 2, wherein the conduit section is press fit within the channel.

4. The system of claim 1, wherein the substrate and converter electronics are positioned between the energy source of the first module and the conduit section.

5. The system of claim 1, further comprising an interface layer positioned between the conduit section and the heatsink.

6. The system of claim 5, wherein the interface layer is deformable.

7. The system of claim 5, wherein the conduit section is in contact with the interface layer, the interface layer is in contact with the heatsink, and the heatsink is in contact with the substrate.

8. The system of claim 1, wherein each of the plurality of modules has the converter electronics mounted on a substrate, and wherein the substrate of each module is positioned between the conduit section and the converter electronics of the module.

9. The system of claim 1, wherein the enclosure comprises a first base section, a second section opposing the base section, and a sidewall section.

10. The system of claim 9, wherein the conduit section is within at least one of the first base section, the second section, and the sidewall section.

11. The system of claim 10, wherein the second section is a lid of the enclosure and wherein the conduit section is within the lid.

12. The system of claim 1, wherein the energy source comprises a fuel cell, a battery module, or a capacitor.

13. The system of claim 1, wherein the enclosure comprises a top enclosure and a bottom enclosure, and wherein the conduit section is located within the top enclosure of the enclosure.

14. The system of claim 13, wherein the bottom enclosure of the enclosure also includes the conduit section and the conduit section fluidly couples the top enclosure of the enclosure and the bottom enclosure of the enclosure.

15. The system of claim 14, wherein the heatsink is positioned between the conduit section in the top enclosure of the enclosure and the substrate.

16. The system of claim 14, wherein the heatsink is positioned between the conduit section in the bottom enclosure of the enclosure and the substrate.

17. The method of claim 13, wherein the energy source comprises a fuel cell, a battery module, or a capacitor.

18. A method, comprising:
    connecting converter electronics mounted on a first side of a substrate to an energy source so that the converter electronics are between the energy source and the substrate to form a module;
    positioning a heatsink on a second side of the substrate opposite the first side;
    placing the module in an enclosure that is configured to pass coolant to cool the module, wherein the enclosure comprises a conduit section configured to pass the coolant;
    wherein the module is placed in the enclosure so that:
        the heatsink is positioned between the conduit section and the substrate;
        the substrate is positioned between the heatsink and the converter electronics; and
        the converter electronics of the module are between the substrate and the energy source.

19. The method of claim 18, further comprising positioning the conduit section within a channel of the enclosure, wherein the channel corresponds to a shape of the conduit section.

20. The method of claim 19, wherein positioning the conduit section within the channel comprises press fitting the conduit section within the channel.

* * * * *

UNITED STATES PATENT AND TRADEMARK OFFICE
CERTIFICATE OF CORRECTION

PATENT NO. : 12,065,058 B2
APPLICATION NO. : 17/229795
DATED : August 20, 2024
INVENTOR(S) : Mikhail Slepchenkov and Roozbeh Naderi Page 1 of 1

It is certified that error appears in the above-identified patent and that said Letters Patent is hereby corrected as shown below:

In the Claims

Column 40, Line 1, Claim 17, delete "method" and insert therefor -- system --.

Signed and Sealed this
Twenty-second Day of July, 2025

Coke Morgan Stewart
*Acting Director of the United States Patent and Trademark Office*